United States Patent
Lee et al.

(10) Patent No.: US 11,950,499 B2
(45) Date of Patent: Apr. 2, 2024

(54) LIGHT-EMITTING DEVICE COMPRISING FIRST AND SECOND CAPPING LAYERS AND ELECTRONIC APPARATUS INCLUDING THE SAME

(71) Applicant: Samsung Display Co., Ltd., Yongin-si (KR)

(72) Inventors: Bora Lee, Yongin-si (KR); Hyomin Ko, Yongin-si (KR); Ilsoo Oh, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 304 days.

(21) Appl. No.: 17/240,590

(22) Filed: Apr. 26, 2021

(65) Prior Publication Data

US 2022/0077395 A1    Mar. 10, 2022

(30) Foreign Application Priority Data

Sep. 8, 2020  (KR) .................. 10-2020-0114860

(51) Int. Cl.
| | |
|---|---|
| *H10K 85/60* | (2023.01) |
| *G02B 5/20* | (2006.01) |
| *G02B 5/30* | (2006.01) |
| *H01L 33/50* | (2010.01) |
| *H10K 50/84* | (2023.01) |
| *H10K 50/15* | (2023.01) |
| *H10K 50/17* | (2023.01) |
| *H10K 50/18* | (2023.01) |

(52) U.S. Cl.
CPC ............. *H10K 85/636* (2023.02); *G02B 5/20* (2013.01); *G02B 5/30* (2013.01); *H01L 33/50* (2013.01); *H10K 85/624* (2023.02); *H10K 85/6572* (2023.02); *H10K 50/15* (2023.02); *H10K 50/171* (2023.02); *H10K 50/18* (2023.02)

(58) Field of Classification Search
None
See application file for complete search history.

(56) References Cited

U.S. PATENT DOCUMENTS

| | | | |
|---|---|---|---|
| 10,283,734 B2 | 5/2019 | Yim et al. | |
| 10,297,760 B2 | 5/2019 | Kitamura et al. | |
| 2011/0121271 A1* | 5/2011 | Jeon | H10K 50/844 257/40 |
| 2013/0161656 A1* | 6/2013 | Choi | H10K 59/131 438/34 |
| 2016/0155979 A1* | 6/2016 | Yim | H10K 50/858 257/40 |
| 2016/0308162 A1* | 10/2016 | Yoo | H10K 50/858 |
| 2020/0144337 A1* | 5/2020 | Lim | H10K 50/15 |
| 2020/0328383 A1 | 10/2020 | Song | |

FOREIGN PATENT DOCUMENTS

| | | |
|---|---|---|
| JP | 3801330 | 7/2006 |
| JP | 2008-34701 | 2/2008 |
| KR | 10-2016-0065318 | 6/2016 |
| KR | 10-1632517 | 6/2016 |
| KR | 10-2018-0090421 | 8/2018 |

* cited by examiner

*Primary Examiner* — Daniel Whalen
(74) *Attorney, Agent, or Firm* — KILE PARK REED & HOUTTEMAN PLLC

(57) ABSTRACT

A light-emitting device includes a first electrode, a second electrode facing the first electrode, an interlayer disposed between the first electrode and the second electrode and including an emission layer, a first capping layer, and a second capping layer. A refractive index of the first capping layer is greater than a refractive index of the second capping layer, and the first capping layer and the second capping layer are each an organic layer. An electronic apparatus including the light-emitting device is also provided.

19 Claims, 3 Drawing Sheets

LIGHT-EMITTING DEVICE COMPRISING FIRST AND SECOND CAPPING LAYERS AND ELECTRONIC APPARATUS INCLUDING THE SAME

CROSS-REFERENCE TO RELATED APPLICATION(S)

This application claims priority to and benefits of Korean Patent Application No. 10-2020-0114860 under 35 U.S.C. § 119, filed on Sep. 8, 2020 in the Korean Intellectual Property Office, the entire contents of which are incorporated herein by reference.

BACKGROUND

1. Technical Field

Embodiments relate to a light-emitting device and an electronic apparatus including the same.

2. Description of the Related Art

Organic light-emitting devices are self-emission devices that have wide viewing angles, high contrast ratios, short response times, and excellent characteristics in terms of brightness, driving voltage, and response speed, compared to devices in the art.

The organic light-emitting devices may include a first electrode disposed on a substrate, and a hole transport region, an emission layer, an electron transport region, and a second electrode sequentially stacked on the first electrode. Holes provided from the first electrode may move toward the emission layer through the hole transport region, and electrons provided from the second electrode may move toward the emission layer through the electron transport region. Carriers, such as the holes and the electrons, recombine in the emission layer to produce excitons. These excitons transition from an excited state to a ground state to thereby generate light.

SUMMARY

Provided is a device that has increased light emission efficiency by increasing light extraction efficiency.

Additional aspects will be set forth in part in the description which follows and, in part, will be apparent from the description, or may be learned by practice of the embodiments of the disclosure.

According to an embodiment of the disclosure, a light-emitting device may include
 a first electrode,
 a second electrode facing the first electrode,
 an interlayer disposed between the first electrode and the second electrode, the interlayer including an emission layer,
 a first capping layer, and
 a second capping layer,
 wherein a refractive index of the first capping layer may be greater than a refractive index of the second capping layer, and
 the first capping layer and the second capping layer may each be an organic layer.

In an embodiment, the first capping layer may contact the second capping layer.

In an embodiment, the first capping layer may contact the second electrode.

In an embodiment, the first capping layer may be disposed outside the second electrode.

In an embodiment, the first electrode may be an anode, the second electrode may be a cathode, the interlayer may further include a hole transport region disposed between the first electrode and the emission layer, and the hole transport region may include a hole injection layer, a hole transport layer, an electron blocking layer, or any combination thereof.

In an embodiment, the first electrode may be an anode, the second electrode may be a cathode, the interlayer may further include an electron transport region disposed between the emission layer and the second electrode, and the electron transport region may include a hole blocking layer, an electron transport layer, an electron injection layer, or any combination thereof.

In an embodiment, a refractive index of the first capping layer may be in a range of about 1.7 to about 2.2, at a wavelength of about 550 nm.

In an embodiment, a refractive index of the second capping layer may be in a range of about 1.2 to about 1.7, at a wavelength of about 550 nm.

In an embodiment, a thickness of the second capping layer may be greater than a thickness of the first capping layer.

In an embodiment, a thickness of the first capping layer may be in a range of about 60 nm to about 100 nm.

In an embodiment, a thickness of the second capping layer may be in a range of about 40 nm to about 120 nm.

According to another embodiment of the disclosure, provided is an electronic apparatus including the light-emitting device.

In an embodiment, the electronic apparatus may further include a thin-film transistor. The thin-film transistor may include a source electrode and a drain electrode, and the first electrode of the light-emitting device may be electrically connected to at least one of the source electrode and the drain electrode of the thin-film transistor.

In an embodiment, the electronic apparatus may further include a color filter, a color conversion layer, a touch screen layer, a polarizing layer, or any combination thereof.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
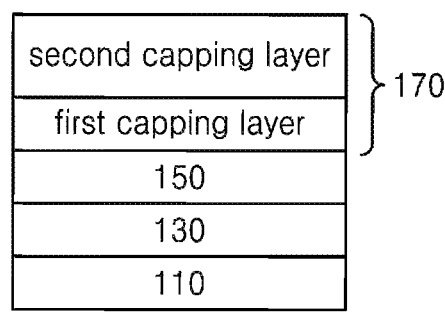
FIG. 1 is a schematic cross-sectional view illustrating a structure of a light-emitting device according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

Sizes of elements in the drawings may be exaggerated for convenience of explanation. Therefore, as the sizes and thicknesses of components in the drawings may be arbitrarily illustrated for convenience of explanation, the following embodiments of the disclosure are not limited thereto.

As used herein, the expressions used in the singular such as "a," "an," and "the" are intended to include the plural forms as well, unless the context clearly indicates otherwise.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

In the description, it will be understood that when an element (a region, a layer, a section, or the like) is referred to as being "on", "connected to" or "coupled to" another element, it can be directly on, connected to, or coupled to the other element, or one or more intervening elements may be disposed therebetween.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the embodiments of the inventive concept.

The terms "below," "lower," "above," "upper," and the like are used to describe the relationship of the configurations shown in the drawings. The terms are used as a relative concept and are described with reference to the direction indicated in the drawings.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In a general top-emission structure for an organic light-emitting device, a total reflection anode electrode is formed on a substrate, and a hole transport layer, an emission layer, an electron transport layer, and a semi-transmissive cathode electrode are sequentially formed on the anode, wherein the hole transport layer, the emission layer, and the electron transport layer mainly include an organic compound.

When a voltage is applied between the anode and the cathode of the organic light-emitting device, holes provided from the anode move to the emission layer through the hole transport layer and electrons provided from the cathode move to the emission layer through the electron transport layer.

Carriers (such as holes and electrons) recombine in a region of the emission layer to thereby generate excitons, and these excitons changes from an excited state to a ground state to thereby emit light.

Constructive or destructive interference of light occurs according to a distance between the two reflective electrodes and the position of the emission layer, and light is emitted through the cathode, which is a semi-transmissive electrode, based on a resonance phenomenon.

External quantum efficiency (next) of a light-emitting material used in the organic light-emitting device may be obtained by Equation (1) below.

[Equation (1)]

$$\eta_{ext} = \eta_{int} \times r \times \phi \times \eta_{out\text{-}coupling} \quad (1)$$

$\eta_{int}$: internal quantum efficiency
r: charge balance factor,
$\phi$: radiative quantum efficiency
$\eta_{out\text{-}coupling}$: out coupling efficiency Recently, due to continuous improvement of light-emitting materials, a pint value reaches a limit. Thus, $\eta_{out\text{-}coupling}$ should be improved in order to further increase light efficiency.

In the organic light-emitting device, light generated in the emission layer is not 100% emitted to the outside and is lost through various paths such as reabsorption of an organic layer, surface plasmon polarization (SPP), and waveguide, and thus the light extraction efficiency is known to be about 20%. In other words, 80% of light emitted in the emission layer is lost.

In order to increase efficiency of the organic light-emitting device, the light extraction efficiency as well as development of materials and devices themselves should be increased.

According to an embodiment, a light-emitting device may include:

a first electrode;

a second electrode facing the first electrode;

an interlayer disposed between the first electrode and the second electrode, the interlayer including an emission layer;

a first capping layer; and a second capping layer, wherein a refractive index of the first capping layer may be greater than a refractive index of the second capping layer, and the first capping layer and the second capping layer may each be an organic layer.

According to an embodiment, the first capping layer may contact the second capping layer.

In an embodiment, the first capping layer may contact the second capping layer, thereby forming a first capping layer/second capping layer structure or a second capping layer/first capping layer structure.

In an embodiment, the first capping layer may contact the second electrode.

In an embodiment, the first capping layer may be disposed outside the second electrode. In an embodiment, the first capping layer may contact the second electrode, outside the second electrode.

In an embodiment, the first capping layer, the second capping layer, and the second electrode may contact each other, thereby forming a second electrode/first capping layer/second capping layer structure.

In an embodiment, the first electrode may be an anode, the second electrode may be a cathode, and the interlayer which is located between the first electrode and the second electrode and includes the emission layer may further include a hole transport region disposed between the first electrode and the emission layer. The hole transport region may include a hole injection layer, a hole transport layer, an electron blocking layer, or any combination thereof.

In an embodiment, the first electrode may be an anode, the second electrode may be a cathode, and the interlayer which is located between the first electrode and the second electrode and includes the emission layer may further include an electron transport region disposed between the emission layer and the second electrode. The electron transport region may include a hole blocking layer, an electron transport layer, an electron injection layer, or any combination thereof.

In an embodiment, a refractive index of the first capping layer may be in a range of about 1.7 to about 2.2, at a wavelength of about 550 nm.

In an embodiment, a refractive index of the second capping layer may be in a range of about 1.2 to about 1.7, at a wavelength of about 550 nm.

In an embodiment, a thickness of the second capping layer may be thicker than a thickness of the first capping layer.

When the refractive index of each of the first capping layer and the second capping layer is within the ranges above and a thickness of the second capping layer is greater than a thickness of the first capping layer, the light extraction efficiency may be increased.

In an embodiment, a thickness of the first capping layer may be in a range of about 60 nm to about 100 nm.

In an embodiment, a thickness of the first capping layer may be in a range of about 70 nm to about 90 nm.

In an embodiment, a thickness of the second capping layer may be in a range of about 40 nm to about 120 nm.

In an embodiment, a thickness of the second capping layer may be in a range of about 60 nm to about 120 nm.

When a thickness of the second capping layer is greater than a thickness of the first capping layer and the thickness of the second capping layer and the thickness of the first capping layer are within the ranges above, the light extraction efficiency may be increased.

In an embodiment, the first capping layer may include a compound represented by Formula 1:

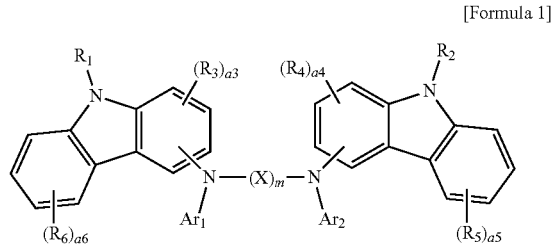

[Formula 1]

In Formula 1, $R_1$ to $R_6$, $Ar_1$, and $Ar_2$ may each independently be selected from hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —B($Q_1$)($Q_2$), —C(=O)($Q_1$), —Si($Q_1$)($Q_2$)($Q_3$), and —P(=O)($Q_1$)($Q_2$), X may be selected from a $C_3$-$C_{60}$ carbocyclic group unsubstituted or substituted with at least one $R_{10a}$ and a $C_1$-$C_{60}$ heterocyclic group unsubstituted or substituted with at least one $R_{10a}$, m may be an integer from 1 to 3, a3 and a4 may each independently be an integer from 1 to 3, a5 and a6 may each independently be an integer from 1 to 4, when a3 is 2 or more, $R_3$(s) may be identical to or different from each other, when a4 is 2 or more, $R_4$(s) may be identical to or different from each other, when a5 is 2 or more, $R_5$(s) may be identical to or different from each other, when a6 is 2 or more, $R_6$(s) may be identical to or different from each other, and $R_{10a}$ may be:

deuterium (-D), —F, —Cl, —Br, —I, a hydroxyl group, a cyano group, or a nitro group;

a $C_1$-$C_{60}$ alkyl group, a $C_2$-$C_{30}$ alkenyl group, a $C_2$-$C_{30}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)

($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{21}$), or —P(=O)($Q_{31}$)($Q_{32}$), wherein $Q_1$ to $Q_3$, $Q_{11}$ to $Q_{13}$, $Q_2$-1 to $Q_{23}$, and $Q_{31}$ to $Q_{33}$ may each independently be: hydrogen; deuterium; —F; —Cl; —Br; —I; a hydroxyl group; a cyano group; a nitro group; a $C_1$-$C_{60}$ alkyl group; a $C_2$-$C_{30}$ alkenyl group; a $C_2$-$C_{30}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, $R_3$ to $R_6$ may each independently be hydrogen or deuterium.

In an embodiment, $R_1$, $R_2$, $Ar_1$, and $Ar_2$ may each independently be a $C_6$-$C_{60}$ aryl group unsubstituted or substituted with at least one $R_{10a}$.

In an embodiment, X may be a $C_6$-$C_{60}$ arylene group unsubstituted or substituted with at least one $R_{10a}$.

In an embodiment, the second capping layer may include a compound represented by Formula 2:

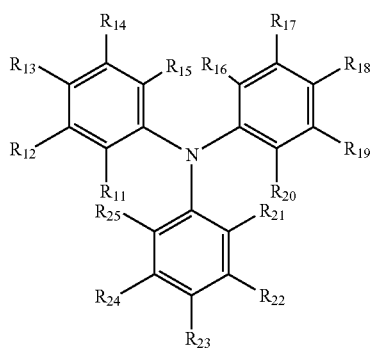

[Formula 2]

In Formula 2, $R_{11}$ to $R_{25}$ may each independently be selected from hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —B($Q_1$)($Q_2$), —C(=O)($Q_1$), —Si($Q_1$)($Q_2$)($Q_3$), and —P(=O)($Q_1$)($Q_2$), two neighboring substituents of $R_{11}$ to $R_{15}$ may be connected to form a ring group, two neighboring substituents of $R_{16}$ to $R_{20}$ may be connected to form a ring group, or two neighboring substituents of $R_{21}$ to $R_{25}$ may be connected to form a ring group, and $R_{10a}$ may be:

deuterium (-D), —F, —Cl, —Br, —I, a hydroxyl group, a cyano group, or a nitro group;

a $C_1$-$C_{60}$ alkyl group, a $C_2$-$C_{30}$ alkenyl group, a $C_2$-$C_{30}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$) ($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$) ($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

In an embodiment, the ring group may be represented by Formula 2-1.

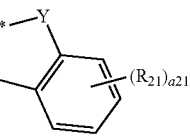

[Formula 2-1]

In Formula 2-1,

Y may be —N($R_{31}$) or —C($R_{32}$)($R_{33}$), and $R_{31}$ to $R_{33}$ may each independently be selected from hydrogen, deuterium, —F, —Cl, —Br, —I, a hydroxyl group, a nitro group, a $C_1$-$C_{60}$ alkyl group unsubstituted or substituted with at least one $R_{10a}$, a $C_3$-$C_{60}$ carbocyclic group unsubstituted or substituted with at least one $R_{10a}$, and a $C_1$-$C_{60}$ heterocyclic group unsubstituted or substituted with at least one $R_{10a}$.

$R_{32}$ and $R_{33}$ may be optionally connected to form a ring, a21 may be an integer from 1 to 4,

* indicates a binding site to a neighboring atom, and $R_{10a}$ is the same as described above.

In an embodiment, when a21 is an integer from 2 to 4, each of $R_{21}$(s) may be the same or different from each other.

In an embodiment, a ring of Formula 2-1 may be fused to at least one of three phenyl groups linked to N in Formula 2.

The second capping layer includes the compound of Formula 2, a refractive index of which is relatively low.

In an embodiment, Formula 2 may include a $C_1$-$C_{60}$ alkyl group moiety unsubstituted or substituted with at least one $R_{10a}$, a $C_3$-$C_{10}$ cycloalkyl group moiety unsubstituted or substituted with at least one $R_{10a}$, a fluorene moiety unsubstituted or substituted with at least one $R_{10a}$, or a spiro-bifluorene moiety unsubstituted or substituted with at least one $R_{10a}$. Formula 2 includes the moieties, and thus a refractive index of the second capping layer may be relatively low.

In an embodiment, the first capping layer may include one of following Compounds:
1
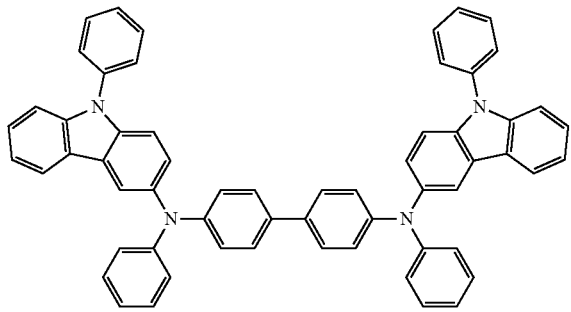
2
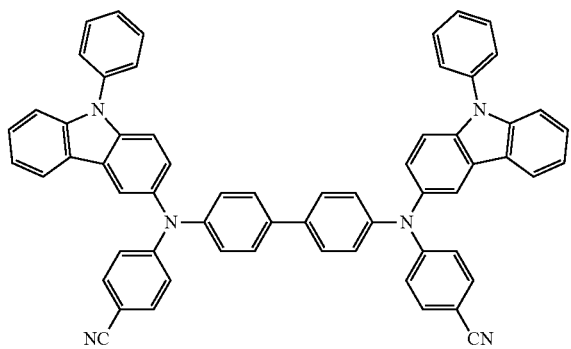
3
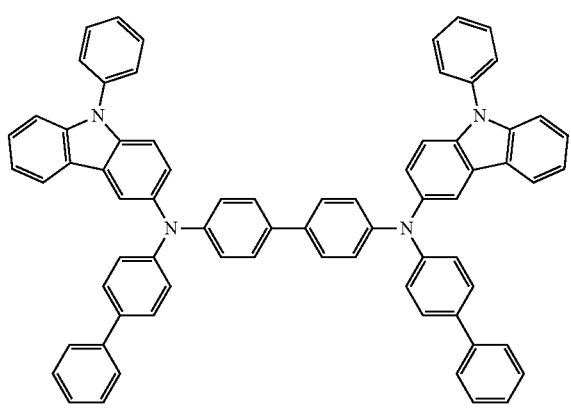
4
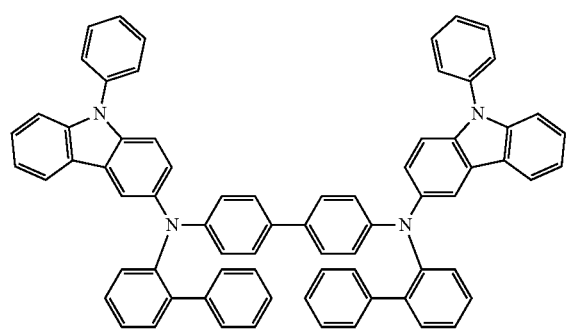
5
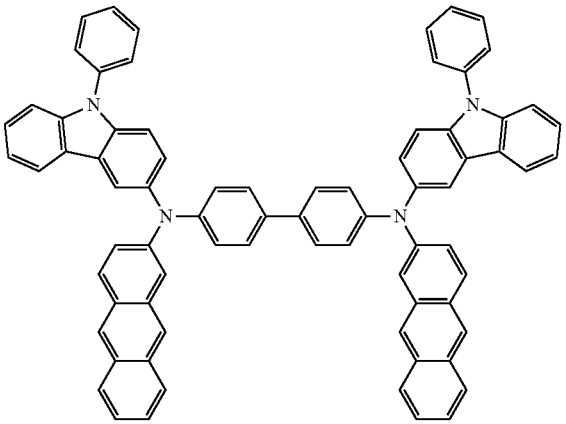
In an embodiment, the second capping layer may include one of following Compounds:
6
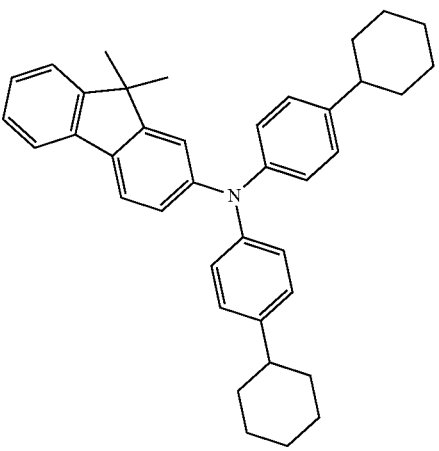
7
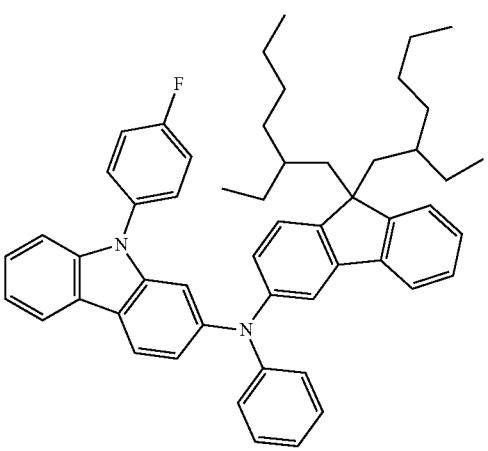

8
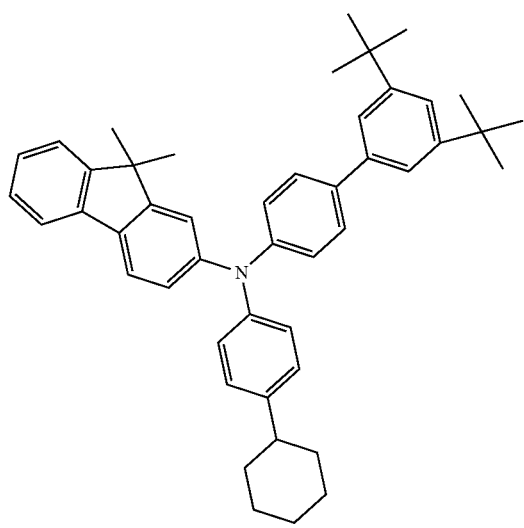
11
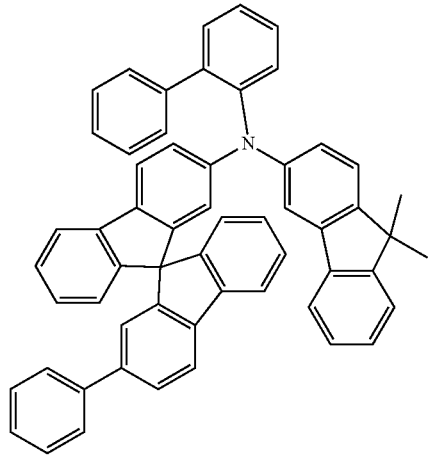
9
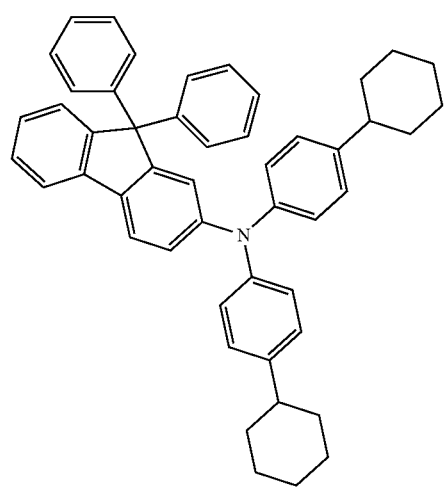
12
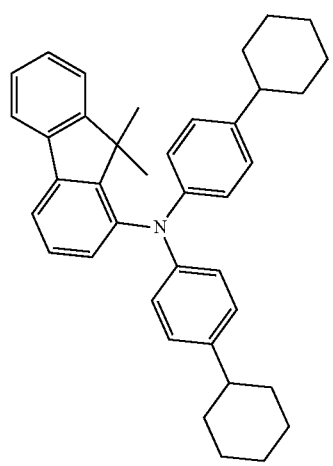
10
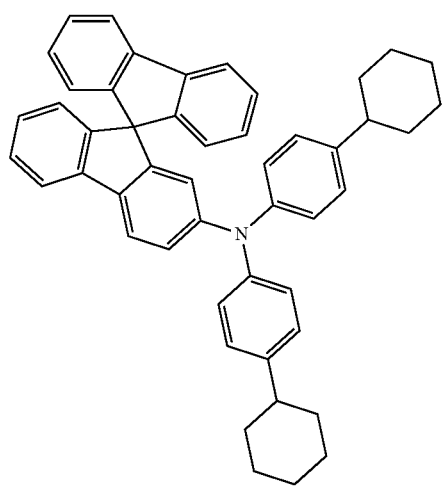
13
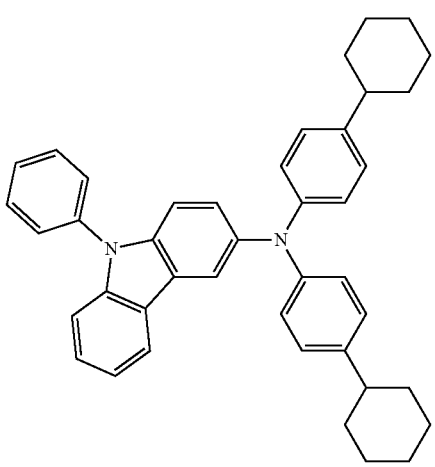

14
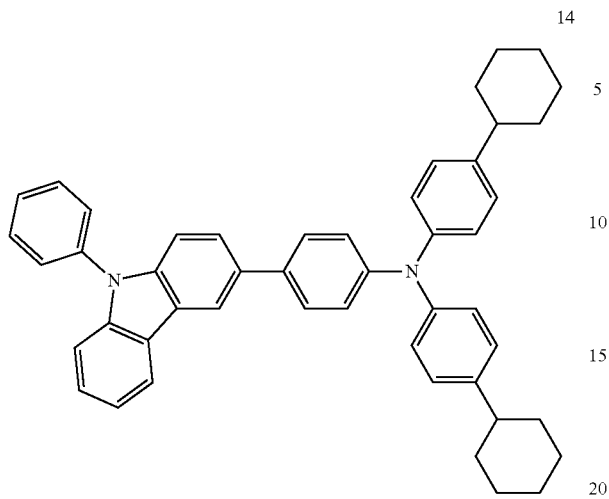
15
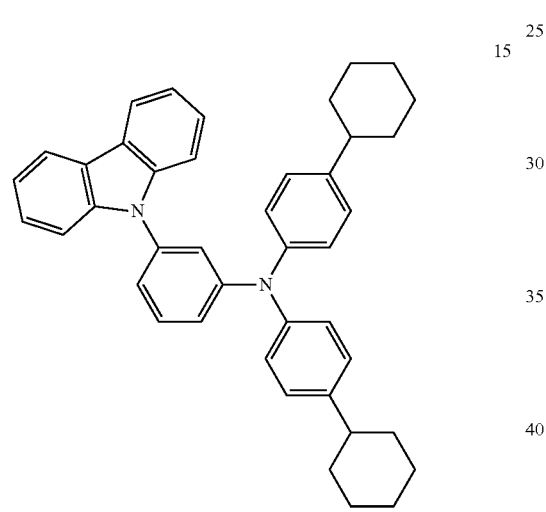
16
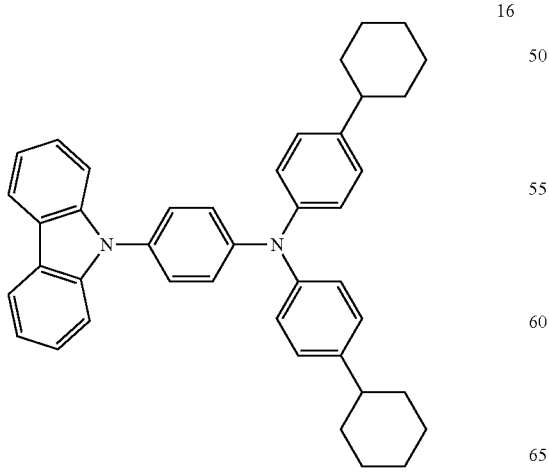
17
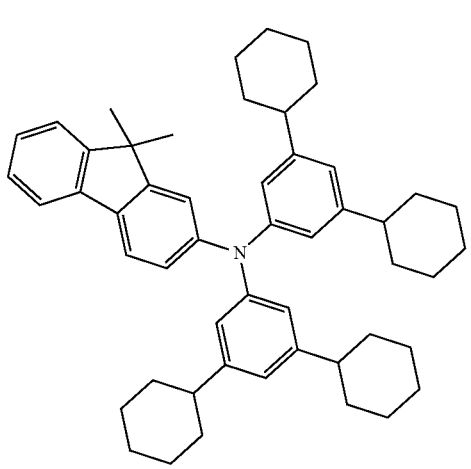
18
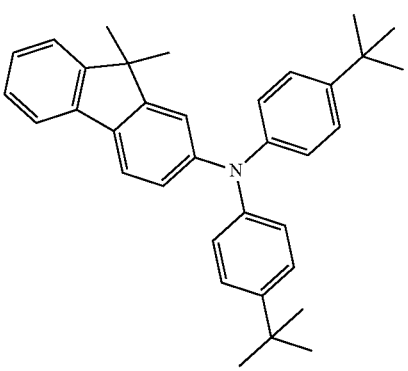
19
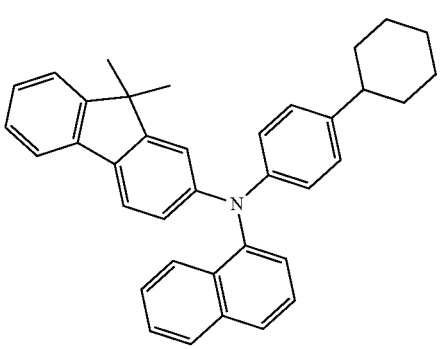
20

21
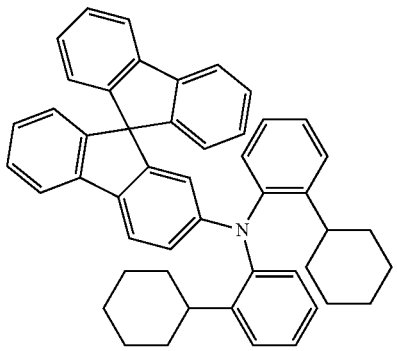
22
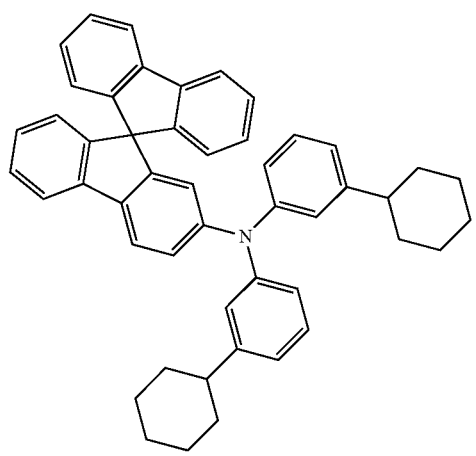
23
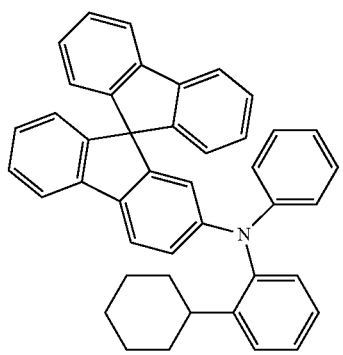
24
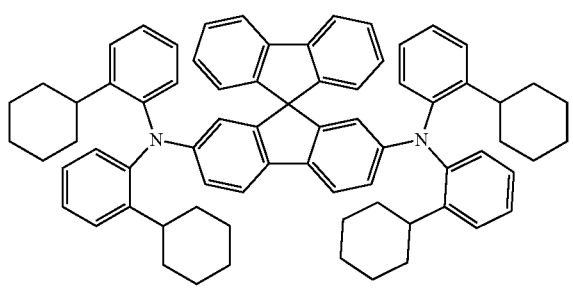
25
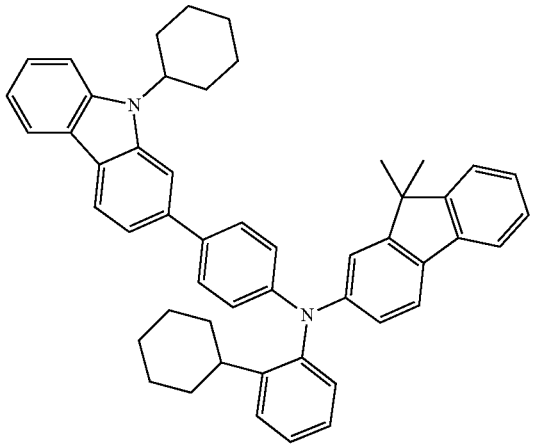
26
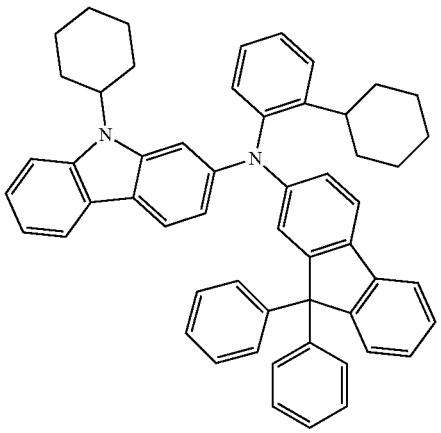
27
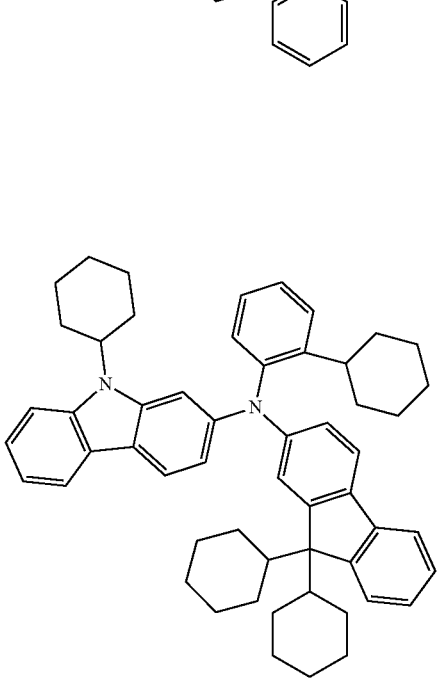

-continued

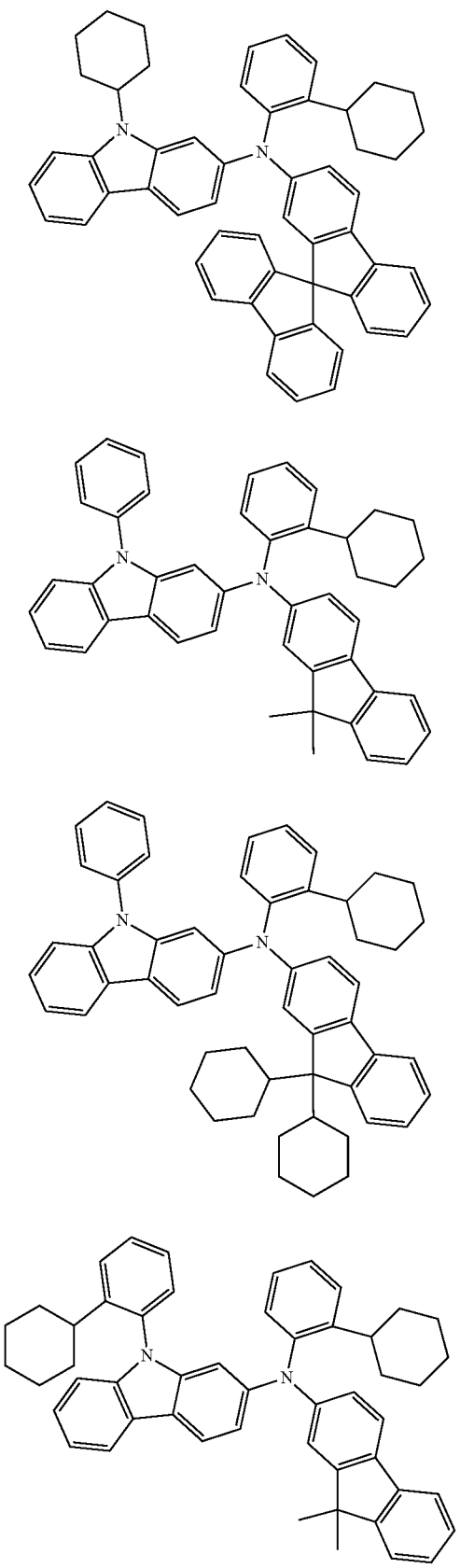

-continued

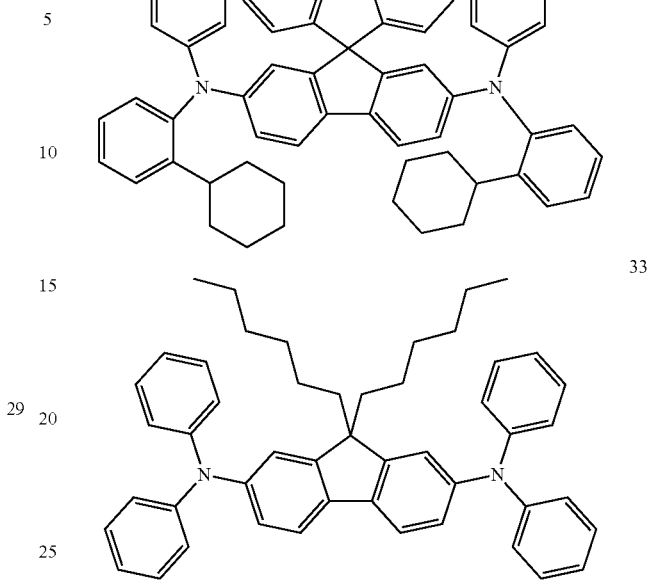

In an embodiment, the emission layer may be a phosphorescent or a fluorescent emission layer. In an embodiment, the emission layer may be a phosphorescent emission layer. In an embodiment, the emission layer may be a fluorescent emission layer.

According to another aspect, provided is an electronic apparatus including the light-emitting device. The electronic apparatus may further include a thin-film transistor. In an embodiment, the electronic apparatus may further include a thin-film transistor including a source electrode and a drain electrode, and the first electrode of the light-emitting device may be electrically connected to the source electrode or the drain electrode. The electronic apparatus may further include a color filter, a color conversion layer, a touch screen layer, a polarizing layer, or any combination thereof. A further detailed description of the electronic apparatus is the same as described in the specification.

The term "interlayer" as used herein refers to a single layer and/or all layers located between the first electrode and the second electrode of the light-emitting device. A material included in the "interlayer" may be an organic material, an inorganic material, or any combination thereof.

[Description of FIG. 1]

FIG. 1 is a schematic cross-sectional view of a light-emitting device 10 according to an embodiment. The light-emitting device 10 includes a first electrode 110, an interlayer 130, and a second electrode 150.

hereinafter, a structure of the light-emitting device 10 according to an embodiment and a method of manufacturing the light-emitting device 10 will be described in connection with FIG. 1.

[First Electrode 110]

In FIG. 1, a substrate may be additionally located under the first electrode 110 or above the second electrode 150. The substrate may be a glass substrate or a plastic substrate. The substrate may be a flexible substrate. In embodiments, the substrate may include plastics with excellent heat resistance and durability, such as polyimide, polyethylene terephthalate (PET), polycarbonate, polyethylene naphthalate, polyarylate (PAR), polyetherimide, or any combination thereof.

The first electrode 110 may be formed by, for example, depositing or sputtering a material for forming the first electrode 110 on the substrate. When the first electrode 110 is an anode, a high work function material that can easily inject holes may be used as a material for forming the first electrode 110.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combination thereof. In embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg-ln), magnesium-silver (Mg—Ag), or any combination thereof may be used as a material for forming the first electrode 110.

The first electrode 110 may have a single-layered structure consisting of a single layer or a multi-layered structure including multiple layers. In an embodiment, the first electrode 110 may have a three-layered structure of ITO/Ag/ITO.

[Interlayer 130]

The interlayer 130 is located on the first electrode 110. The interlayer 130 includes an emission layer.

The interlayer 130 may further include a hole transport region located between the first electrode 110 and the emission layer and an electron transport region located between the emission layer and the second electrode 150.

The interlayer 130 may further include metal-containing compounds such as organometallic compounds, inorganic materials such as quantum dots, and the like, in addition to various organic materials.

In embodiments, the interlayer 130 may include, i) two or more emitting units sequentially stacked between the first electrode 110 and the second electrode 150 and ii) a charge generation layer between the two emitting units. When the interlayer 130 includes the emitting units and the charge generation layer, the light-emitting device 10 may be a tandem light-emitting device.

[Hole Transport Region in Interlayer 130]

The hole transport region may have: i) a single-layered structure consisting of a single layer consisting of a single material, ii) a single-layered structure consisting of a single layer including different materials, or iii) a multi-layered structure including multiple layers including different materials.

The hole transport region may include a hole injection layer, a hole transport layer, an emission auxiliary layer, an electron blocking layer, or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110.

The hole transport region may include a compound represented by Formula 201, a compound represented by Formula 202, or any combination thereof:

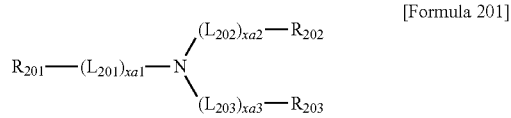

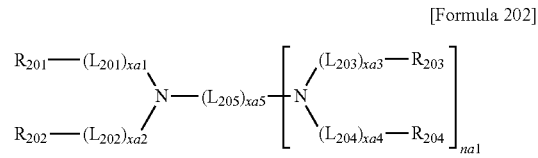

In Formulae 201 and 202, $L_{201}$ to $L_{204}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $L_{205}$ may be *—O—*', *—S—*', *—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, and $R_{201}$ to $R_{204}$ and $Q_{201}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$ (for example, a carbazole group or the like) (for example, refer to the following Compound HT16), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ poly cyclic group unsubstituted or substituted with at least one $R_{10a}$, and na1 may be an integer from 1 to 4.

In an embodiment, Formulae 201 and 202 may each include at least one of groups represented by Formulae CY201 to CY217:

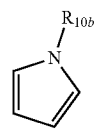

CY201

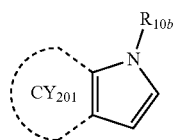

CY202

CY203 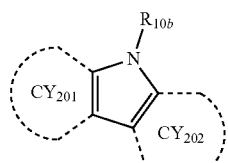

CY204 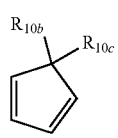

CY205 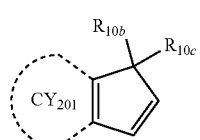

CY206 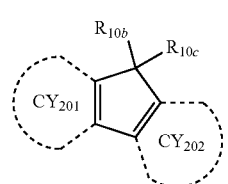

CY207 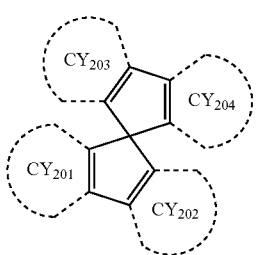

CY208 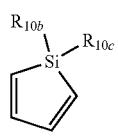

CY209 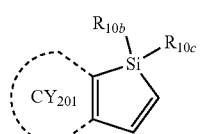

CY210 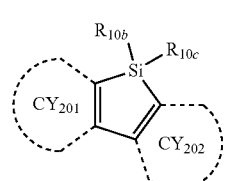

CY211 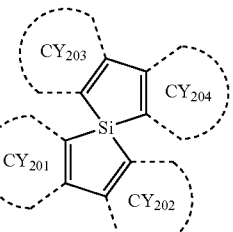

CY212 

CY213 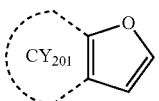

CY214 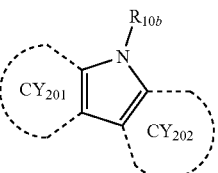

CY215 

CY216 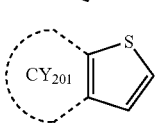

CY217 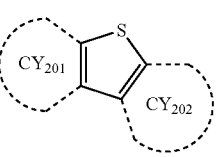

Regarding Formulae CY201 to CY217, $R_{10b}$ and $R_{10c}$ are the same as described in connection with $R_{10a}$, ring CY201 to ring CY204 may each independently be a $C_3$-$C_{20}$ carbocyclic group or a $C_1$-$C_{20}$ heterocyclic group, and at least one hydrogen in Formula CY201 to CY217 may be unsubstituted or substituted with at least one $R_{10a}$ described herein.

In an embodiment, ring CY201 to ring CY204 in Formulae CY201 to CY217 may each independently be a benzene group, a naphthalene group, a phenanthrene group, or an anthracene group.

In an embodiment, Formulae 201 and 202 may each include at least one of groups represented by Formulae CY201 to CY203:

In embodiments, Formula 201 may include at least one of groups represented by Formulae CY201 to CY203 and at least one of groups represented by Formulae CY204 to CY217.

In embodiments, in Formula 201, xa1 is 1, $R_{201}$ is a group represented by one of Formulae CY201 to CY203, xa2 is 0, $R_{202}$ is a group represented by one of Formulae CY204 to CY207.

In embodiments, each of Formulae 201 and 202 may not include a group represented by one of Formulae CY201 to CY203.

In embodiments, each of Formulae 201 and 202 may not include a group represented by one of Formulae CY201 to CY203 and may include at least one of groups represented by Formulae CY204 to CY217.

In an embodiment, each of Formulae 201 and 202 may not include a group represented by one of Formulae CY201 to CY217.

In an embodiment, the hole transport region may include one of Compounds HT1 to HT44, m-MTDATA, TDATA, 2-TNATA, NPB(NPD), β-NPB, TPD, Spiro-TPD, Spiro-NPB, methylated-NPB, TAPC, FIMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

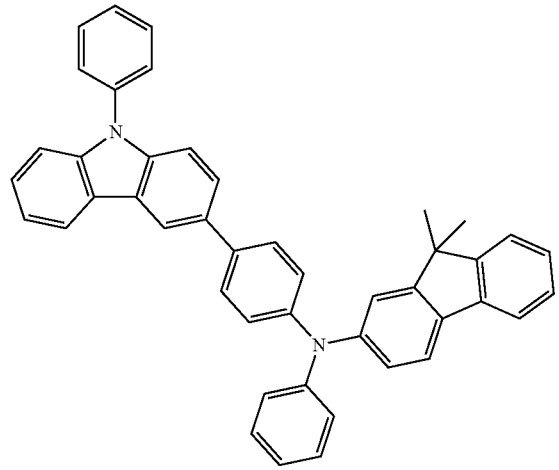

HT1

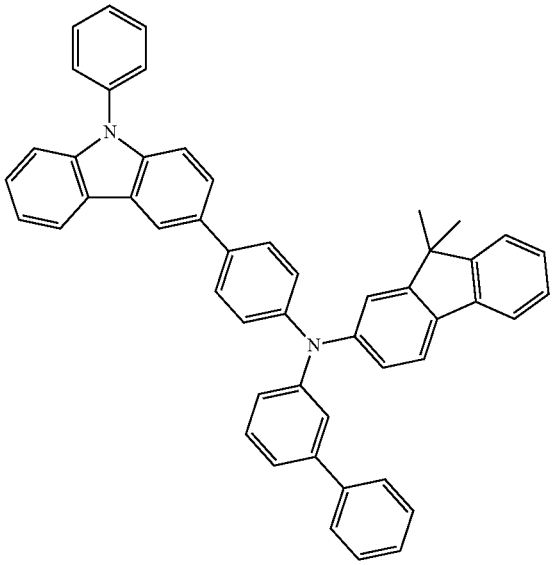

HT2

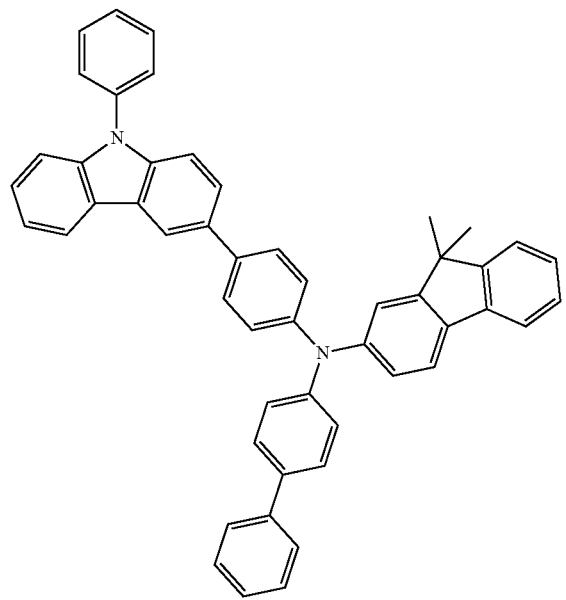

HT3

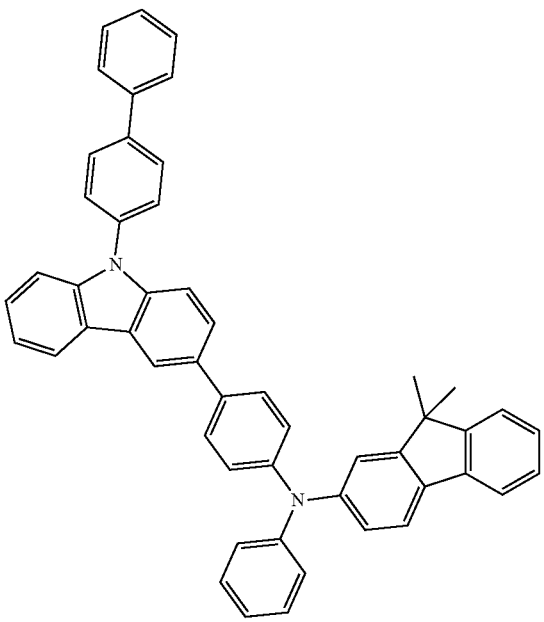

HT4

-continued
HT5
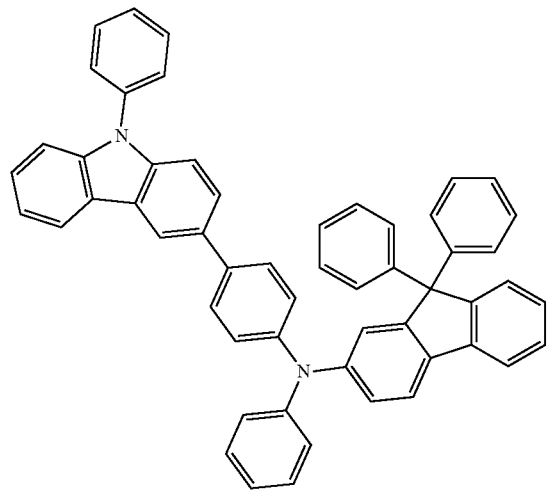
HT6
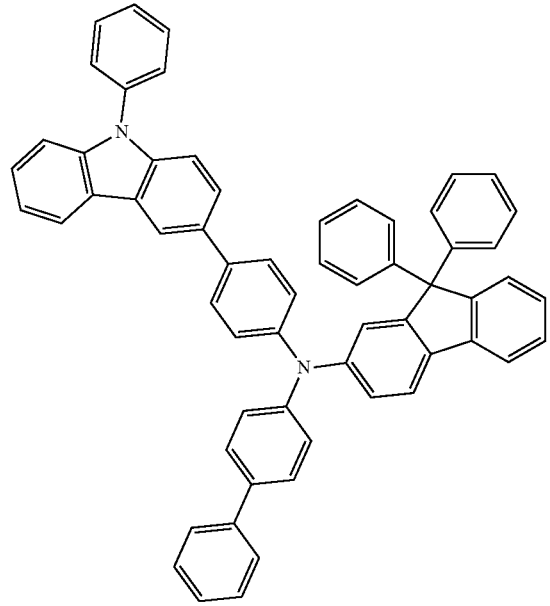
HT7
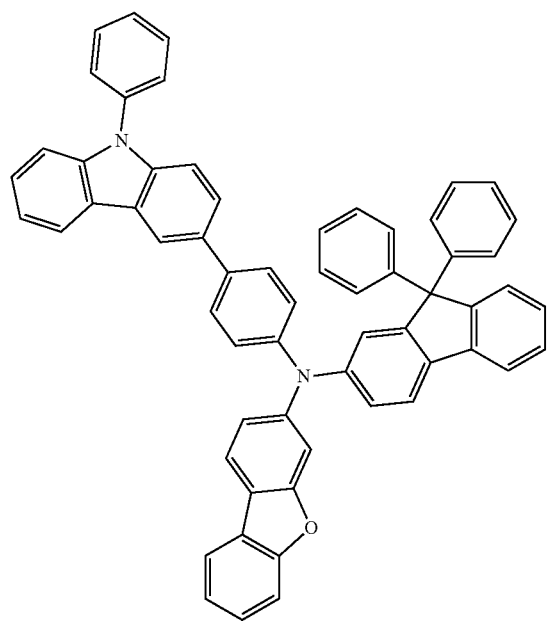
HT8
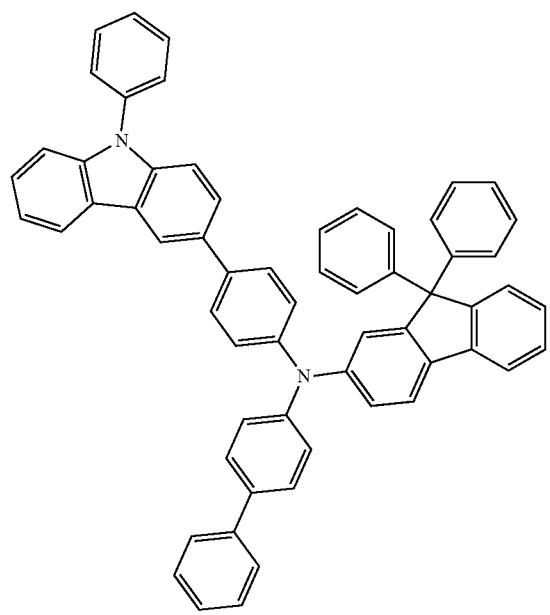

-continued
HT9
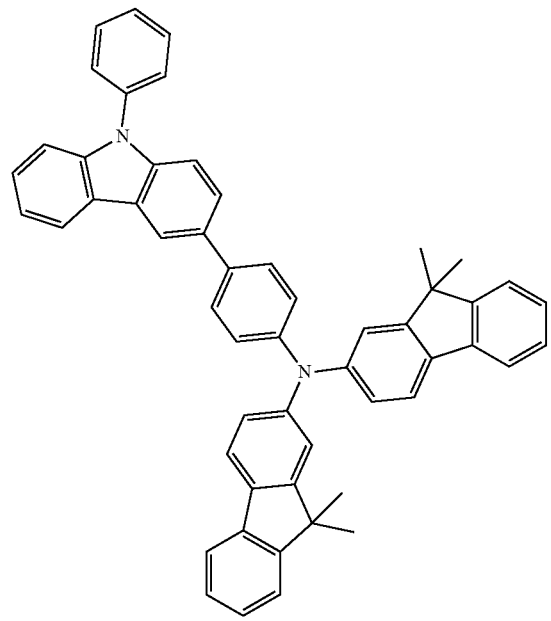
HT10
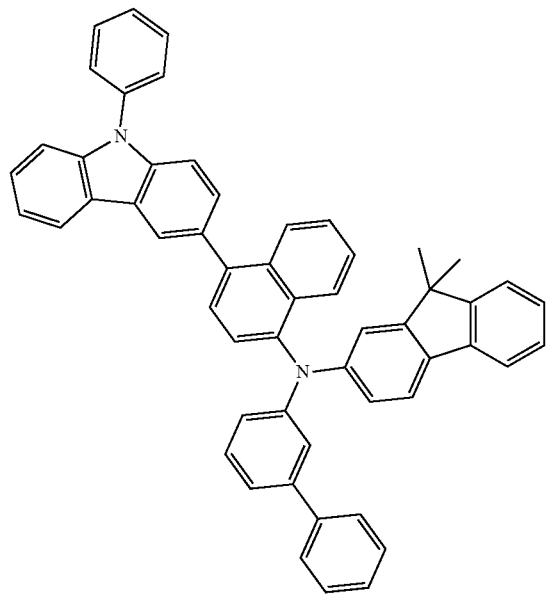
HT11
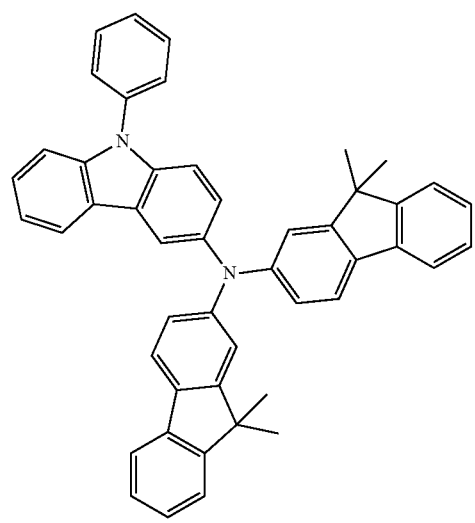
HT12
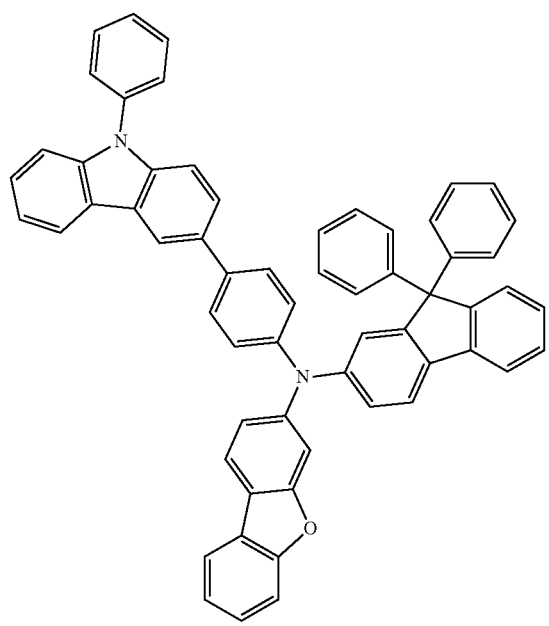

-continued
HT13
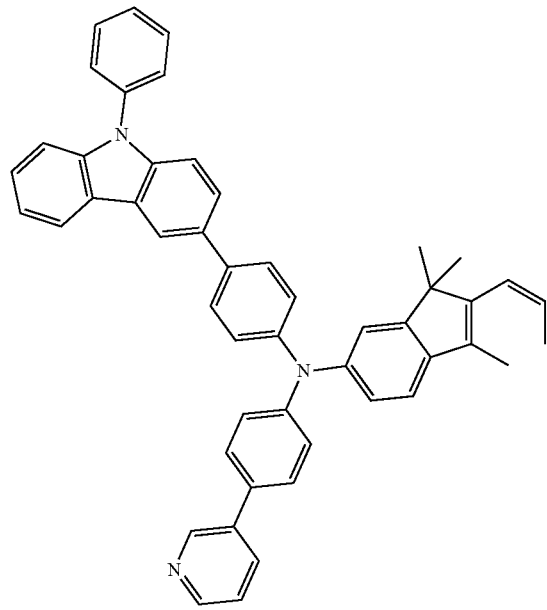
HT14
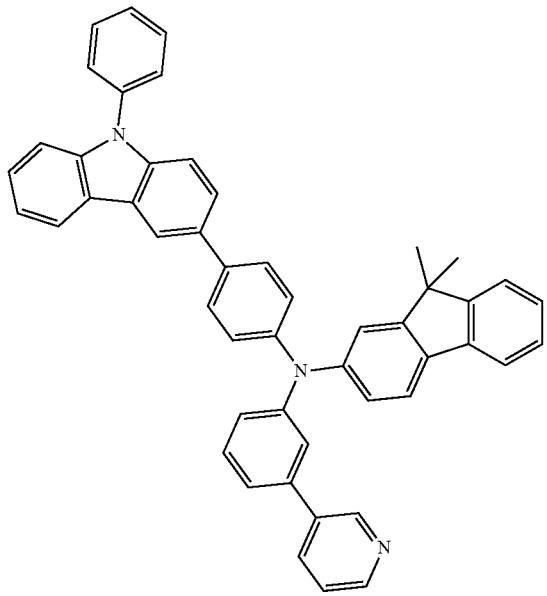
HT15
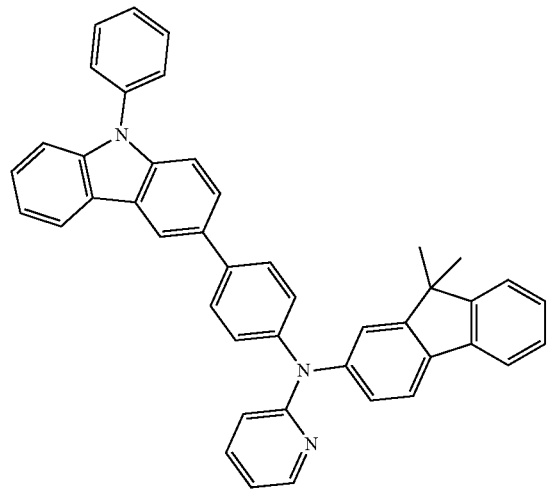
HT16
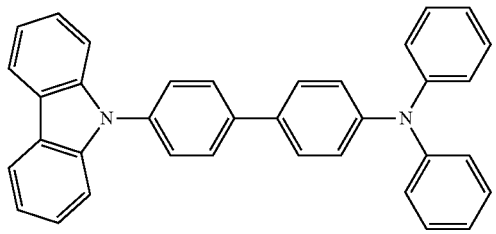
HT17
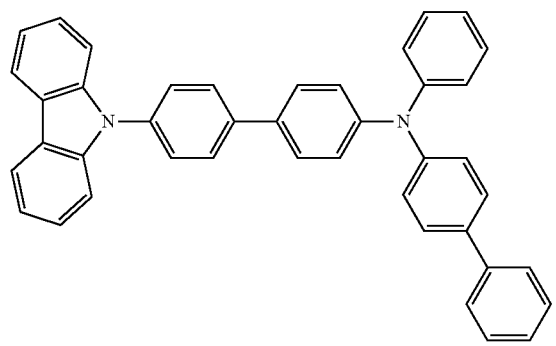
HT18
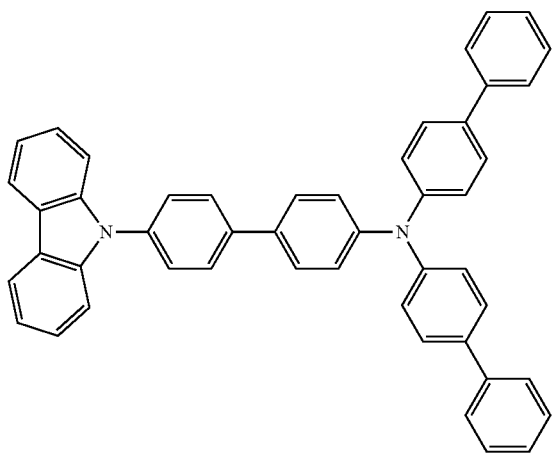

-continued
HT19
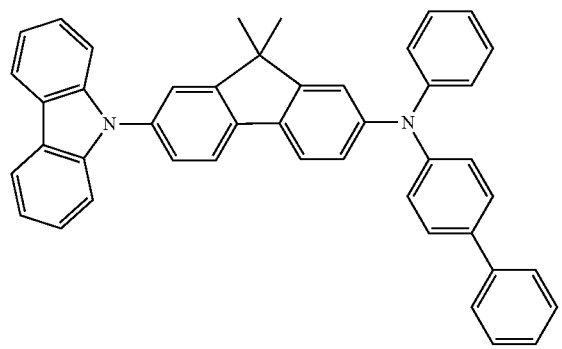
HT20
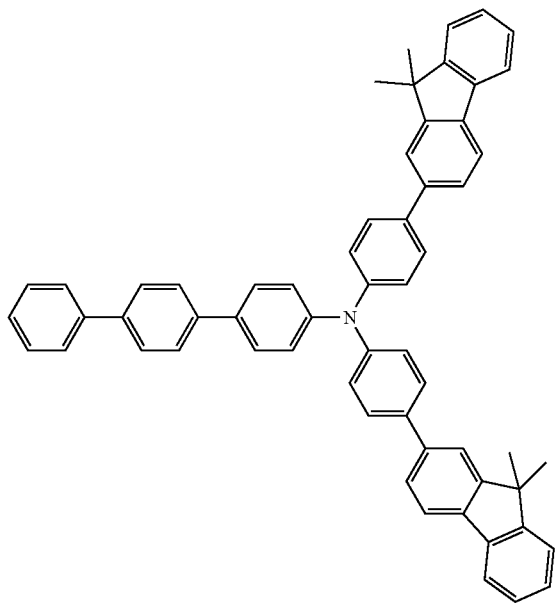
HT21
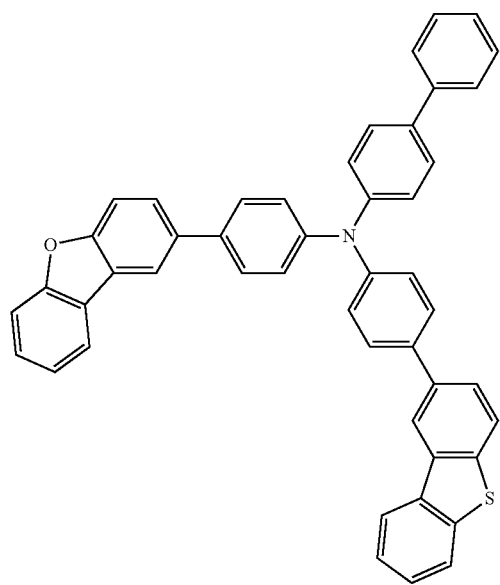
HT22
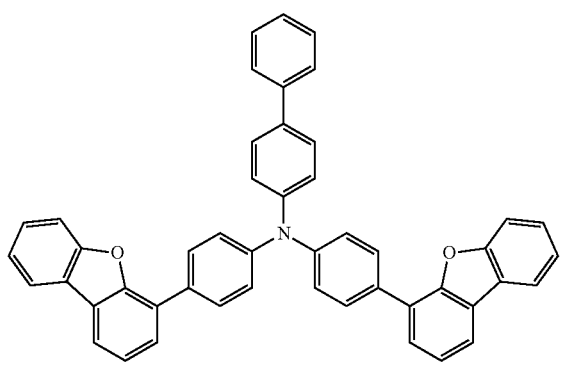

-continued
HT23
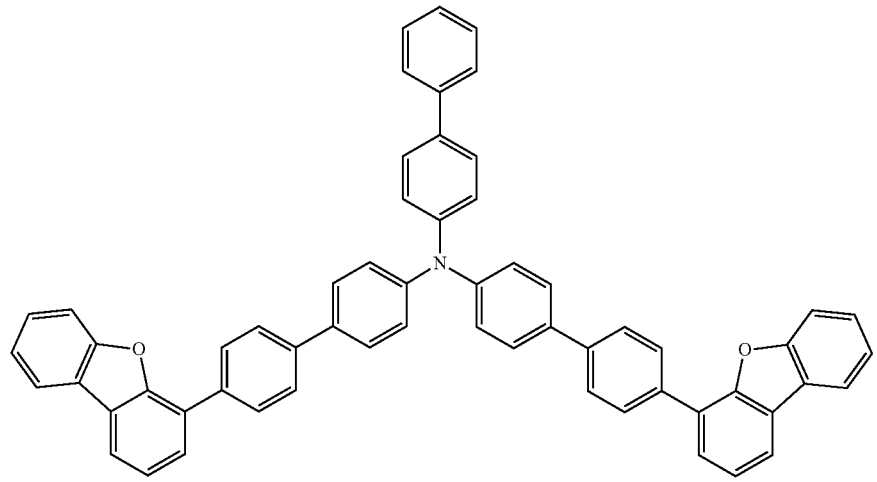
HT24
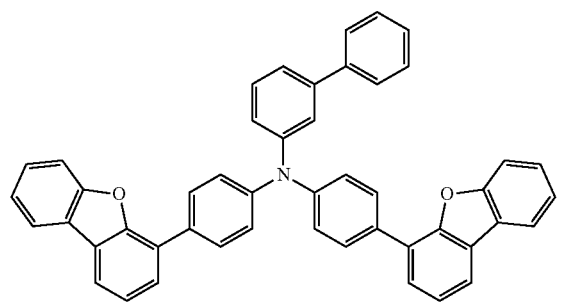
HT25
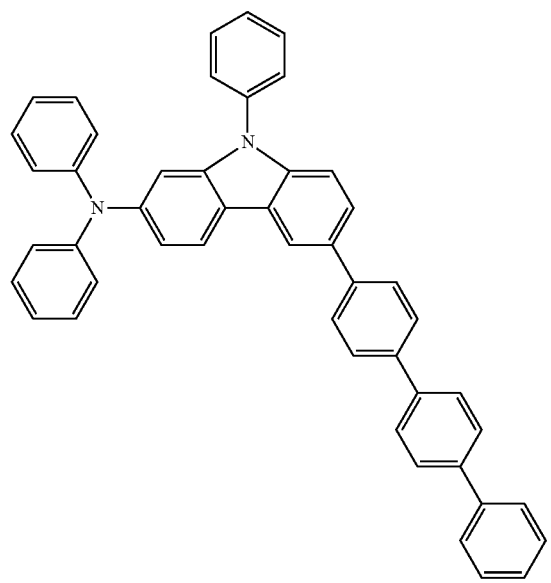
HT26
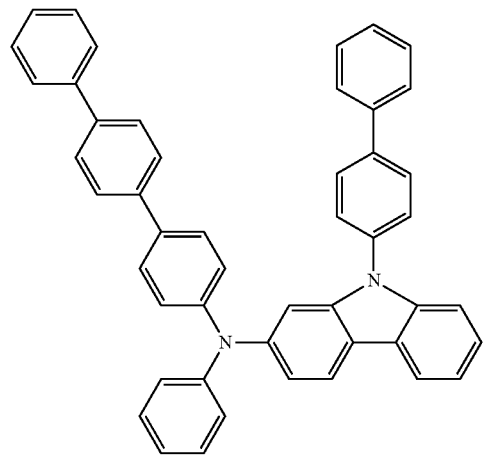
HT27
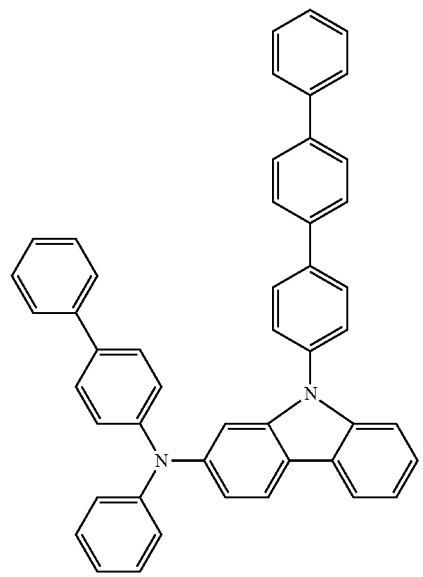

-continued
HT28
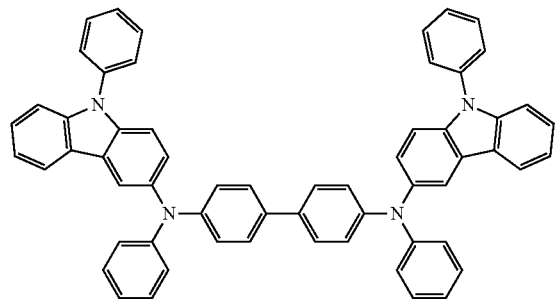
HT29
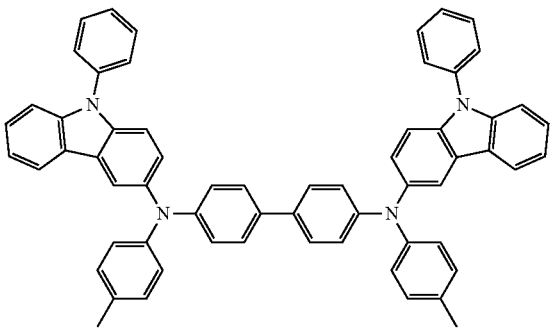
HT30
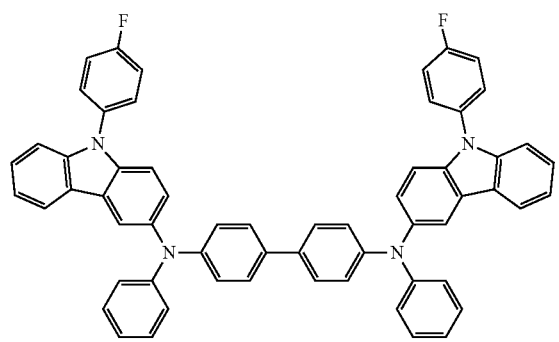
HT31
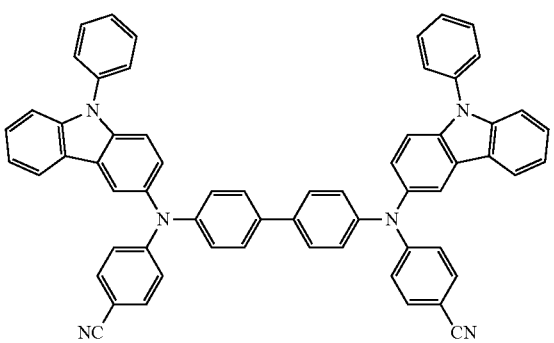
HT32
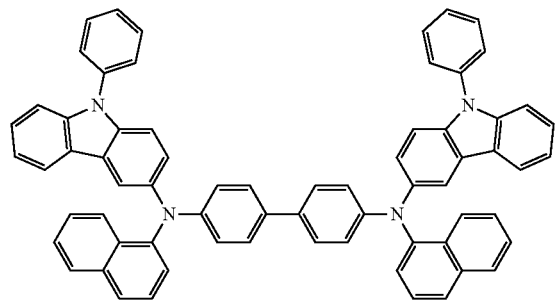
HT33
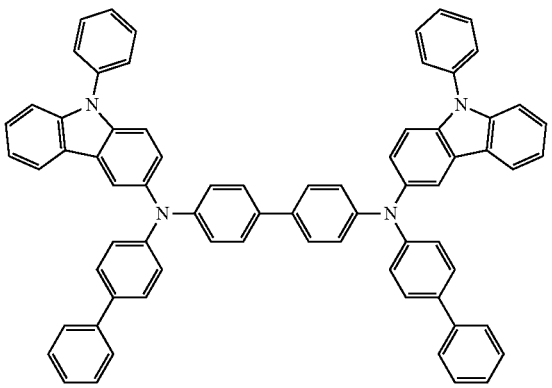
HT34
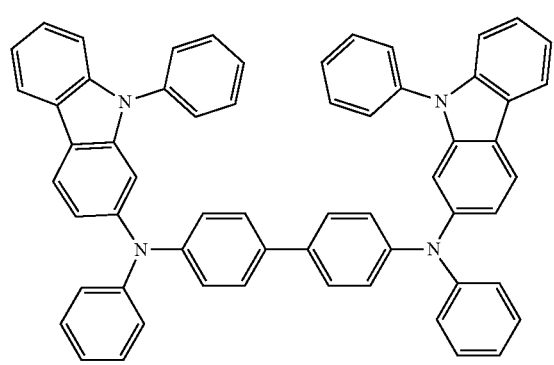
HT35
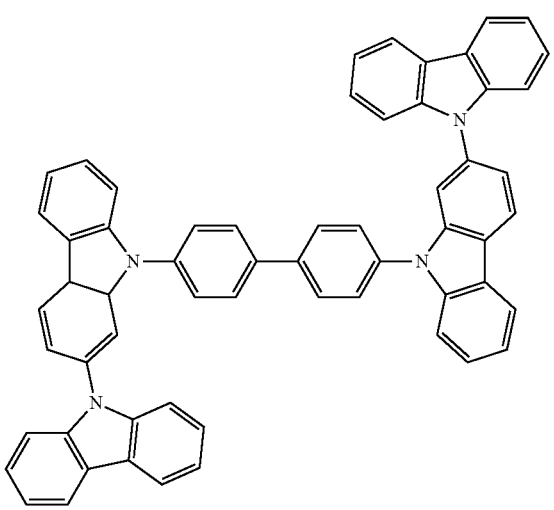

-continued
HT36
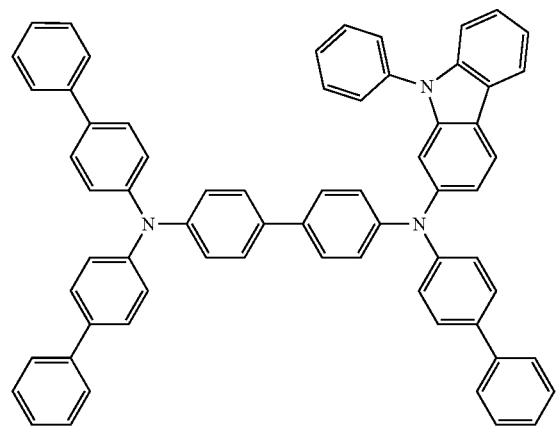
HT37
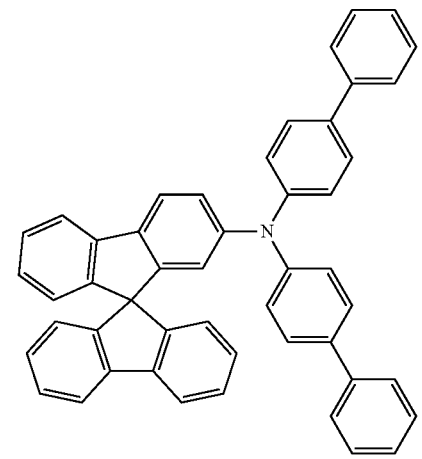
HT38
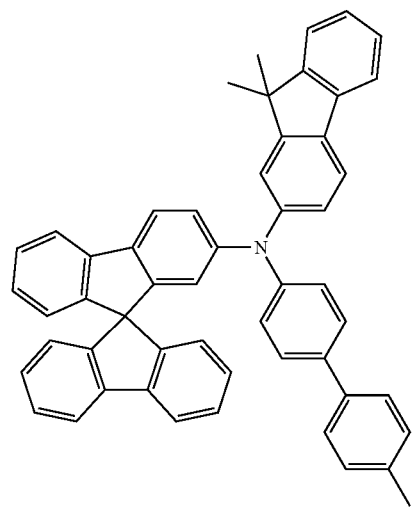
HT39
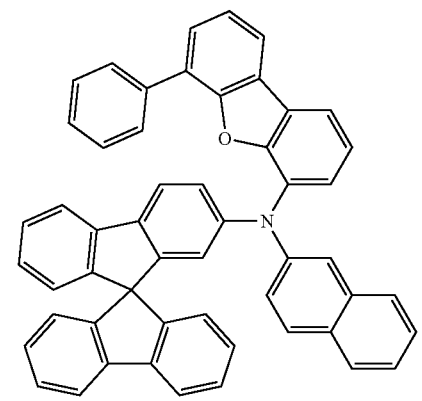
HT40
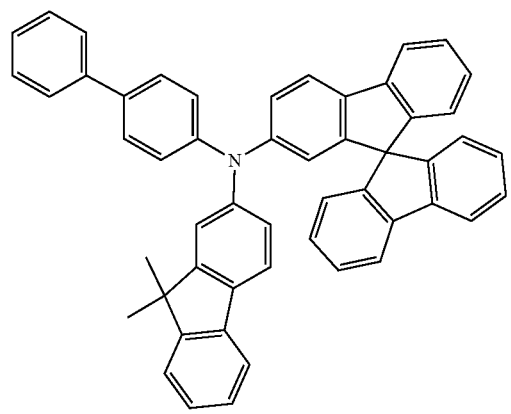
HT41
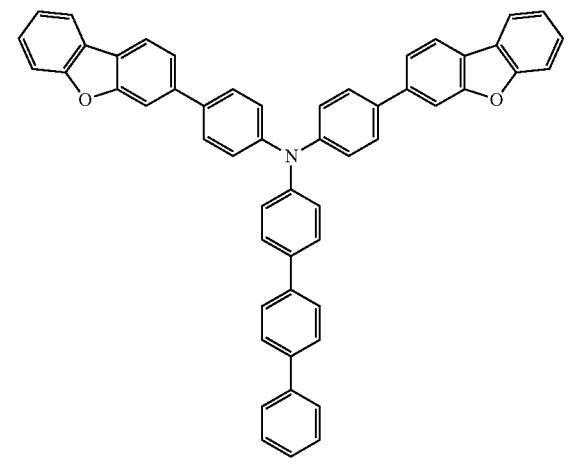

-continued
HT42
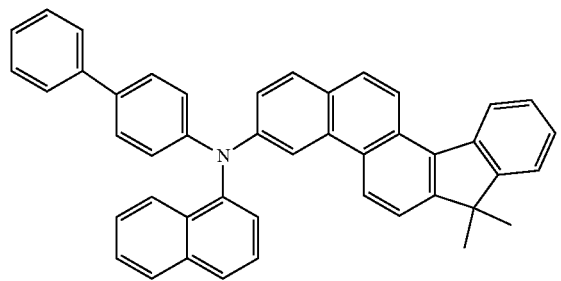
HT43
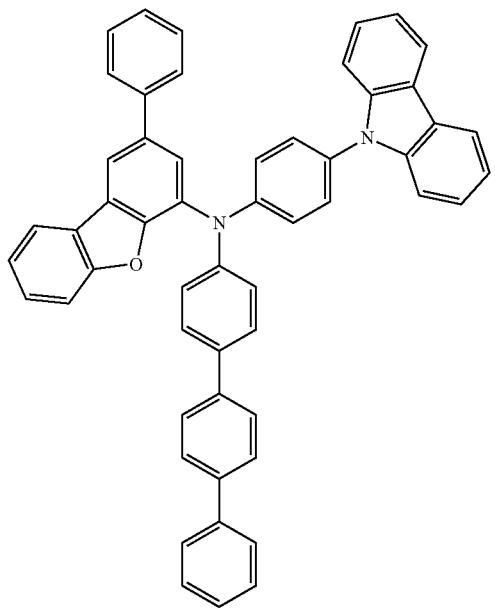
HT44
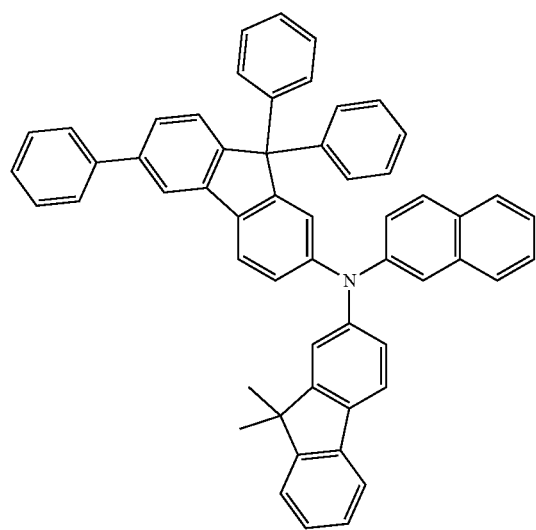
m-MTDATA
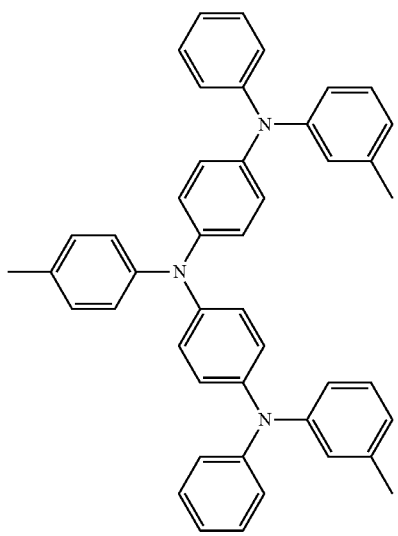

-continued
TDATA
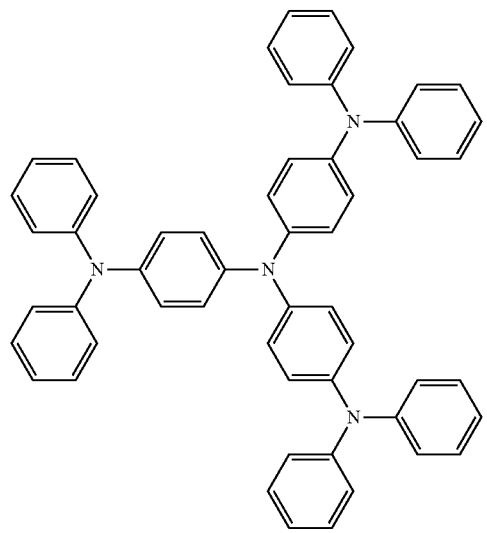
2-TNATA
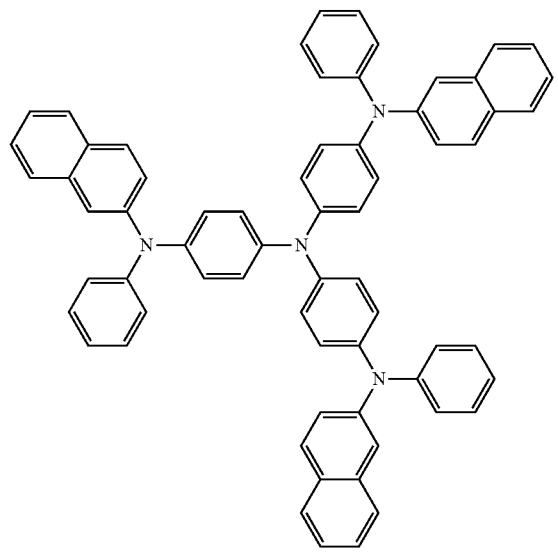
NPB
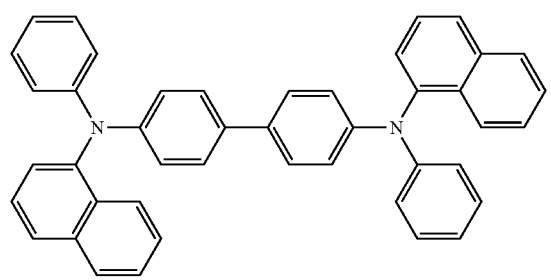
β-NPB
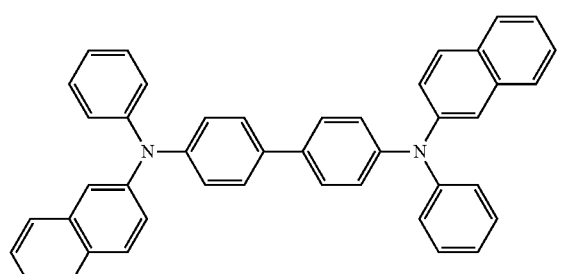
TPD
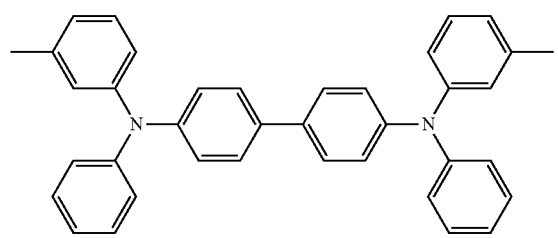
Spiro-TPD
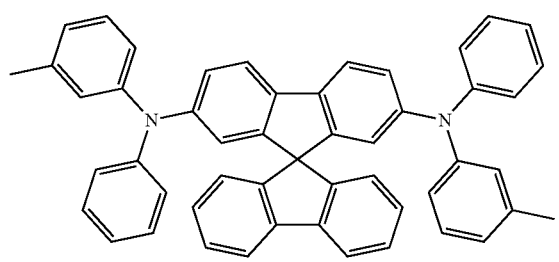
Spiro-NPB
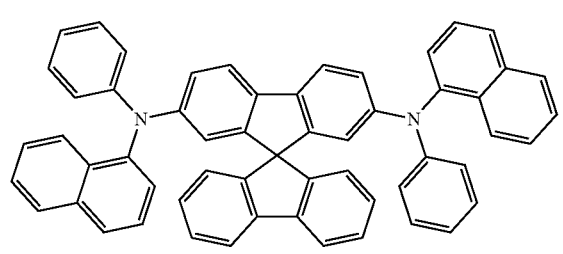
methylated-NPB
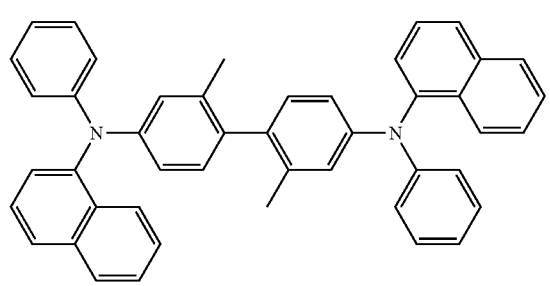

-continued

TAPC

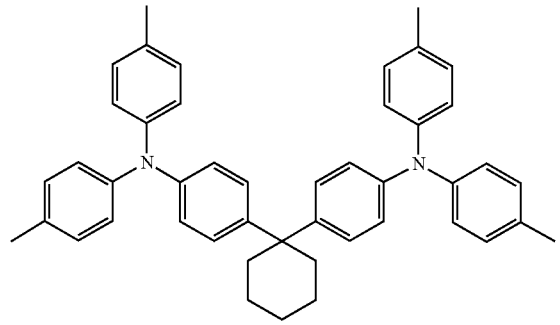

HMTPD

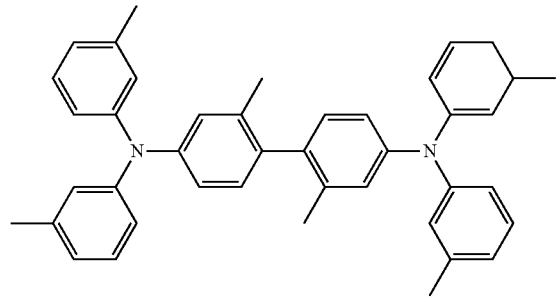

A thickness of the hole transport region may be in a range of about 50 Å to about 10,000 Å. For example, the thickness of the hole transport region may be in a range of about 100 Å to about 4,000 Å. When the hole transport region includes a hole injection layer, a hole transport layer, or any combination thereof, a thickness of the hole injection layer may be in a range of about 100 Å to about 9,000 Å, and a thickness of the hole transport layer may be in a range of about 50 Å to about 2,000 Å. For example, the thickness of the hole injection layer may be in a range of 100 Å to about 1,000 Å. For example, the thickness of the hole transport layer may be in a range of about 100 Å to about 1,500 Å. When the thicknesses of the hole transport region, the hole injection layer, and the hole transport layer are within these ranges, satisfactory hole transporting characteristics may be obtained without a substantial increase in driving voltage.

The emission auxiliary layer may increase light-emission efficiency by compensating for an optical resonance distance according to the wavelength of light emitted by an emission layer, and the electron blocking layer may block the flow of electrons from an electron transport region. The emission auxiliary layer and the electron blocking layer may include the materials as described above.

[p-Dopant]

The hole transport region may further include, in addition to these materials, a charge-generating material for improvement of conductive properties. The charge-generating material may be uniformly or non-uniformly dispersed in the hole transport region (for example, in the form of a single layer of a charge-generating material).

The charge-generation material may be, for example, a p-dopant.

In an embodiment, a lowest unoccupied molecular orbital (LUMO) energy level of the p-dopant may be equal to or less than about −3.5 eV.

In an embodiment, the p-dopant may include a quinone derivative, a cyano group-containing compound, element EL1 and element EL2-containing compound, or any combination thereof.

Examples of the quinone derivative may include TCNQ and F4-TCNQ.

Examples of the cyano group-containing compound may include FIAT-CN and a compound represented by Formula 221 below.

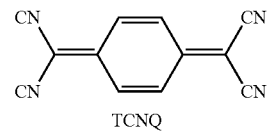

TCNQ

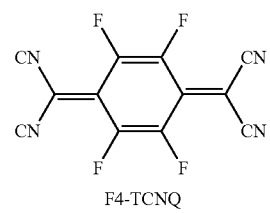

F4-TCNQ

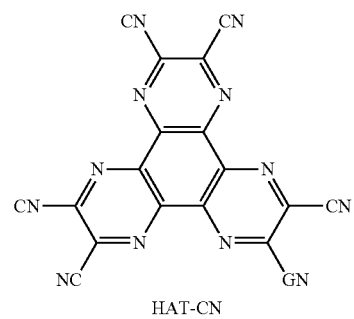

HAT-CN

[Formula 221]

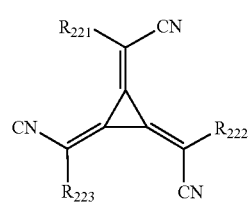

In Formula 221, $R_{221}$ to $R_{223}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, and at least one of $R_{221}$ to $R_{223}$ may each independently be a $C_3$-$C_{30}$ carbocyclic group or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

Regarding the compound containing element EL1 and element EL2, element EL1 may be metal, metalloid, or a combination thereof, and element EL2 may be a non-metal, metalloid, or a combination thereof.

Examples of the metal may include: an alkali metal (for example, lithium (Li), sodium (Na), potassium (K), rubidium (Rb), cesium (Cs), or the like); an alkaline earth metal (for example, beryllium (Be), magnesium (Mg), calcium (Ca), strontium (Sr), barium (Ba), or the like); a transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), or the like); a post-transition metal (for example, zinc (Zn), indium (In), tin (Sn), or the like); and a lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or the like).

Examples of the metalloid may include silicon (Si), antimony (Sb), and tellurium (Te).

Examples of the non-metal may include oxygen (O) and halogen (for example, F, Cl, Br, I, etc.).

In an embodiment, examples of the compound containing element EL1 and element EL2 may include metal oxide, metal halide (for example, metal fluoride, metal chloride, metal bromide, or metal iodide), metalloid halide (for example, metalloid fluoride, metalloid chloride, metalloid bromide, or metalloid iodide), metal telluride, or any combination thereof.

Examples of the metal oxide may include tungsten oxide (for example, WO, $W_2O_3$, $WO_2$, $WO_3$, or $W_2O_5$), vanadium oxide (for example, VO, $V_2O_3$, $VO_2$, or $V_2O_5$), molybdenum oxide (MoO, $Mo_2O_3$, $MoO_2$, $MoO_3$, or $Mo_2O_5$), and rhenium oxide (for example, $ReO_3$).

Examples of the metal halide may include alkali metal halide, alkaline earth metal halide, transition metal halide, post-transition metal halide, and lanthanide metal halide.

Examples of the alkali metal halide may include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide may include $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide may include titanium halide (for example, $TiF_4$, $TiCl_4$, $TiBr_4$, or $TiI_4$), zirconium halide (for example, $ZrF_4$, $ZrCl_4$, $ZrBr_4$, or $ZrI_4$), hafnium halide (for example, $HfF_4$, $HfCl_4$, $HfBr_4$, or $HfI_4$), vanadium halide (for example, $VF_3$, $VCl_3$, $VBr_3$, or $VI_3$), niobium halide (for example, $NbF_3$, $NbCl_3$, $NbBr_3$, or $NbI_3$), tantalum halide (for example, $TaF_3$, $TaCl_3$, $TaBr_3$, or $TaI_3$), chromium halide (for example, $CrF_3$, $CrCl_3$, $CrBr_3$, or $CrI_3$), molybdenum halide (for example, $MoF_3$, $MoCl_3$, $MoBr_3$, or $MoI_3$), tungsten halide (for example, $WF_3$, $WCl_3$, $WBr_3$, or $WI_3$), manganese halide (for example, $MnF_2$, $MnCl_2$, $MnBr_2$, or $MnI_2$), technetium halide (for example, $TCF_2$, $TCCl_2$, $TcBr_2$, or $TcI_2$), rhenium halide (for example, $ReF_2$, $ReCl_2$, $ReBr_2$, or $ReI_2$), iron halide (for example, $FeF_2$, $FeCl_2$, $FeBr_2$, or $FeI_2$), ruthenium halide (for example, $RuF_2$, $RuCl_2$, $RuBr_2$, or $RuI_2$), osmium halide (for example, $OsF_2$, $OsCl_2$, $OsBr_2$, or $OsI_2$), cobalt halide (for example, $CoF_2$, $CoCl_2$, $CoBr_2$, or $CoI_2$), rhodium halide (for example, $RhF_2$, $RhCl_2$, $RhBr_2$, or $RhI_2$), iridium halide (for example, $IrF_2$, $IrCl_2$, $IrBr_2$, or $IrI_2$), nickel halide (for example, $NiF_2$, $NiCl_2$, $NiBr_2$, or $NiI_2$), palladium halide (for example, $PdF_2$, $PdCl_2$, $PdBr_2$, or $PdI_2$), platinum halide (for example, $PtF_2$, $PtCl_2$, $PtBr_2$, or $PtI_2$), copper halide (for example, CuF, CuCl, CuBr, or CuI), silver halide (for example, AgF, AgCl, AgBr, or AgI), and gold halide (for example, AuF, AuCl, AuBr, or AuI).

Examples of the post-transition metal halide may include zinc halide (for example, $ZnF_2$, $ZnCl_2$, $ZnBr_2$, or $ZnI_2$), indium halide (for example, Inb), and tin halide (for example, $SnI_2$).

Examples of the lanthanide metal halide may include YbF, $YbF_2$, $YbF_3$, $SmF_3$, YbCl, $YbCl_2$, $YbCl_3$ $SmCl_3$, YbBr, $YbBr_2$, $YbBr_3SmBr_3$, YbI, $YbI_2$, $YbI_3$, and $SmI_3$.

Examples of the metalloid halide may include antimony halide (for example, $SbCl_5$).

Examples of the metal telluride may include alkali metal telluride (for example, $Li_2Te$, $Na_2Te$, $K_2Te$, $Rb_2Te$, or$Cs_2Te$), alkaline earth metal telluride (for example, BeTe, MgTe, CaTe, SrTe, or BaTe), transition metal telluride (for example, $TiTe_2$, $ZrTe_2$, $FlfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, or $Au_2Te$), post-transition metal telluride (for example, or ZnTe), and lanthanide metal telluride (for example, LaTe, CeTe, PrTe, NdTe, PmTe, EuTe, GdTe, TbTe, DyTe, HoTe, ErTe, TmTe, YbTe, or LuTe).

[Emission Layer in Interlayer 130]

When the light-emitting device 10 is a full-color light-emitting device, the emission layer may be patterned into a red emission layer, a green emission layer, and/or a blue emission layer, according to a subpixel. In embodiments, the emission layer may have a stacked structure of two or more layers of a red emission layer, a green emission layer, and a blue emission layer, in which the two or more layers contact each other or are separated from each other to emit white light. In embodiments, the emission layer may include two or more materials of a red light-emitting material, a green light-emitting material, and a blue light-emitting material, in which the two or more materials are mixed with each other in a single layer to emit white light.

The emission layer may include a host and a dopant. The dopant may include a phosphorescent dopant, a fluorescent dopant, or any combination thereof.

The amount of the dopant in the emission layer may be in a range of about 0.01 to about 15 parts by weight based on 100 parts by weight of the host.

In embodiments, the emission layer may include a quantum dot.

The emission layer may include a delayed fluorescent material. The delayed fluorescent material may act as a host or a dopant in the emission layer.

A thickness of the emission layer may be in a range of about 100 Å to about 1,000 Å. For example, the thickness of the emission layer may be in a range of about 200 Å to about 600 Å. When the thickness of the emission layer is within this range, excellent light-emission characteristics may be obtained without a substantial increase in driving voltage.

[Host]

The host may include a compound represented by Formula 301 below:

[Ar$_{301}$]$_{xb11}$-[(L$_{301}$)$_{xb1}$-R$_{301}$]$_{xb21}$   [Formula 301]

In Formula 301,

Ar$_{301}$ and L$_{301}$ may each independently be a C$_3$-C$_{60}$ carbocyclic group unsubstituted or substituted with at least one R$_{10a}$ or a C$_1$-C$_{60}$ heterocyclic group unsubstituted or substituted with at least one R$_{10a}$, xb11 may be 1, 2, or 3, xb1 may be an integer from 0 to 5, R$_{301}$ may be hydrogen, deuterium, —F, —Cl, —Br, —I, hydroxyl group, a cyano group, a nitro group, a C$_1$-C$_{60}$ alkyl group unsubstituted or substituted with at least one R$_{10a}$, a C$_2$-C$_{60}$ alkenyl group unsubstituted or substituted with at least one R$_{10a}$, a C$_2$-C$_{60}$ alkynyl group unsubstituted or substituted with at least one R$_{10a}$, a C$_1$-C$_{60}$ alkoxy group unsubstituted or substituted with at least one R$_{10a}$, a C$_3$-C$_{60}$ carbocyclic group unsubstituted or substituted with at least one R$_{10a}$, a C$_1$-C$_{60}$ heterocyclic group unsubstituted or substituted with at least one R$_{10a}$, —Si(Q$_{301}$)(Q$_{302}$)(Q$_{303}$), —N(Q$_{301}$)(Q$_{302}$), —B(Q$_{301}$)(Q$_{302}$), —C(=O)(Q$_{301}$), —S(=O)$_2$(Q$_{301}$), or —P(=O)(Q$_{301}$)(Q$_{302}$), xb21 may be an integer from 1 to 5, and Q$_{301}$ to Q$_{303}$ may be the same as described in connection with Q$_1$.

In embodiments, when xb11 in Formula 301 is 2 or more, two or more of Ar$_{301}$(s) may be linked to each other via a single bond.

In an embodiment, the host may include a compound represented by Formula 301-1, a compound represented by Formula 301-2, or any combination embodiment:

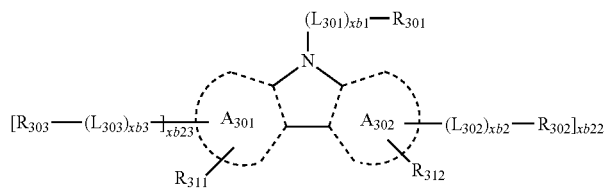

[Formula 301-1]

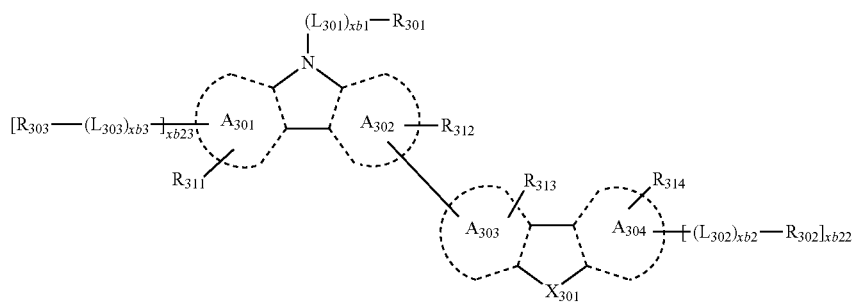

[Formula 301-2]

In Formulae 301-1 and 301-2,
ring $A_{301}$ to ring $A_{304}$ may each independently be a $C_3$-$C_{30}$ carbocyclic group unsubstituted or substituted with at least one $R_{10a}$ or a $C_1$-$C_{60}$ heterocyclic group unsubstituted or substituted with at least one $R_{10a}$, $X_{301}$ may be O, S, N-[$(L_{304})_{xb4}$-$R_{304}$], C($R_{304}$)($R_{305}$), or Si($R_{304}$)($R_{305}$), xb22 and xb23 may each independently be 0, 1, or 2, $L_{301}$, xb1, and $R_{301}$ are the same as described in the specification, $L_{302}$ to $L_{304}$ may each independently be the same as described in connection with $L_{301}$, xb2 to xb4 may each independently be the same as described in connection with xb1, and $R_{302}$ to $R_{305}$ and $R_{311}$ to $R_{314}$ may be the same as described in connection with $R_{301}$.

In embodiments, the host may include an alkaline earth metal complex. In an embodiment, the host may be a Be complex (for example, Compound H55), a Mg complex, a Zn complex, or any combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di-9-carbazolyl-benzene (mCP), 1,3,5-tri(carbazol-9-yl)benzene (TCP), or any combination thereof, but embodiments of the disclosure are not limited thereto:

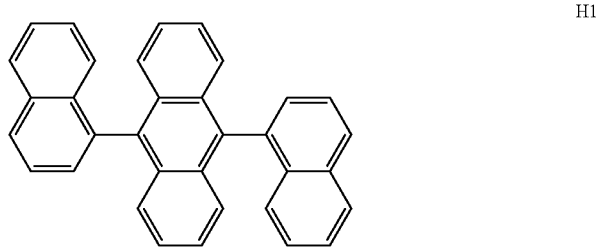

H1

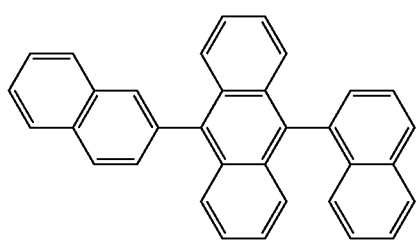

H2

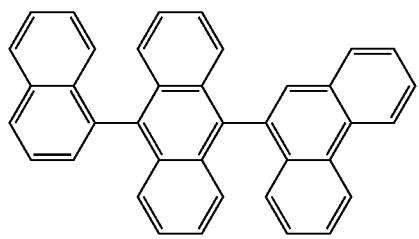

H3

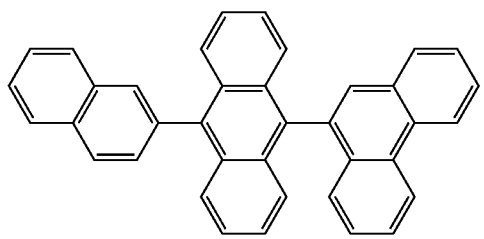

H4

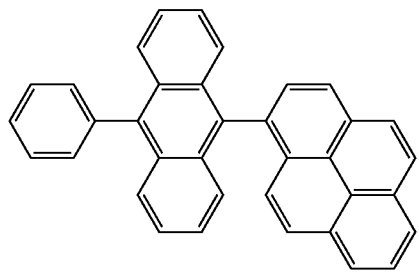

H5

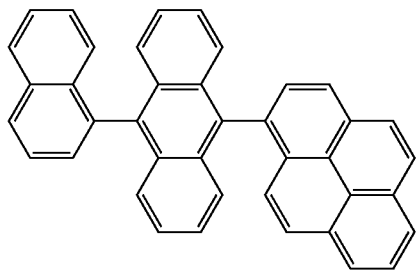

H6

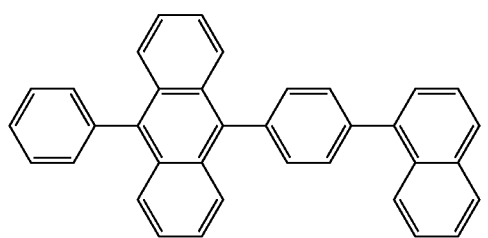

H7

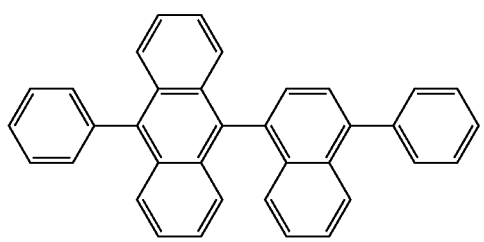

H8

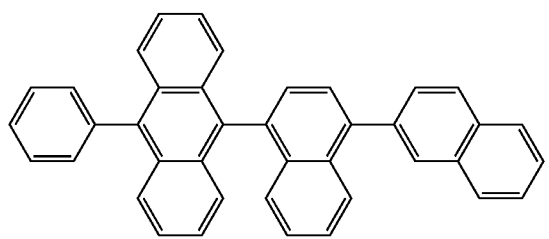

H9

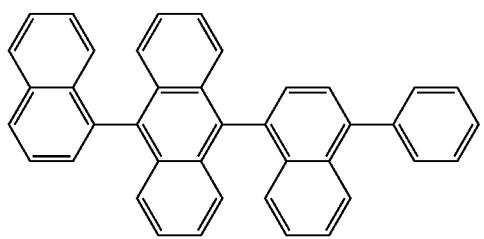

H10

-continued
H11
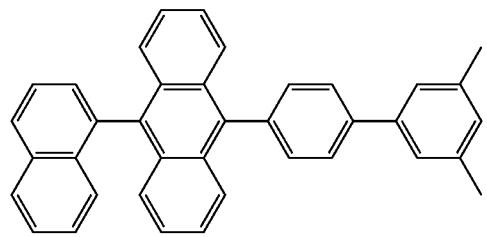
H12
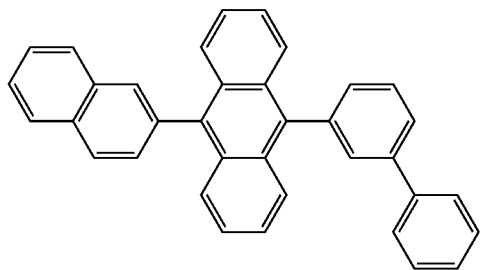
H13
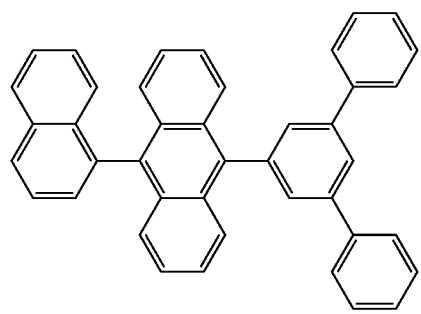
H14
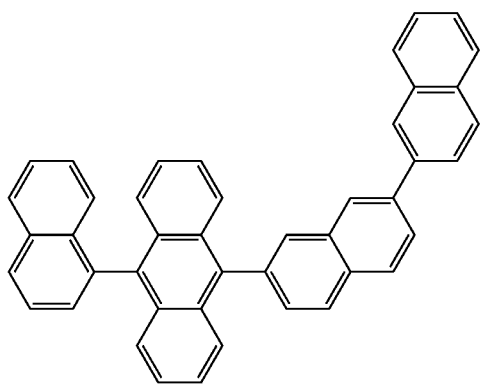
H15
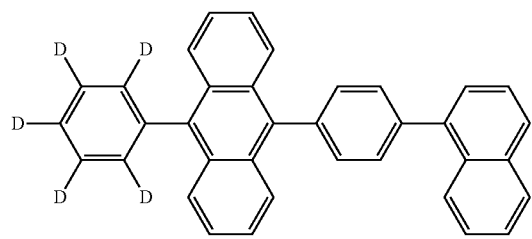
H16
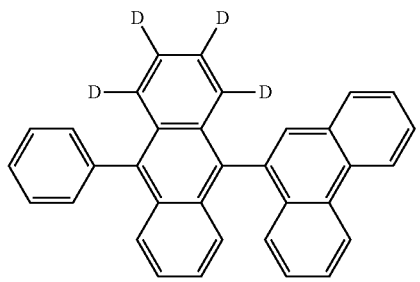
H17
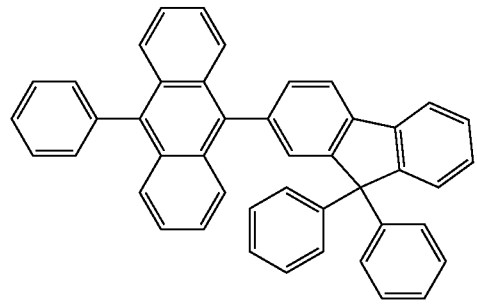
H18
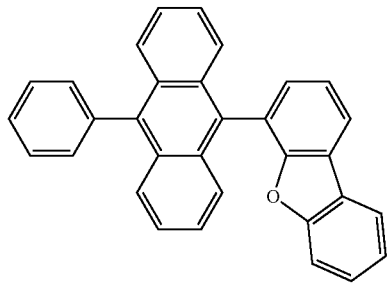
H19
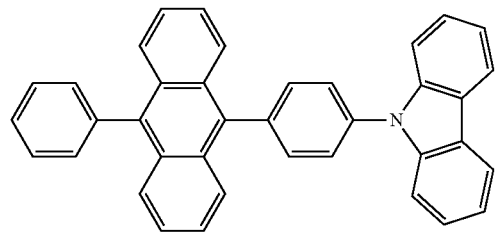
H20
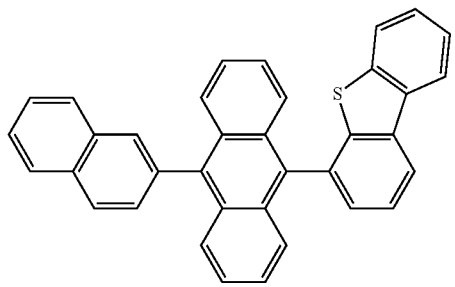

-continued
H21
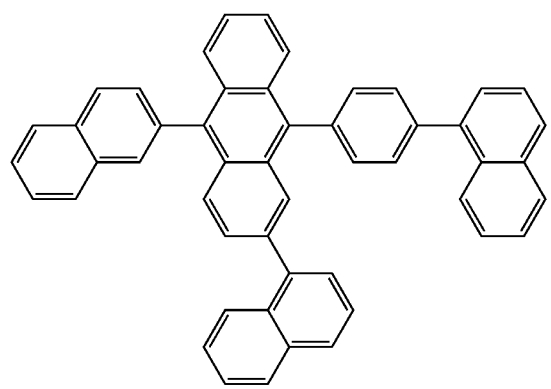
H22
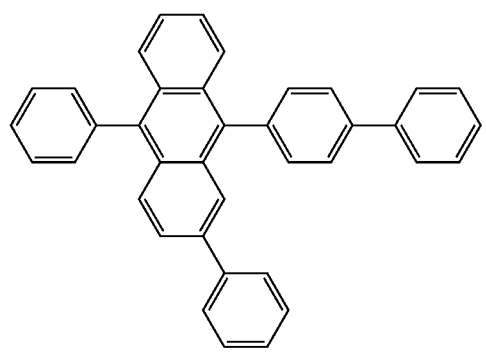
H23
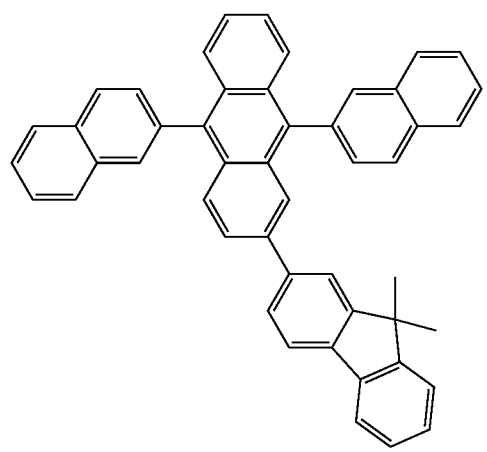
H24
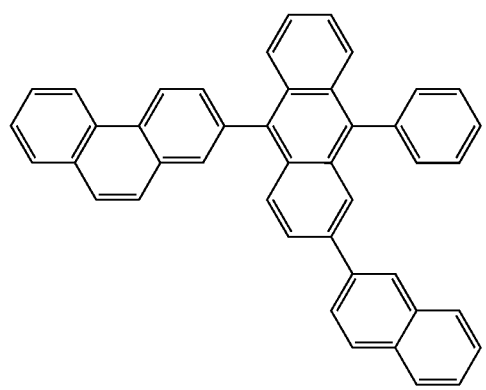
H25
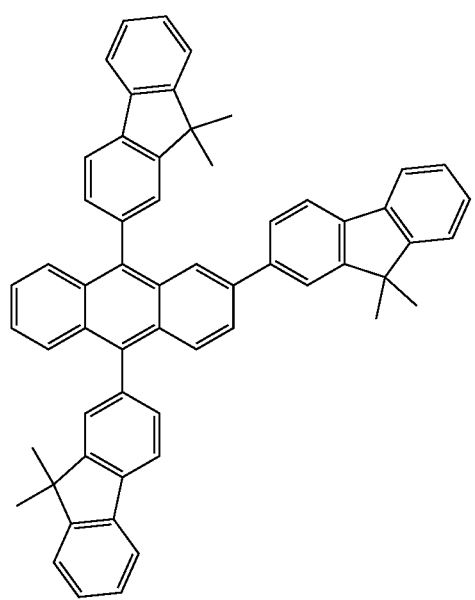
H26
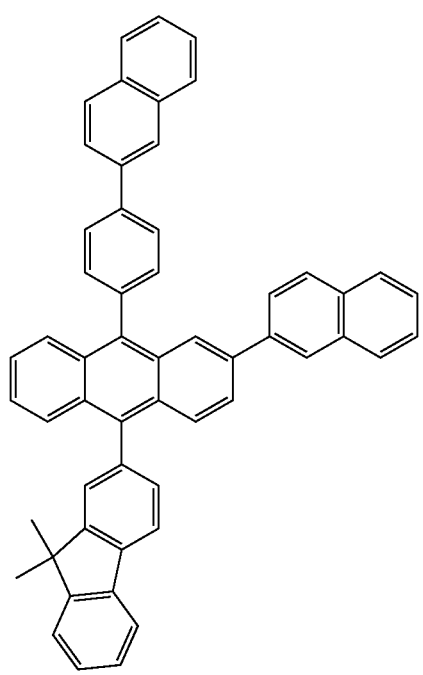

-continued
H27
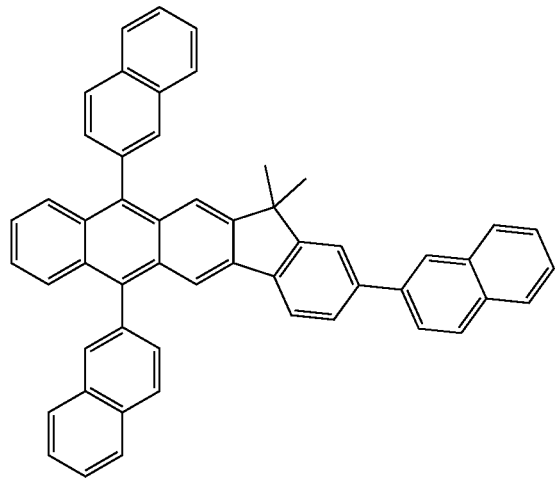
H28
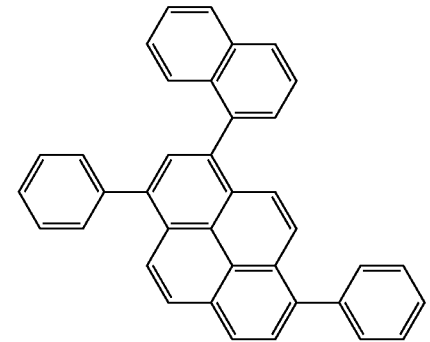
H29
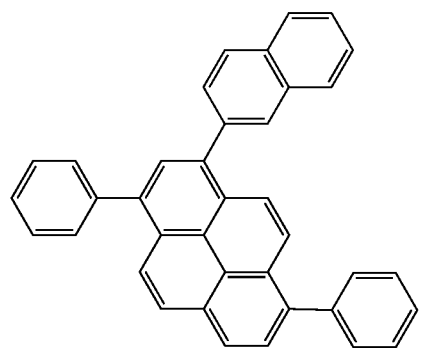
H30
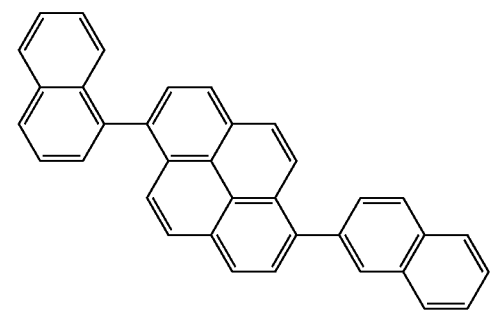
H31
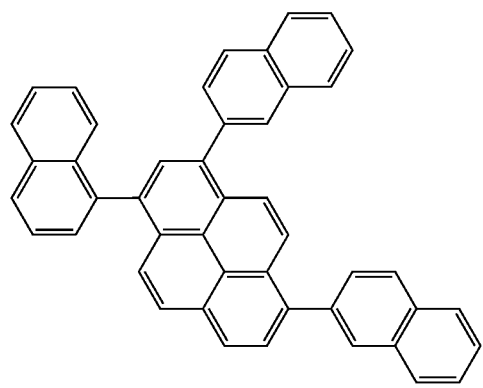
H32
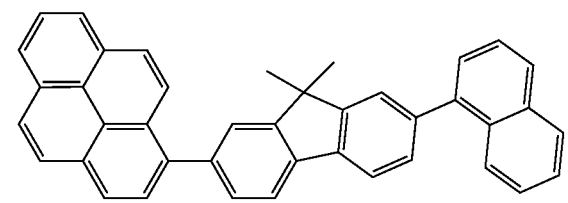
H33
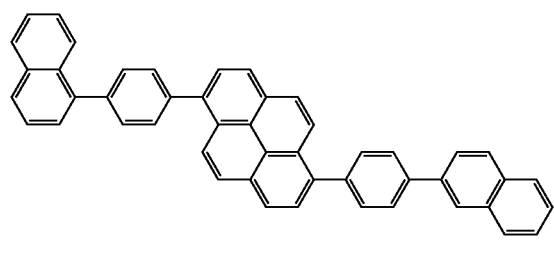
H34
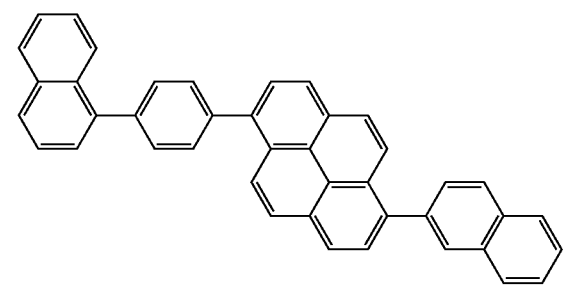

-continued
H35
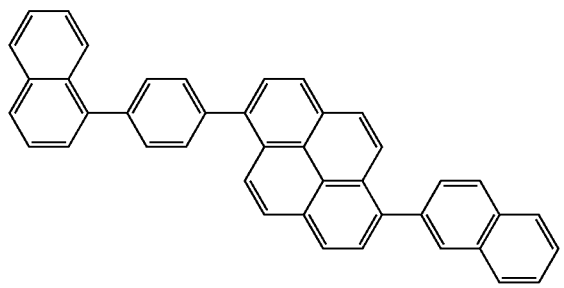
H36
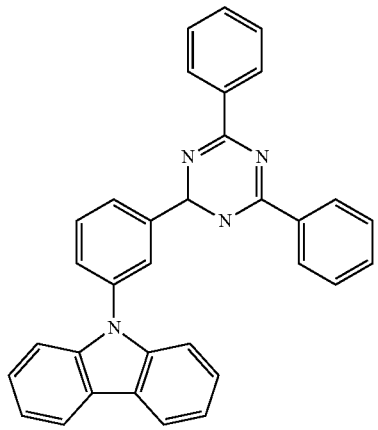
H37
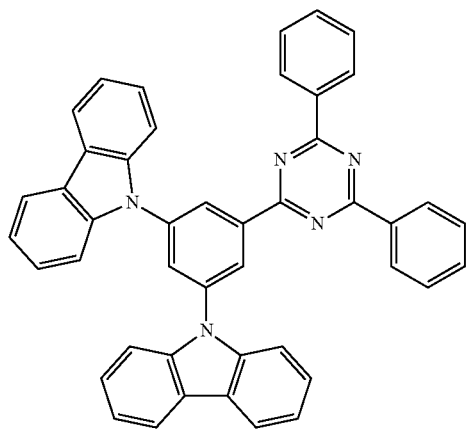
H38
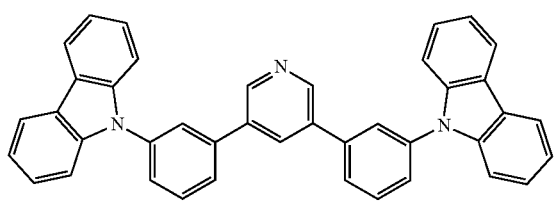
H39
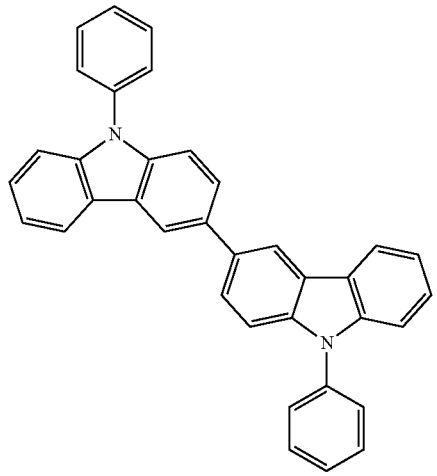
H40
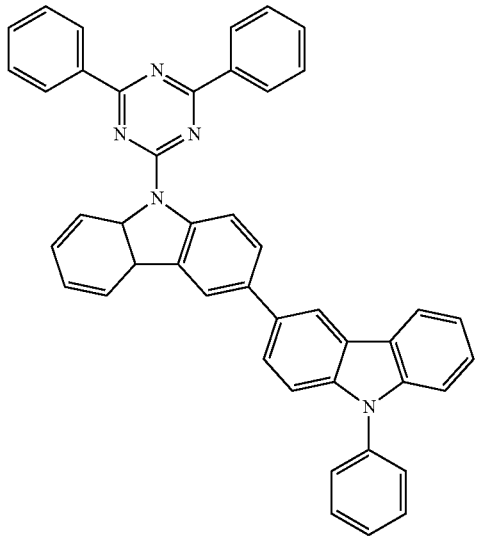

-continued
H41
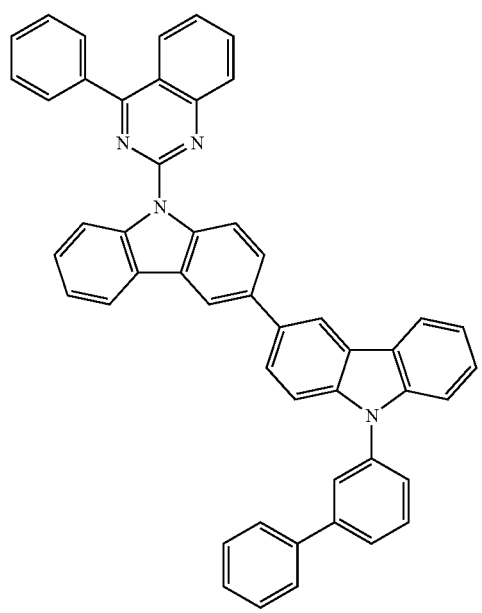
H42
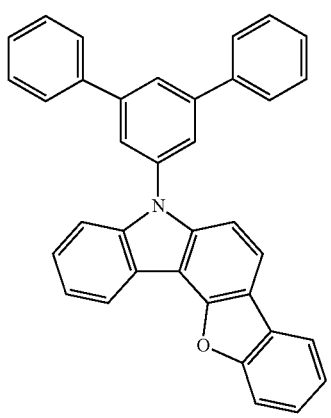
H43
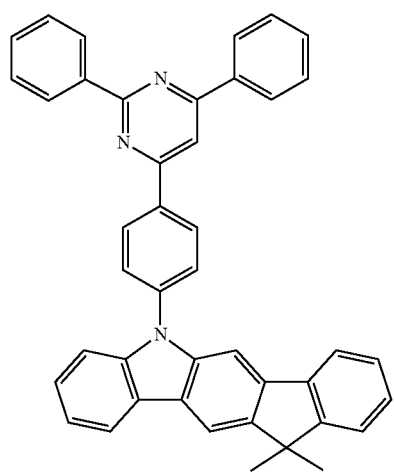
H44
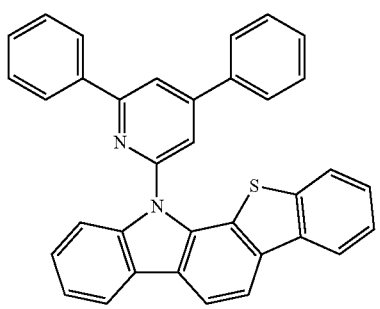
H45
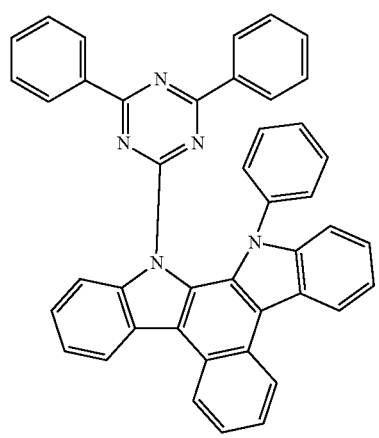
H46
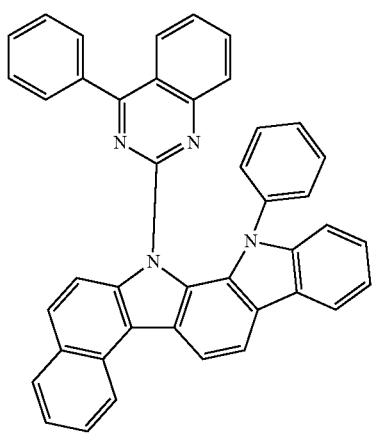

-continued
H47
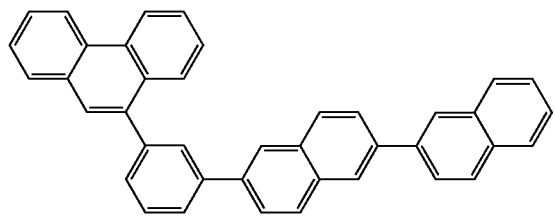
H48
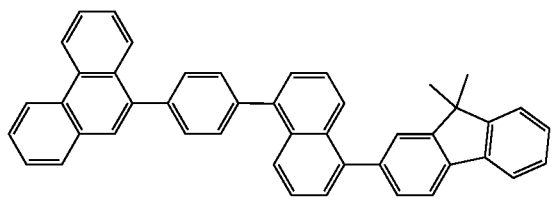
H49
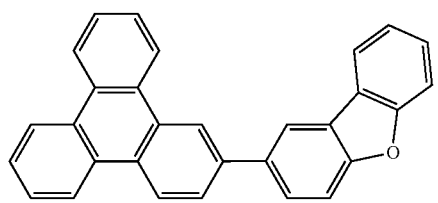
H50
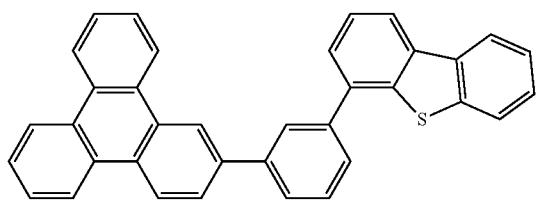
H51
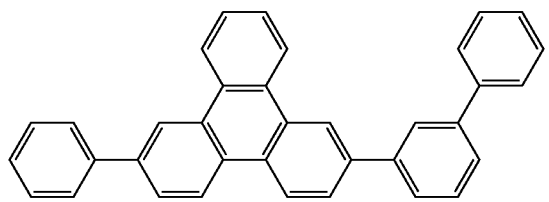
H52
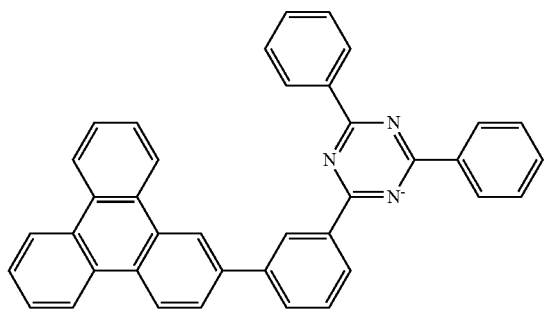
H53
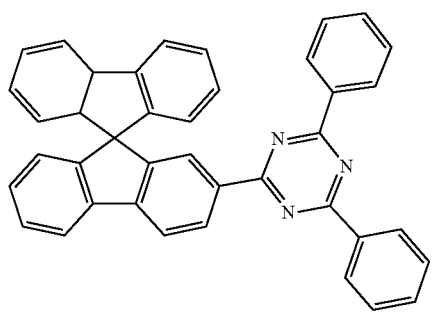
H54
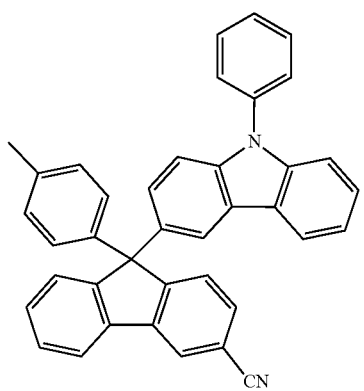
H55
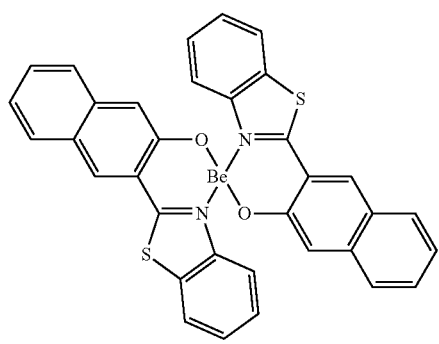
H56
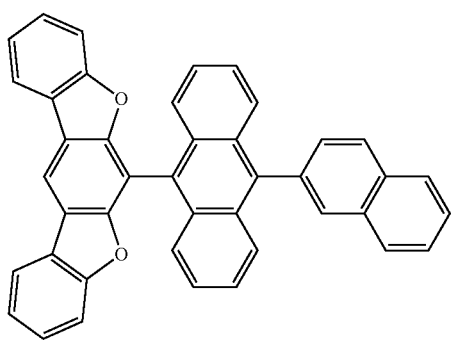

-continued
H57
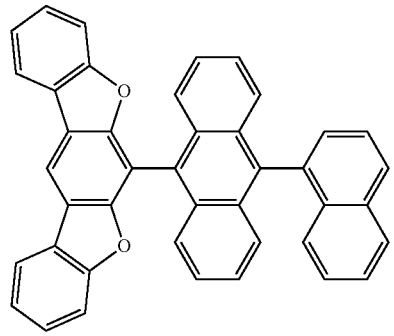
H58
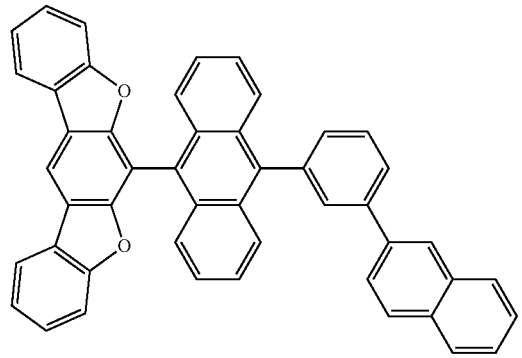
H59
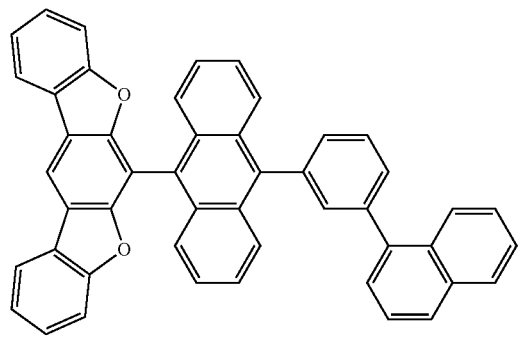
H60
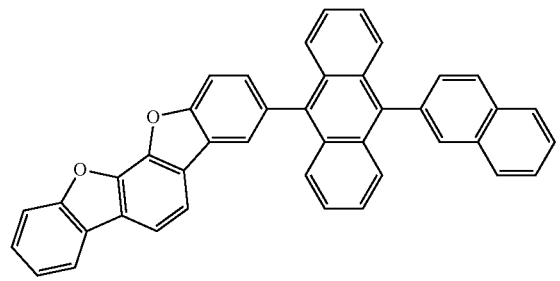
H61
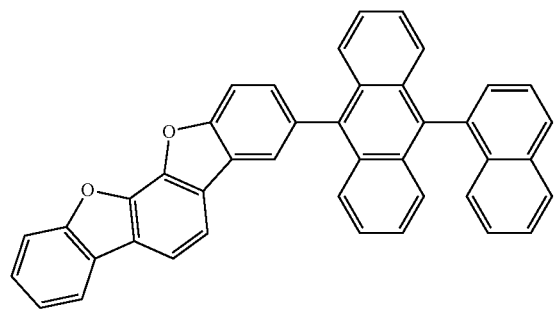
H62
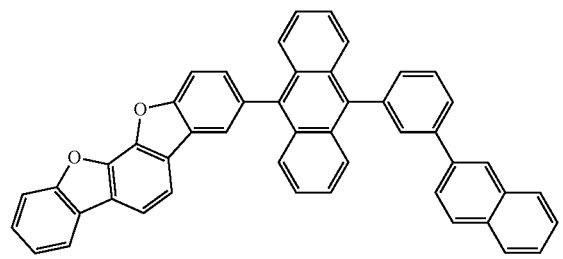
H63
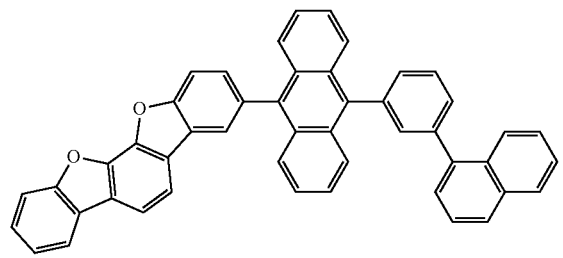
H64
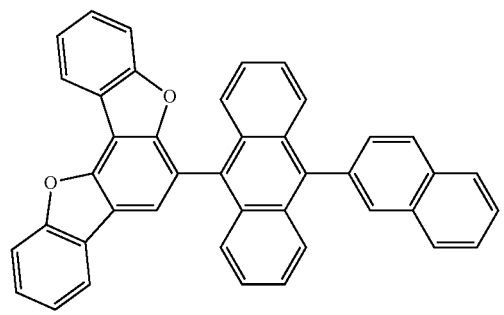

-continued
H65
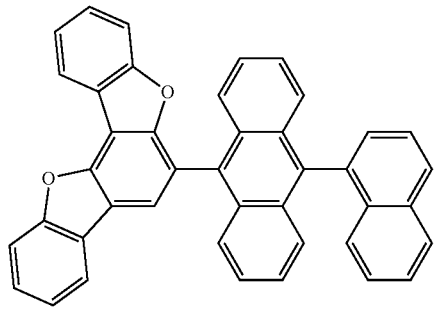
H66
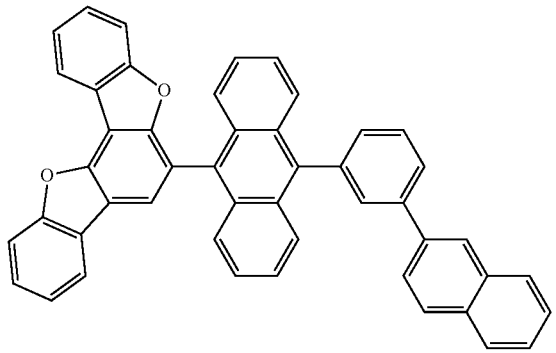
H67
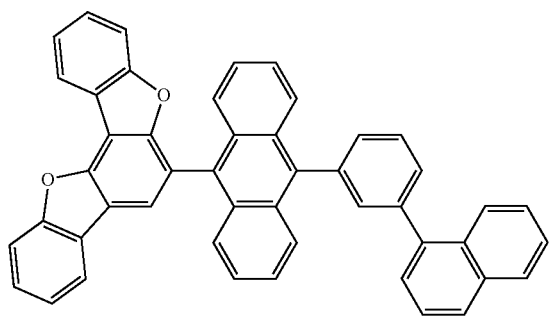
H68
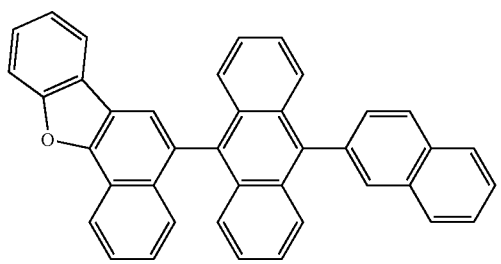
H69
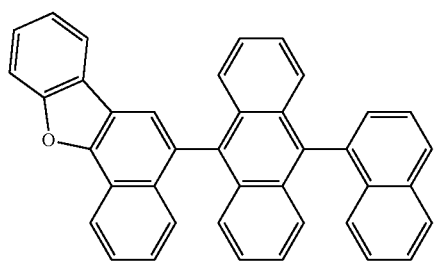
H70
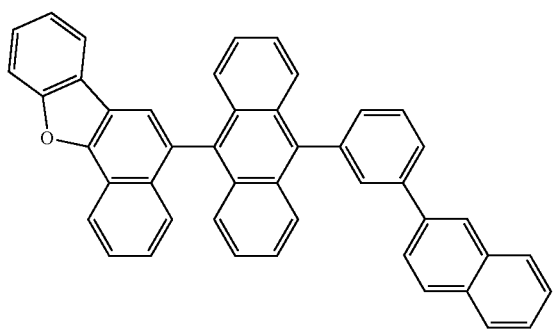
H71
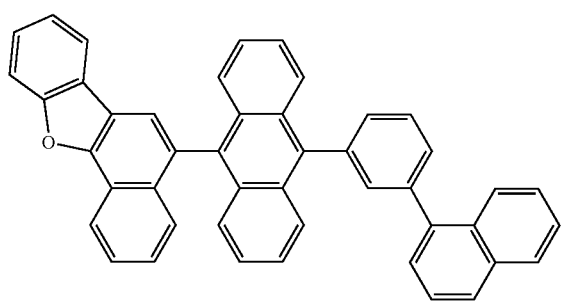
H72
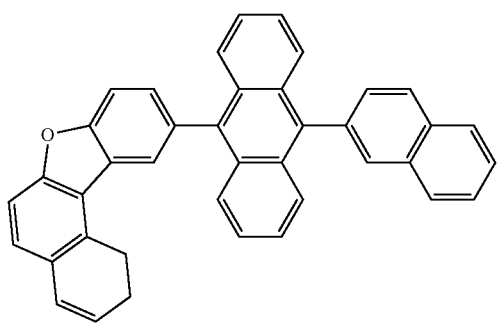

-continued
H73
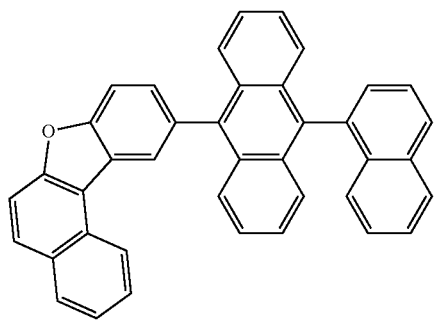
H74
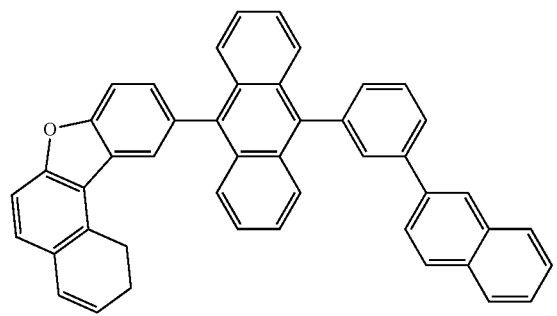
H75
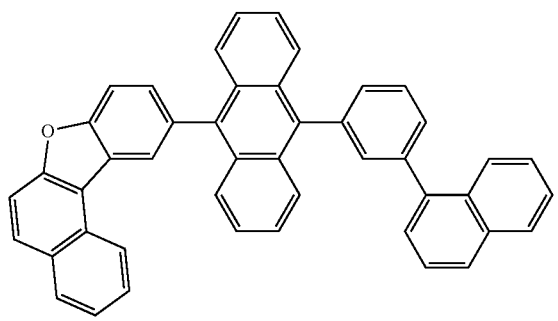
H76
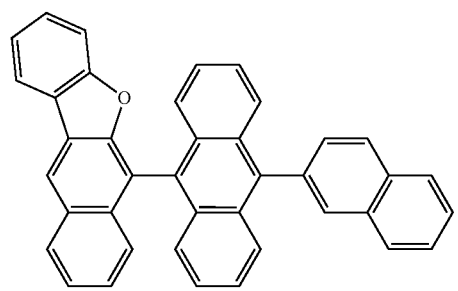
H77
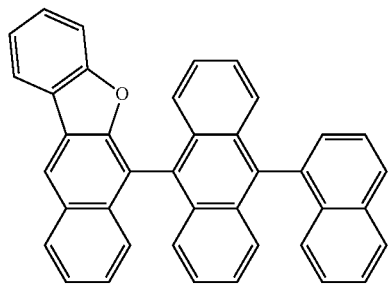
H78
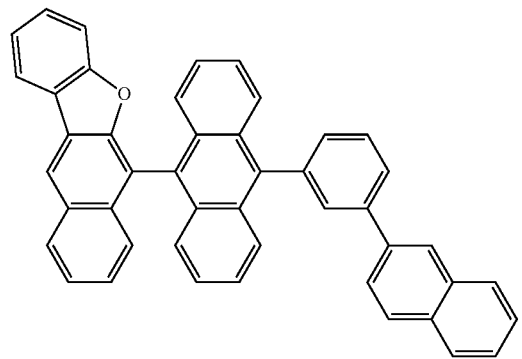
H79
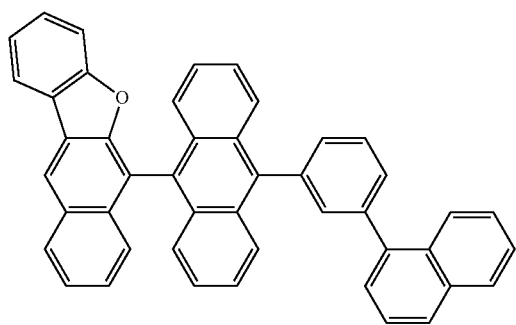
H80
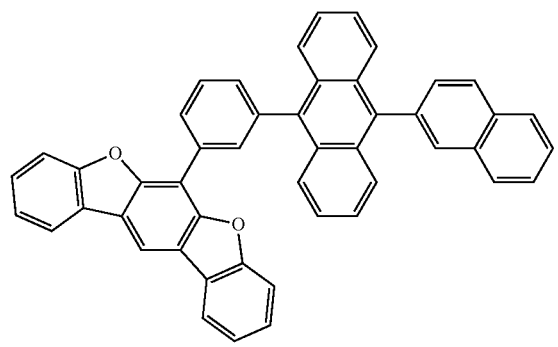

-continued
H81
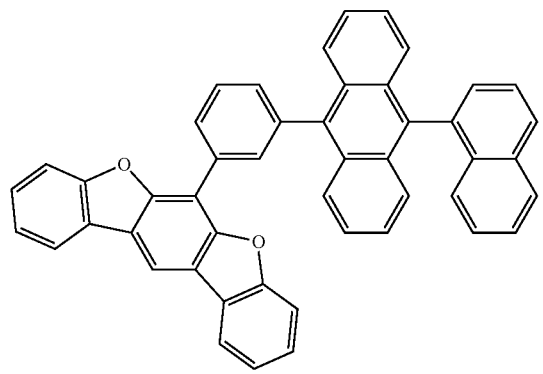
H82
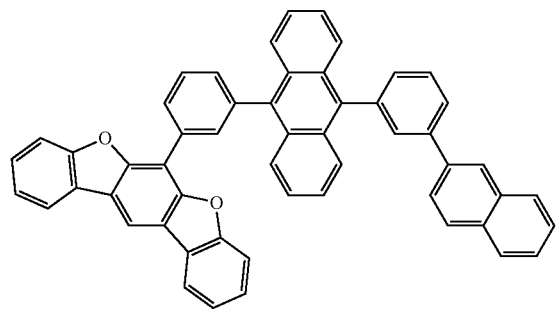
H83
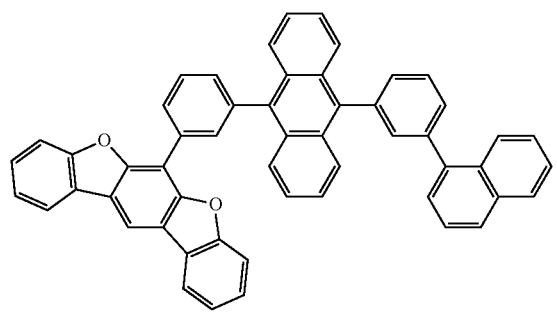
H84
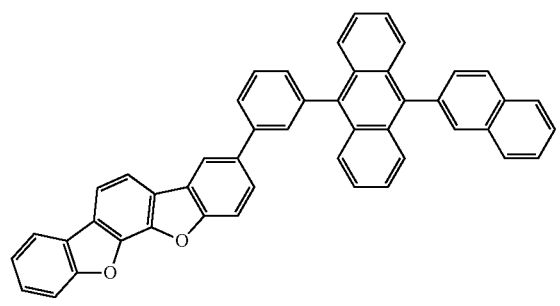
H85
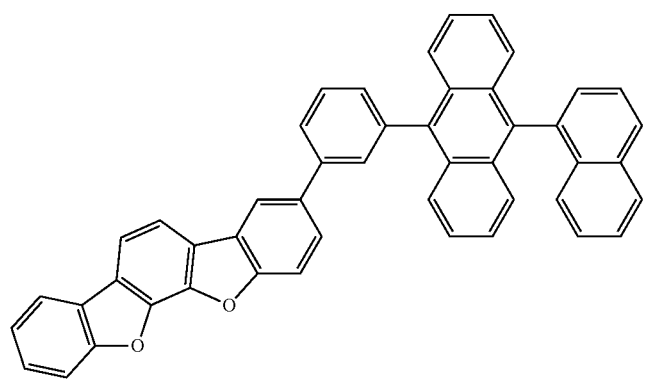
H86
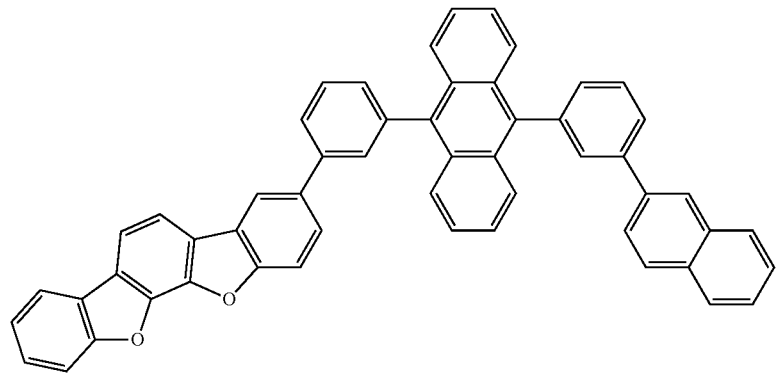

H87
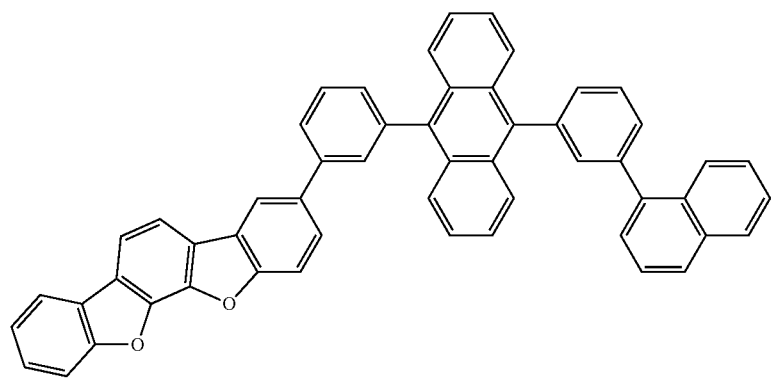
H88
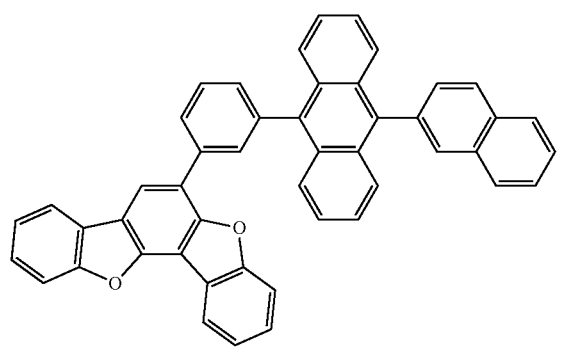
H89
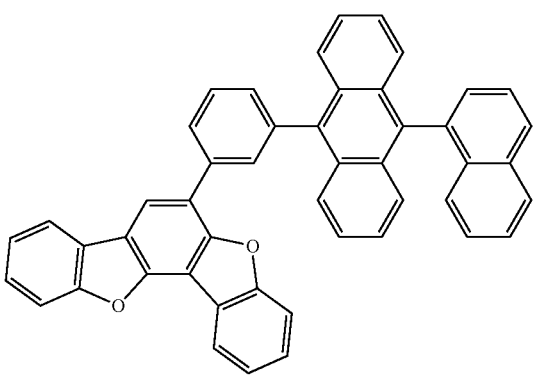
H90
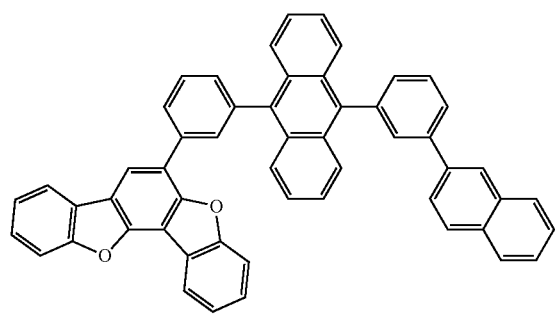
H91
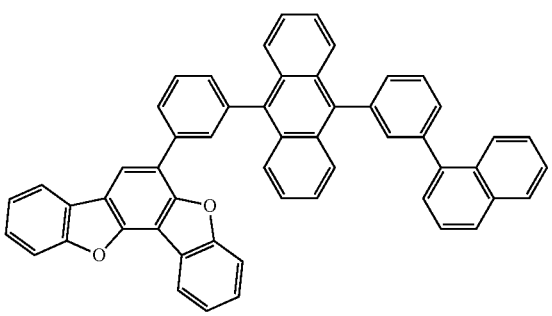
H92
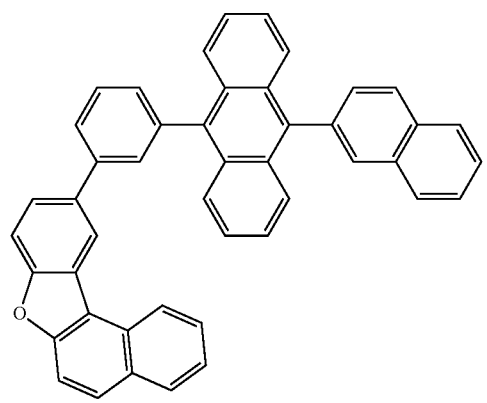
H93
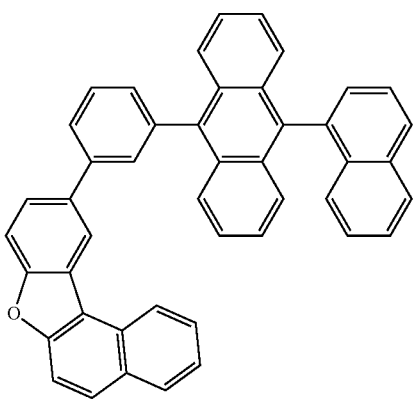

-continued
H94
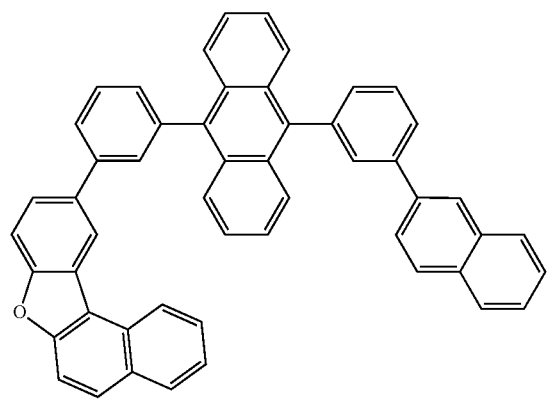
H95
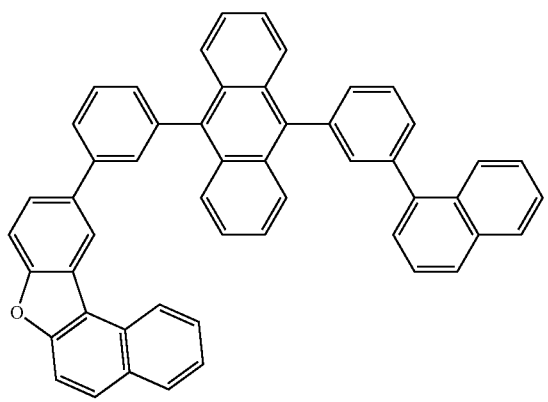
H96
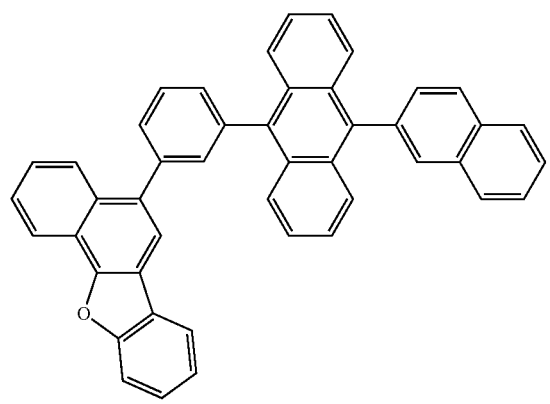
H97
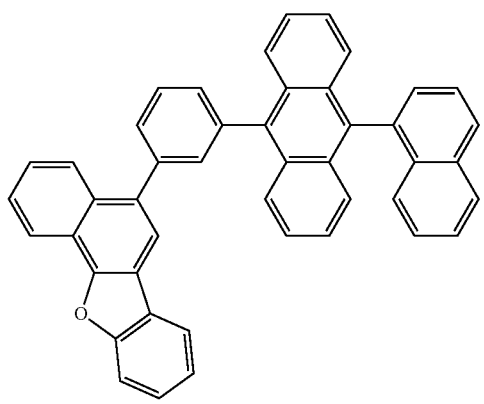
H98
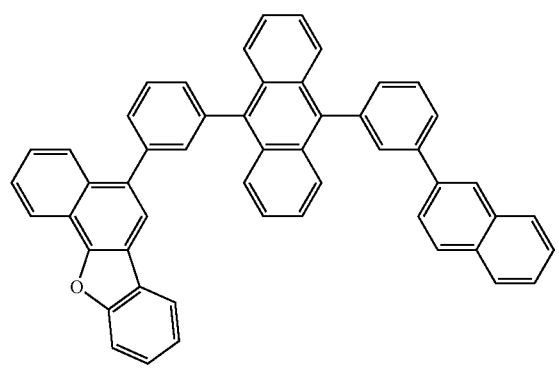
H99
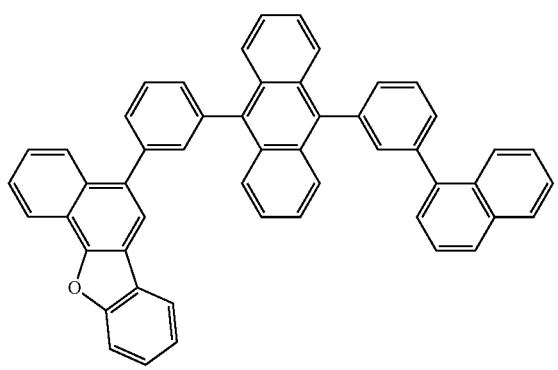
H100
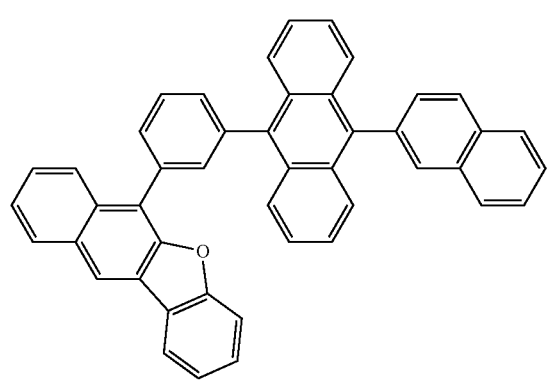
H101
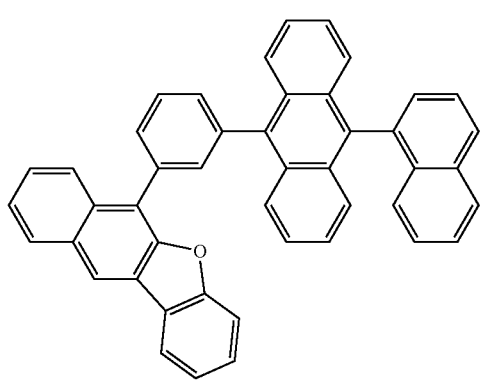

-continued
H102
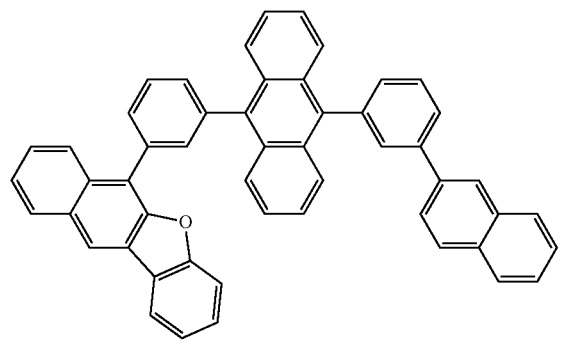
H103
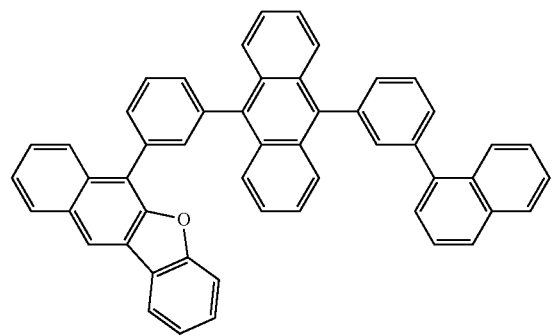
H104
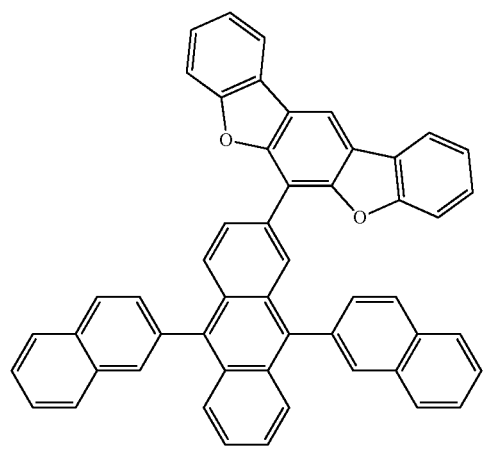
H105
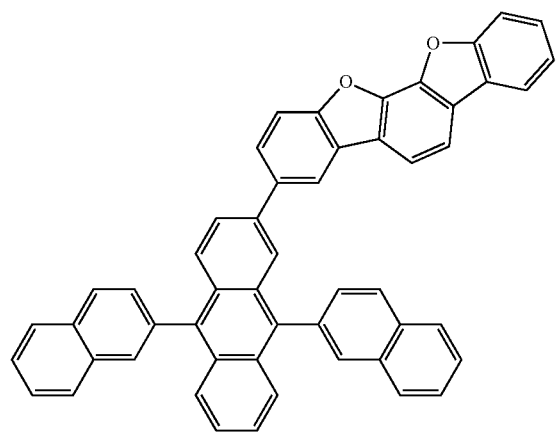
H106
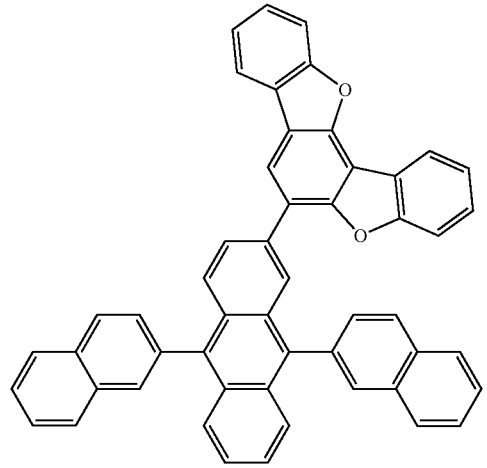
H107
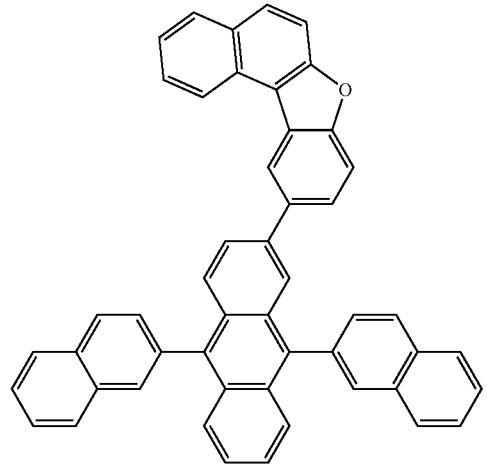

-continued
H108
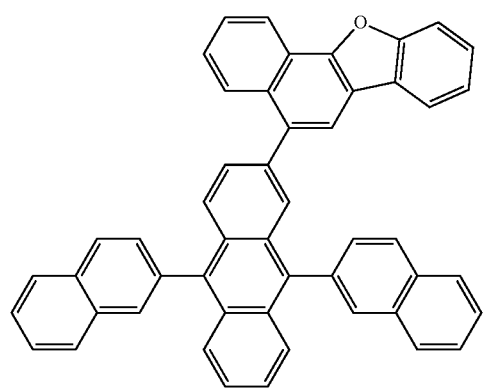
H109
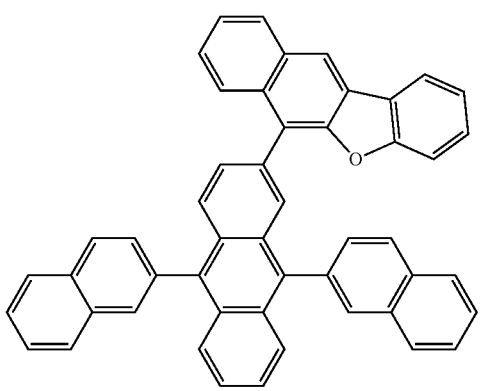
H110
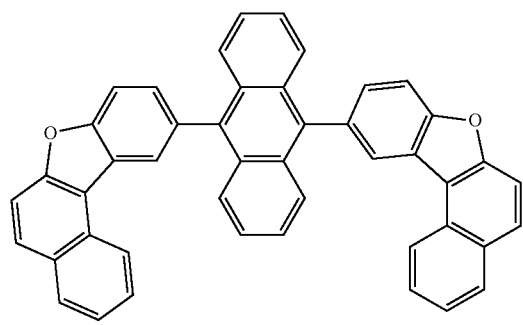
H111
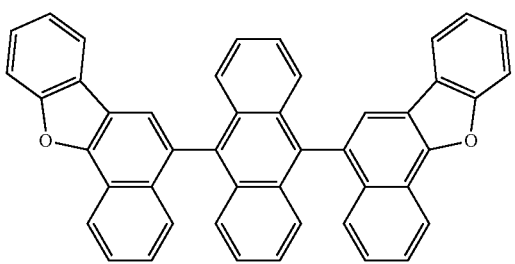
H112
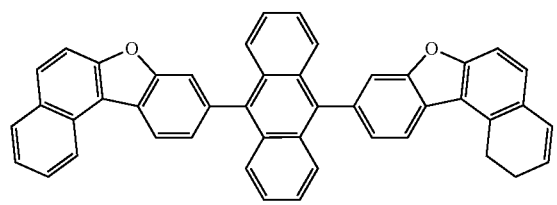
H113
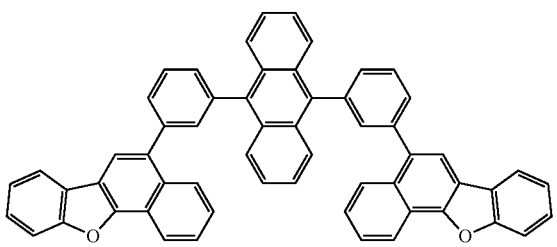
H114
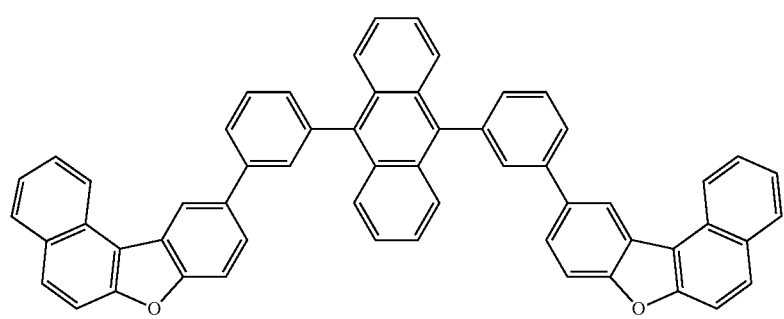

-continued
H115
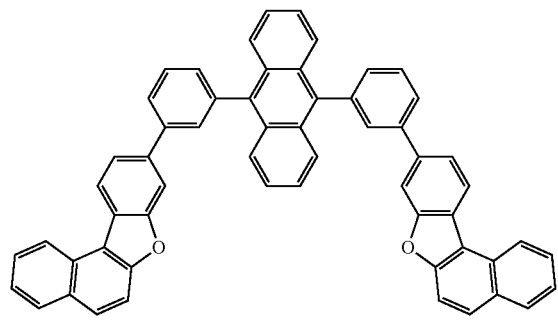
H116
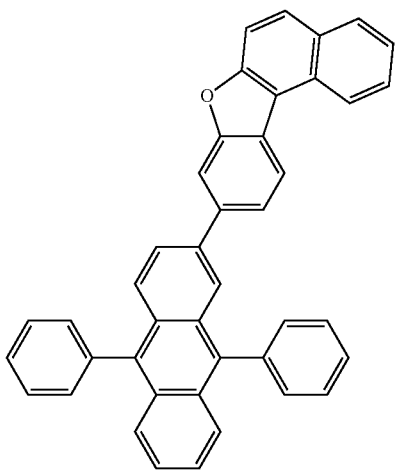
H117
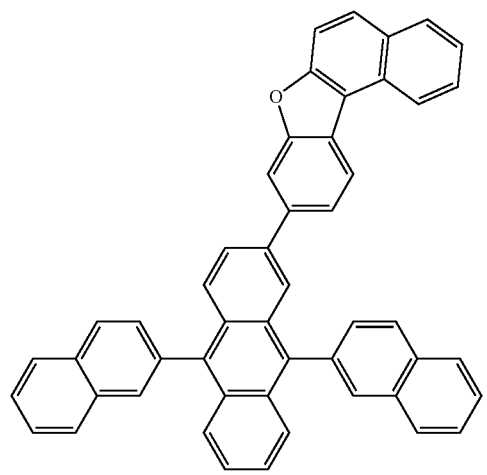
H118
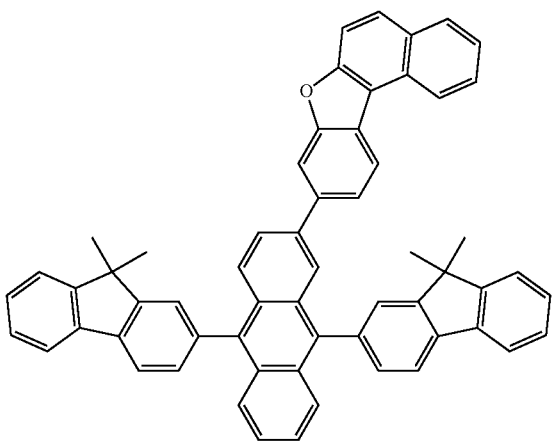
H119
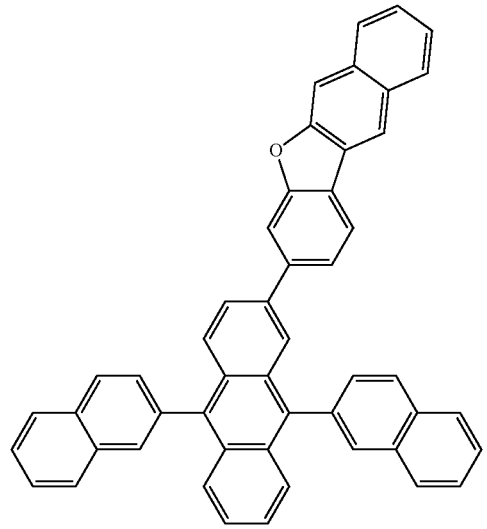
H120
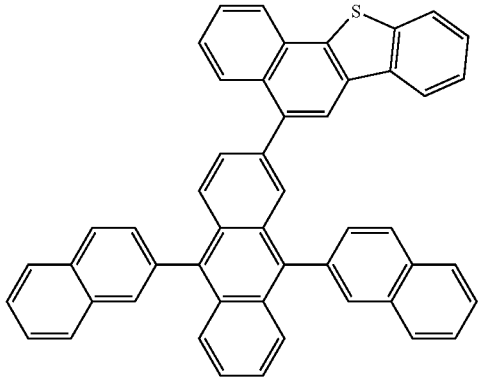

H121

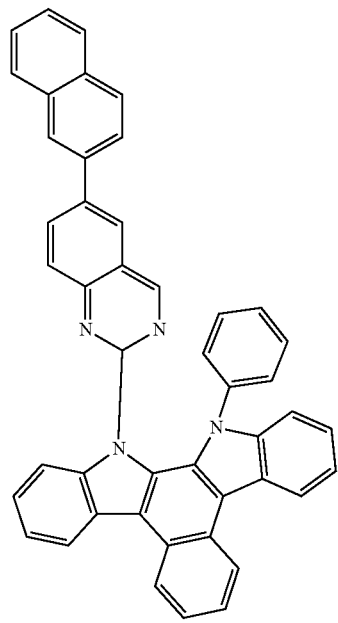

H122

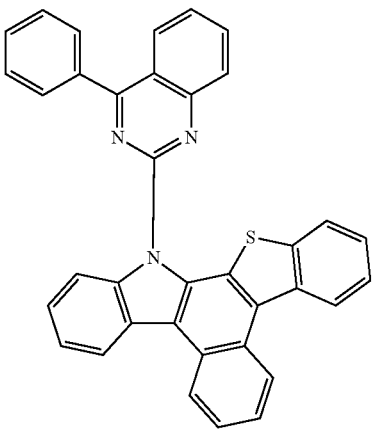

H123

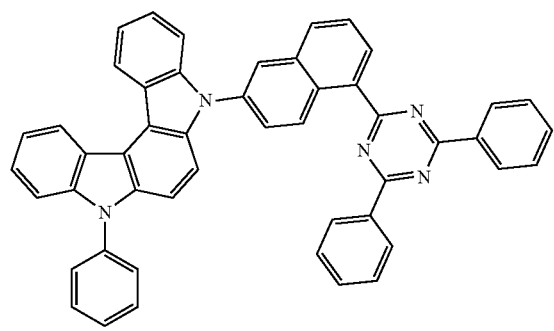

H124

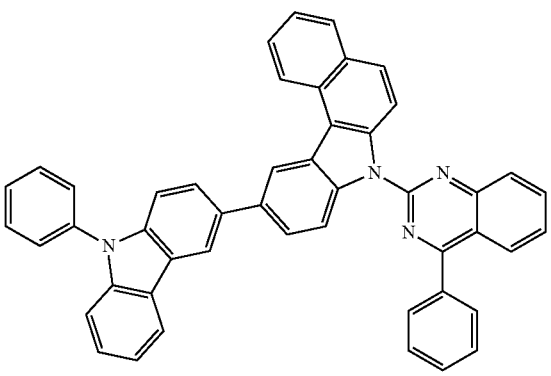

[Phosphorescent Dopant]

The phosphorescent dopant may include at least one transition metal as a central metal.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In embodiments, the phosphorescent dopant may include an organometallic compound represented by Formula 401:

[Formula 402]

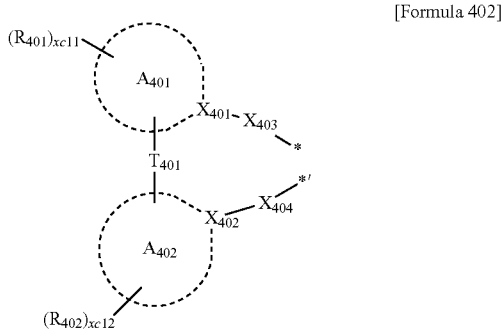

In Formulae 401 and 402,

M may be transition metal (for example, iridium (Ir), platinum (Pt), palladium (Pd), osmium (Os), titanium (Ti), gold (Au)hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more of $L_{401}$(s) may be identical to or different from each other, $L_{402}$ may be an organic ligand, and xc2 may be 0, 1, 2, 3, or 4, wherein, when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group or a $C_1$-$C_{60}$ heterocyclic group, $T_{401}$ may be a single bond, —O—, —S—, —C(=O)—, —N($Q_{411}$)-, —C($Q_{411}$)($Q_{412}$)-, —C($Q_{411}$)=C($Q_{412}$)-, —C($Q_{411}$)=, or =C($Q_{411}$)=, $X_{403}$ and $X_{404}$ may each independently be a chemical bond (for example, a covalent bond or a coordinate bond), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ may be the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_4O_2$), $Q_{401}$ to $Q_{403}$ may be the same as described in connection with $Q_1$, xc11 and xc12 may each independently be an integer from 0 to 10, and

* and *' in Formula 402 each indicate a binding site to M in Formula 401.

In embodiments, in Formula 402, i) $X_{401}$ may be nitrogen, and $X_{402}$ may be carbon, or ii) each of $X_{401}$ and $X_{402}$ may be nitrogen.

In embodiments, when xc1 in Formula 402 is 2 or more, two ring $A_{401}$(s) in two or more $L_{401}$(s) may optionally be linked to each other via $T_{402}$, which is a linking group, or two ring $A_{402}$(s) in two or more $L_{401}$(s) may optionally be linked to each other via $T_{403}$, which is a linking group (see Compounds PD1 to PD4 and PD7). $T_{402}$ and $T_{403}$ may be the same as described in connection with $T_{401}$.

$L_{402}$ in Formula 401 may be an organic ligand. In embodiments, $L_{402}$ may be a halogen group, a diketone group (for example, an acetylacetonate group), a carboxylic acid group (for example, a picolinate group), —C(=O), an isonitrile group, a —CN group, a phosphorus group (for example, a phosphine group or a phosphite group), or any combination thereof.

The phosphorescent dopant may include, for example, one of Compounds PD1 to PD25 or any combination thereof:

PD1

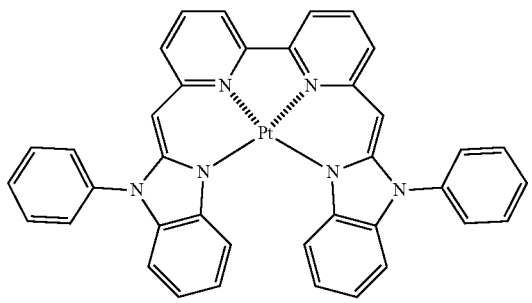

PD2

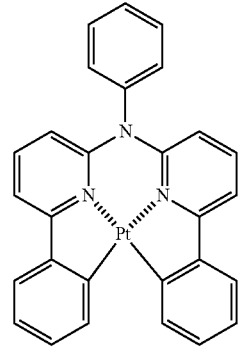

PD3

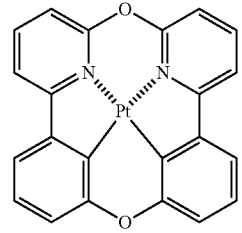

PD4

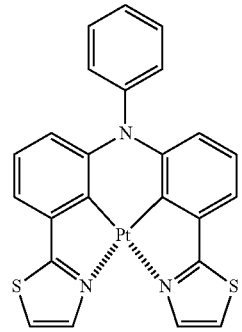

-continued
PD5
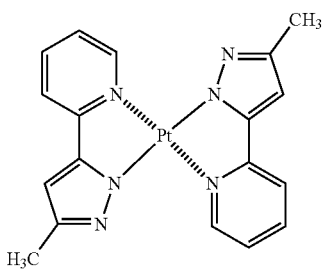
PD6
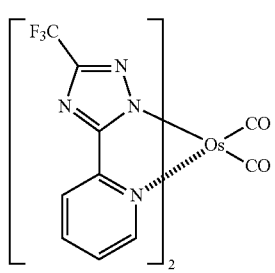
PD7
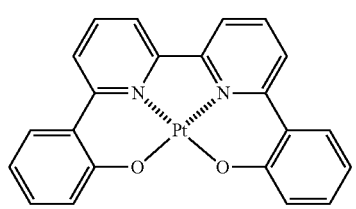
PD8
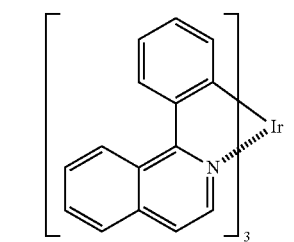
PD9
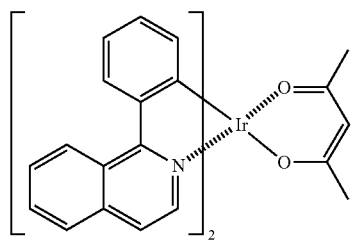
PD10
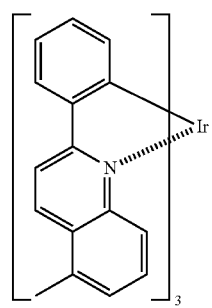
PD11
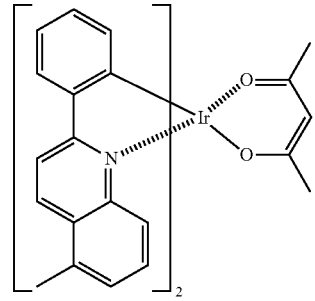
PD12
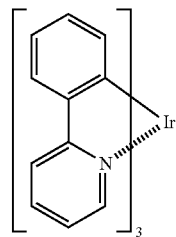
PD13
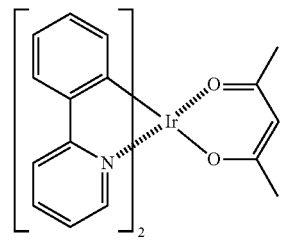
PD14
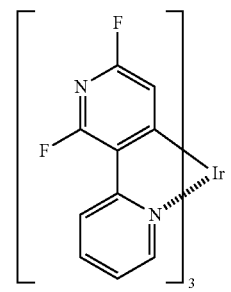
PD15

PD16 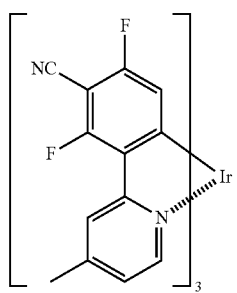
PD17 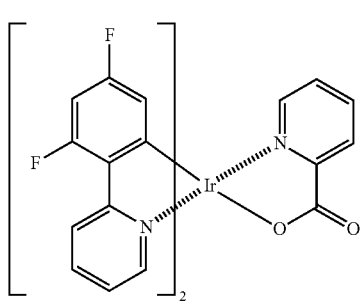
PD18 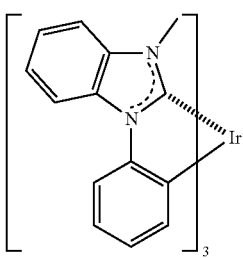
PD19 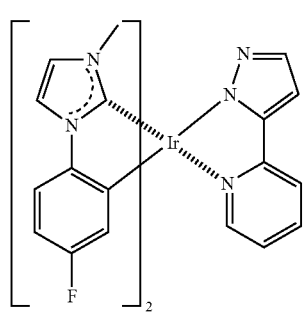
PD20 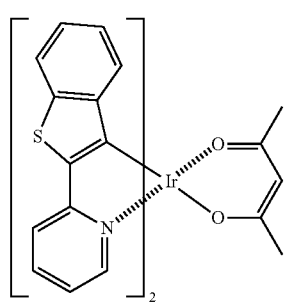
PD21 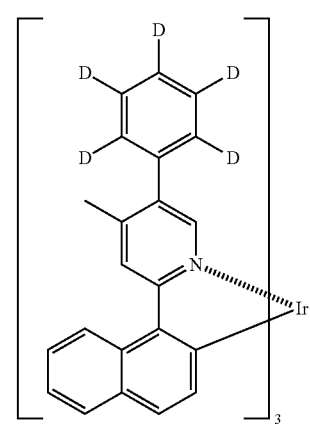
PD22 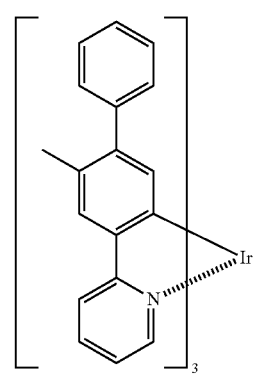
PD23 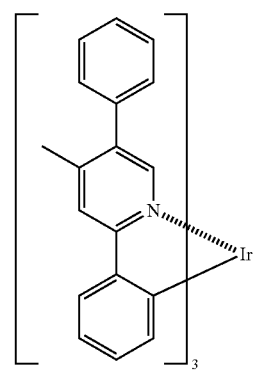
PD24

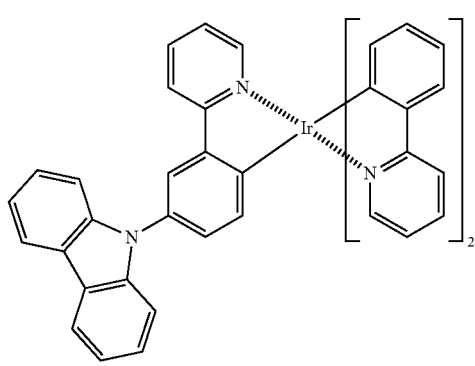

PD25

[Fluorescent Dopant]

The fluorescent dopant may include an amine group-containing compound, a styryl group-containing compound, or any combination thereof.

In embodiments, the fluorescent dopant may include a compound represented by Formula 501:

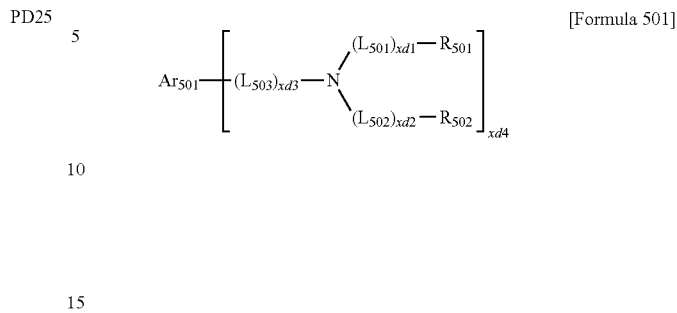

[Formula 501]

In Formula 501, $Ar_{501}$, $L_{501}$ to $L_{503}$, $R_{501}$, and $R_{502}$ may each independently be a $C_3$-$C_{30}$ carbocyclic group unsubstituted or substituted with at least one $R_{10a}$ or a $C_1$-$C_{60}$ heterocyclic group unsubstituted or substituted with at least one $R_{10a}$, xd1 to xd3 may each independently be 0, 1, 2, or 3, and xd4 may be 1, 2, 3, 4, 5, or 6.

In embodiments, $Ar_{501}$ in Formula 501 may be a condensed cyclic group (for example, an anthracene group, a chrysene group, or a pyrene group) in which three or more monocyclic groups are condensed with each other.

In embodiments, xd4 in Formula 501 may be 2.

In an embodiment, the fluorescent dopant may include one of Compounds FD1 to FD36, DPVBi, DPAVBi, or any combination thereof:

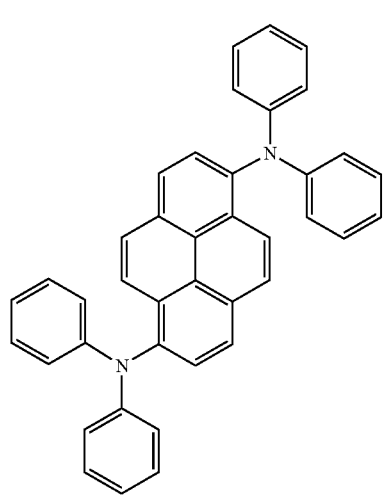

FD1

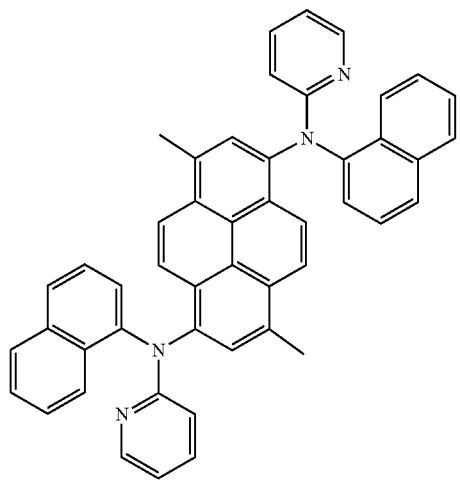

FD2

-continued
FD3
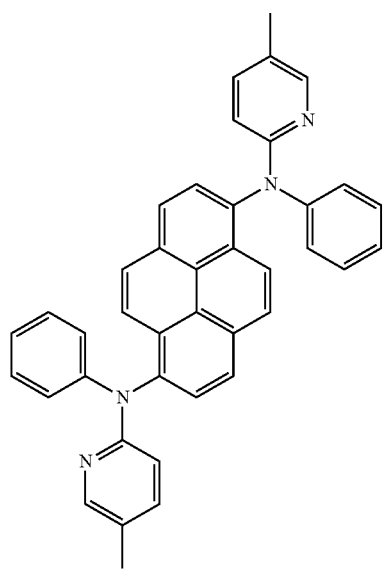
FD4
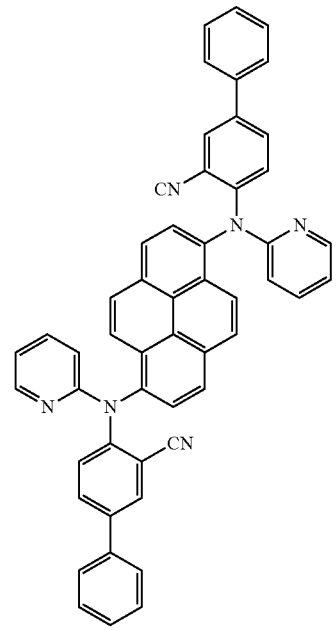
FD5
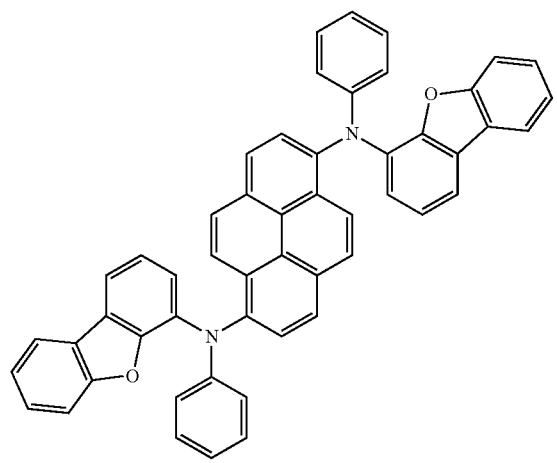
FD6
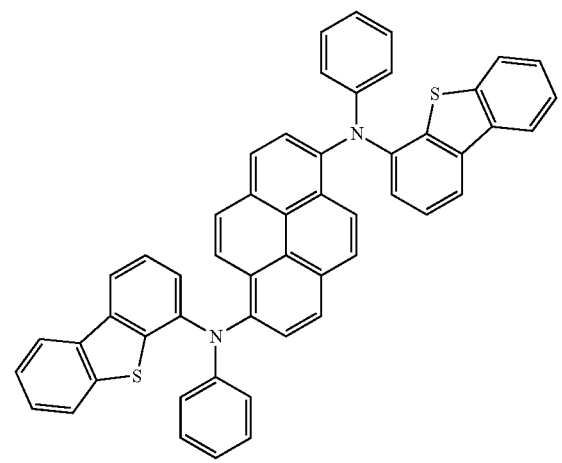
FD7
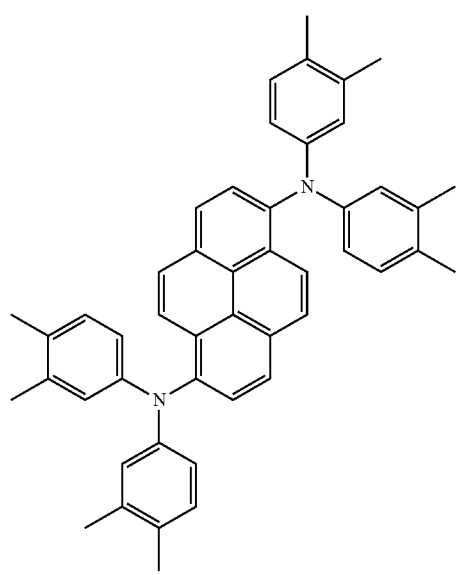
FD8
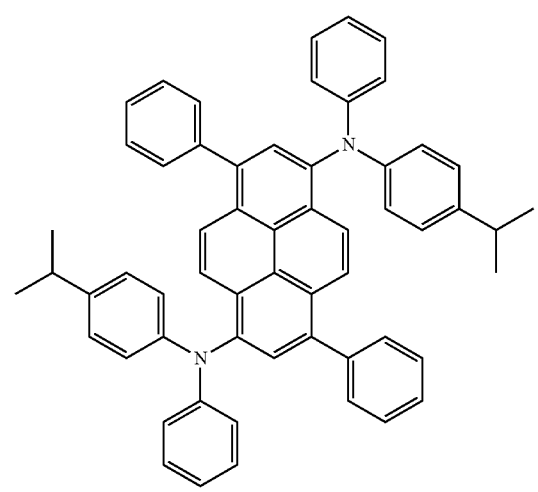

-continued
FD9
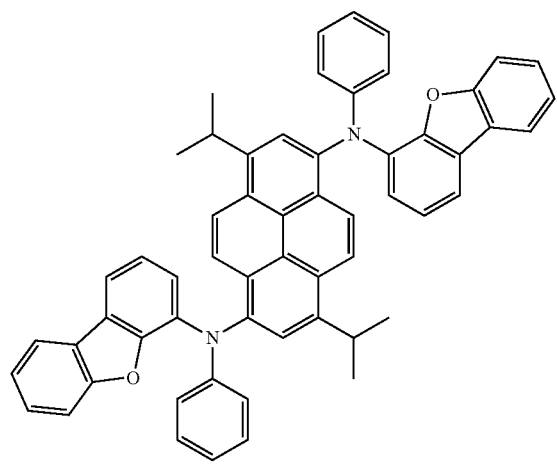
FD10
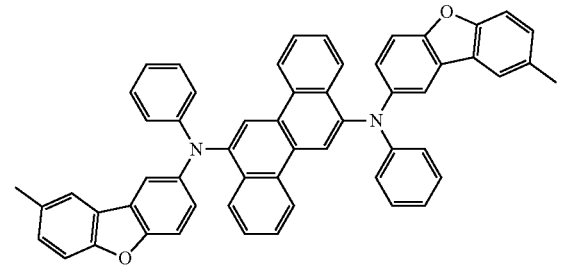
FD11
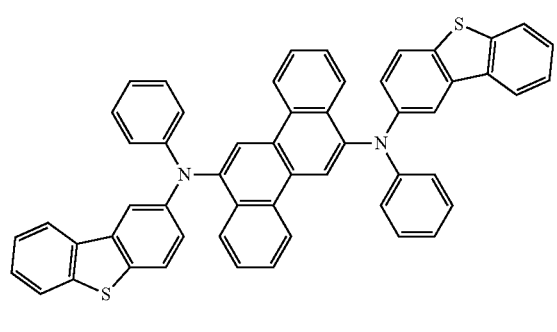
FD12
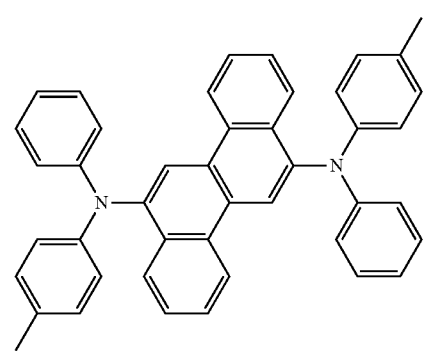
FD13
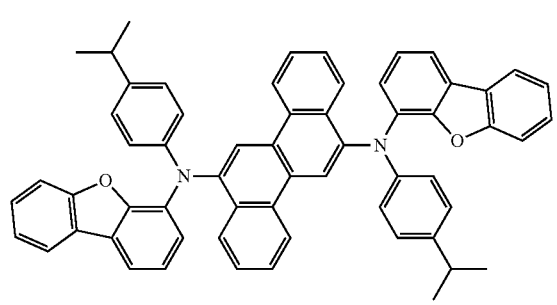
FD14
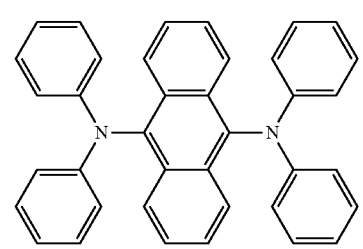
FD15
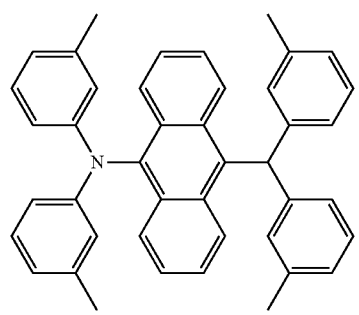
FD16
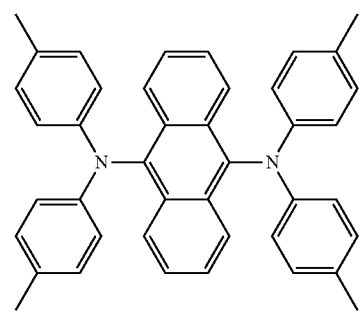

-continued
FD17
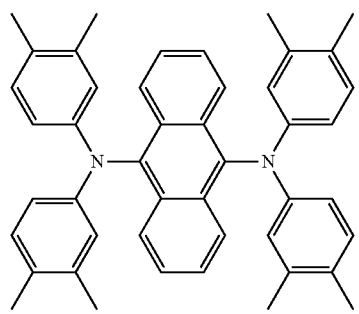
FD18
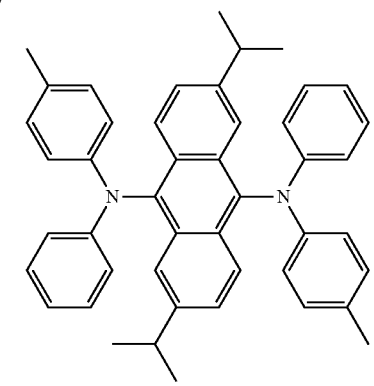
FD19
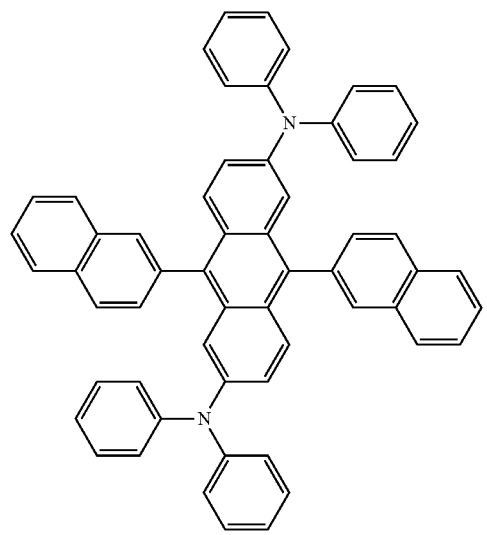
FD20
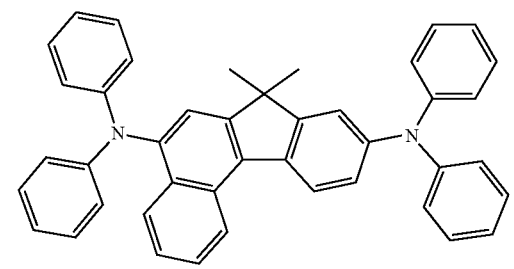
FD21
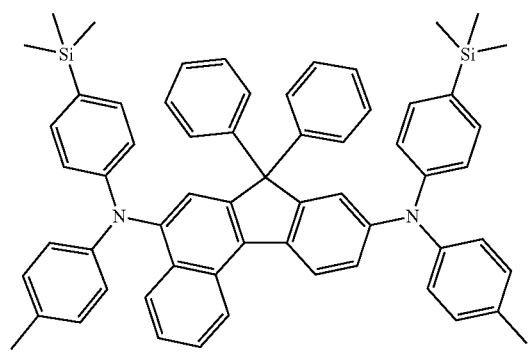
FD22
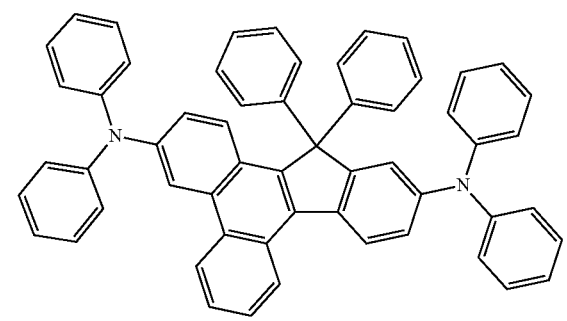

-continued
FD23
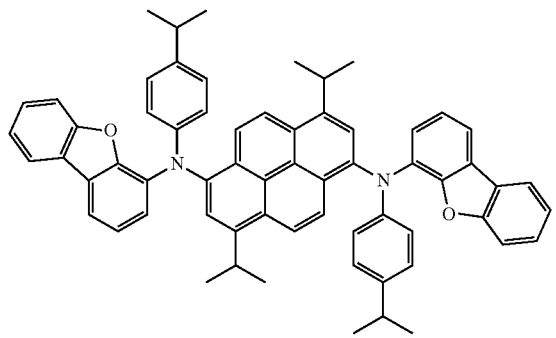
FD24
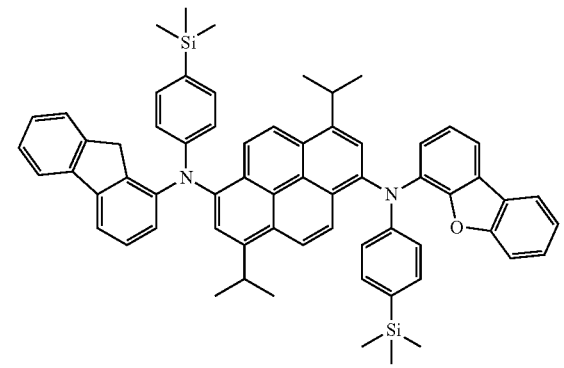
FD25
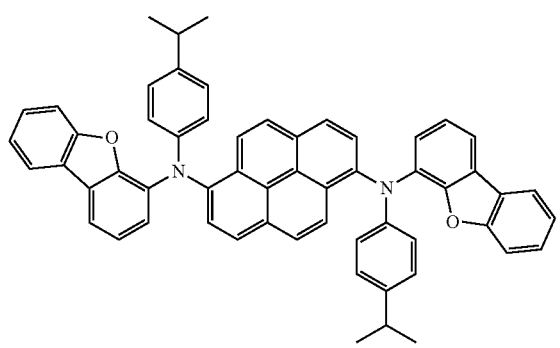
FD26
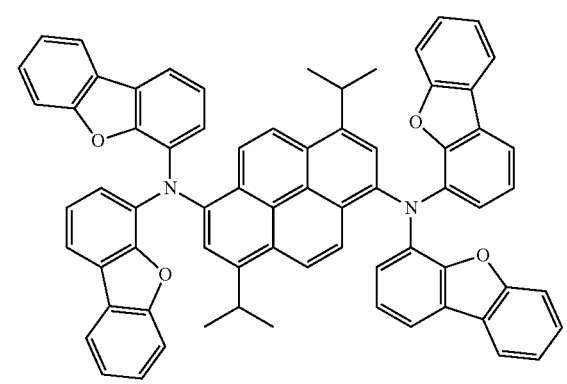
FD27
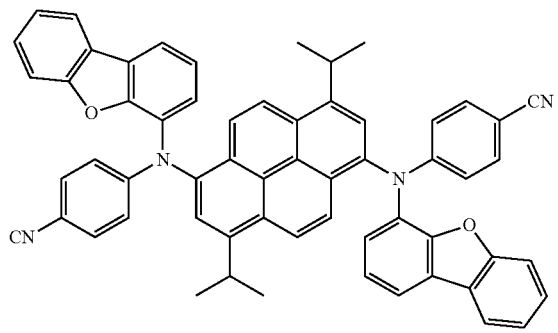
FD28
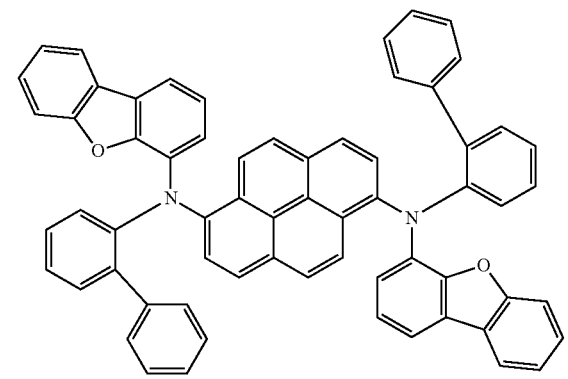
FD29
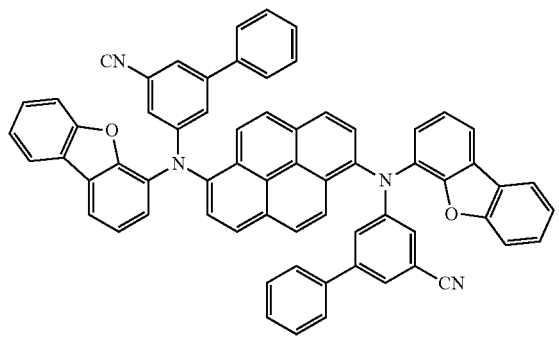
FD30
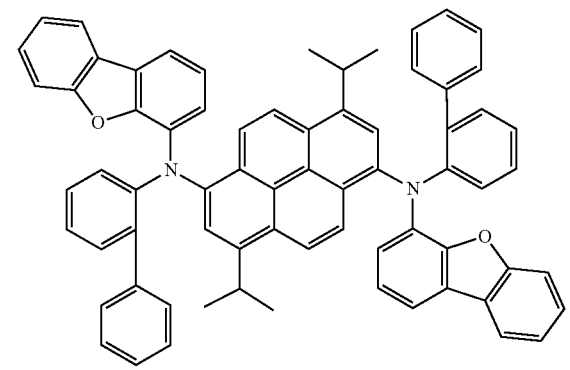

-continued
FD31
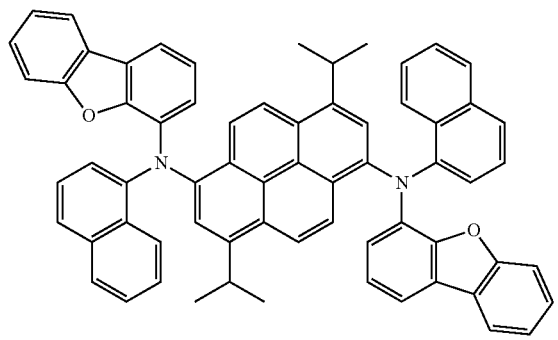
FD32
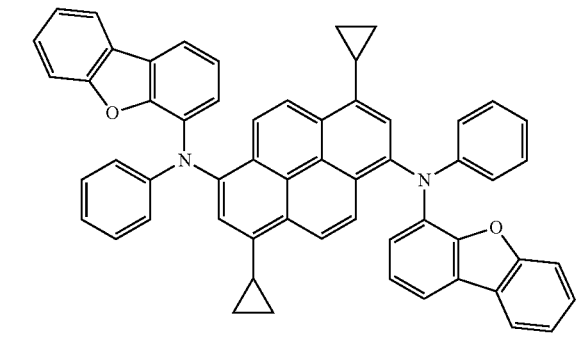
FD33
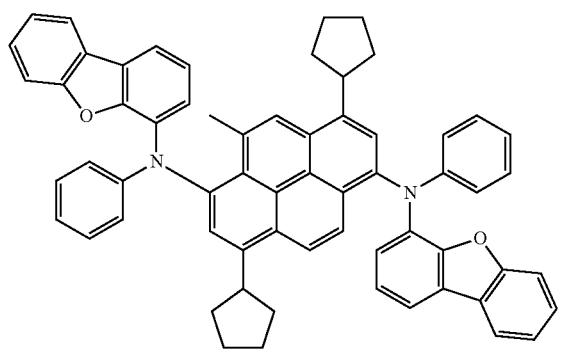
FD34
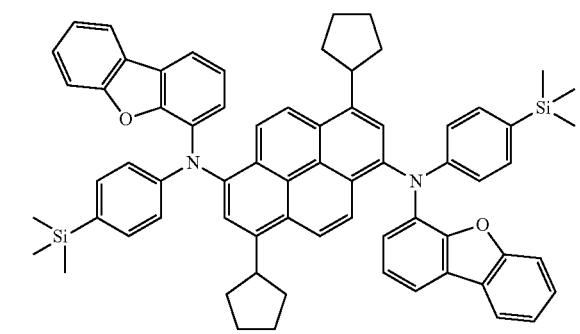
FD35
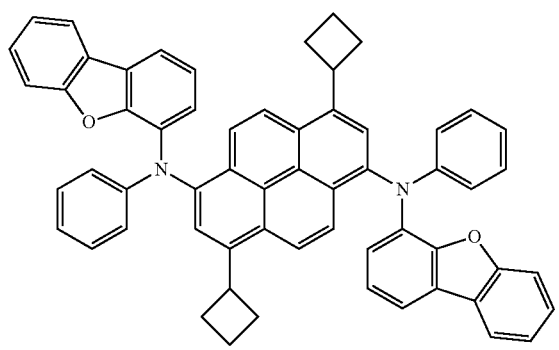
FD36
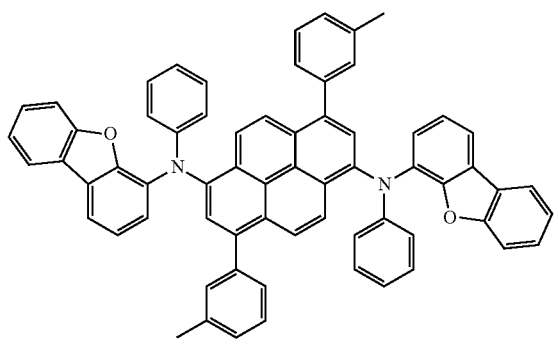
DPVBi
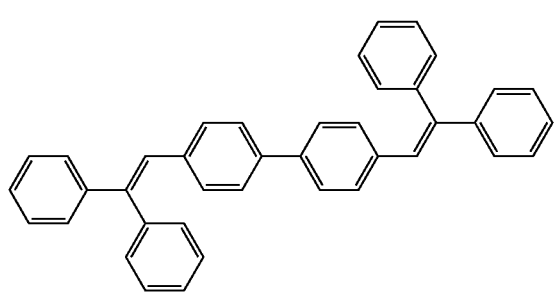

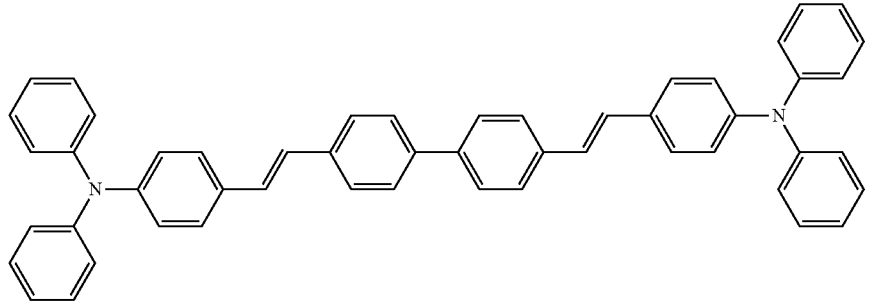

DPAVBi

[Delayed Fluorescent Material]

The emission layer may include a delayed fluorescent material.

The delayed fluorescent material used herein may be selected from any compound that is capable of emitting delayed fluorescent light based on a delayed fluorescence emission mechanism.

The delayed fluorescent material included in the emission layer may act as a host or a dopant depending on the type of other materials included in the emission layer.

In an embodiment, a difference between a triplet energy level (eV) of the delayed fluorescent material and a singlet energy level (eV) of the delayed fluorescent material may be in a range of about 0 eV to about 0.5 eV. When the difference between the triplet energy level (eV) of the delayed fluorescent material and the singlet energy level (eV) of the delayed fluorescent material satisfies the above-described range, up-conversion from a triplet state to a singlet state of the delayed fluorescent materials may effectively occur, and thus, the light emission efficiency of the light-emitting device 10 may be improved.

In an embodiment, the delayed fluorescent material may include i) a material that includes at least one electron donor (for example, a π electron-rich $C_3$-$C_{60}$ cyclic group, such as a carbazole group) and at least one electron acceptor (for example, a sulfoxide group, a cyano group, or a π-electron-deficient nitrogen-containing $C_1$-$C_{60}$ cyclic group), ii) a material including a $C_8$-$C_{60}$ polycyclic group in which two or more cyclic groups share boron (B) and are condensed with each other.

The delayed fluorescent material may include at least one of Compounds DF1 to DF9:

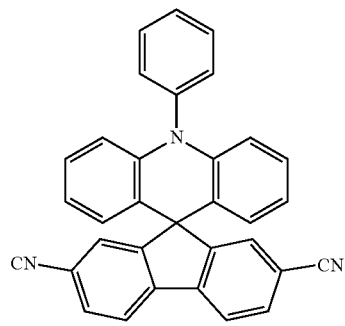

DF2(ACRFLCN)

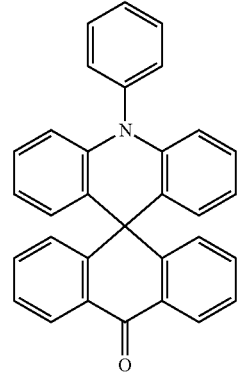

DF3(ACRSA)

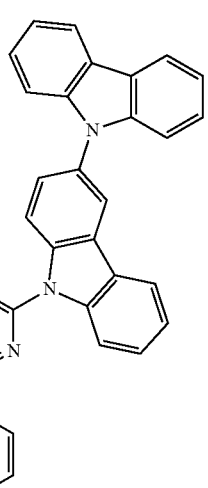

DF4(CC2TA)

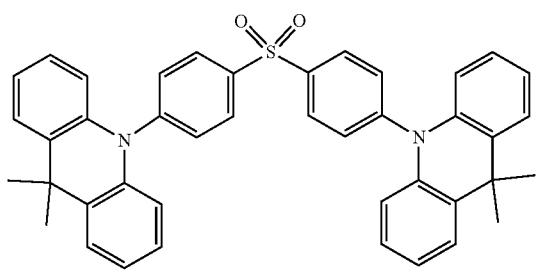

DF1(DMAC-DPS)

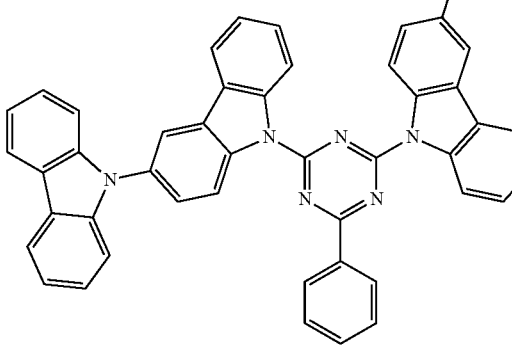

-continued

DF5(PIC-TRZ)

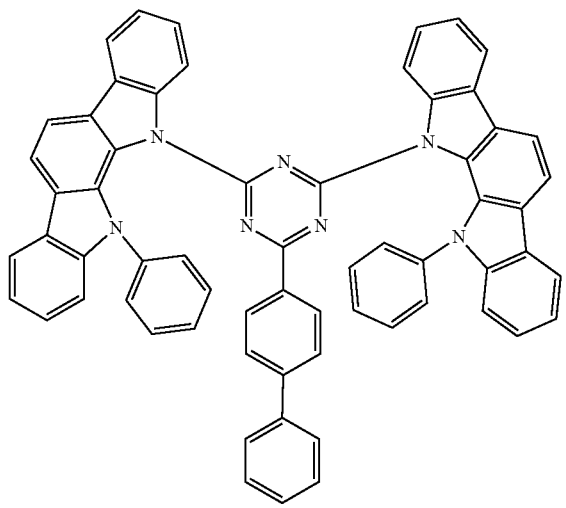

DF6(PIC-TRZ2)

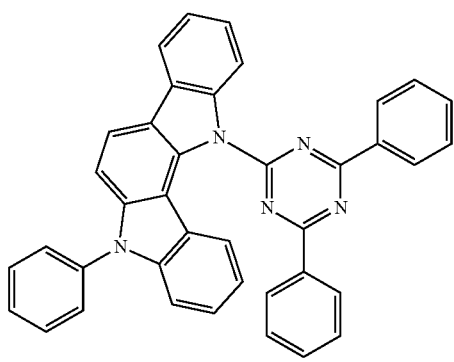

DF7(PXZ-TRZ)

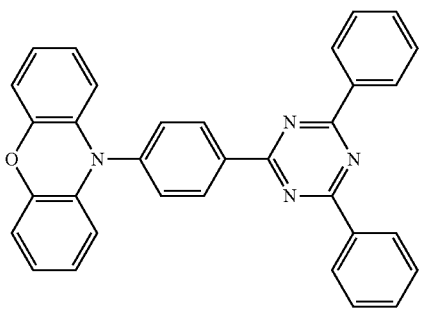

DF8(DABNA-1)

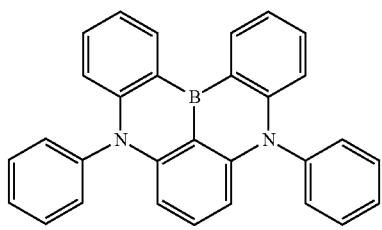

-continued

DF9(DABNA-2)

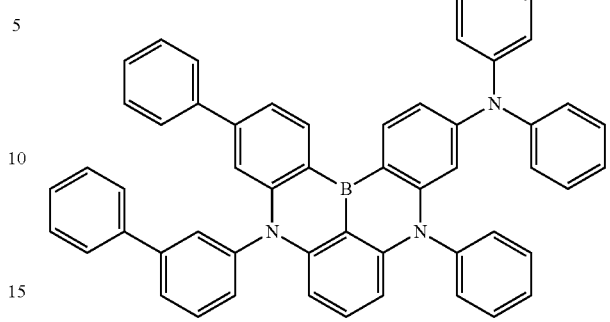

[Quantum Dot]

The emission layer may include a quantum dot.

The quantum dot used herein refers to a crystal of a semiconductor compound, and may include any material that is capable of emitting light of various emission wavelengths depending on a size of the crystal.

A diameter of the quantum dot may be, for example, in a range of about 1 nm to about 10 nm.

The quantum dot may be synthesized by a wet chemical process, an organometallic chemical vapor deposition process, a molecular beam epitaxy process, or a process that is similar to these processes.

The wet chemical process refers to a method in which a solvent and a precursor material are mixed, and a quantum dot particle crystal is grown. When the crystal grows, the organic solvent acts as a dispersant naturally coordinated on the surface of the quantum dot crystal and controls the growth of the crystal. Accordingly, by using a process that is easily performed at low costs compared to a vapor deposition process, such as a metal organic chemical vapor deposition (MOCVD) process and a molecular beam epitaxy (MBE) process, the growth of quantum dot particles may be controlled.

The quantum dot may include Groups III-VI semiconductor compound, Groups II-VI semiconductor compound, Groups III-V semiconductor compound, Group I-III-VI semiconductor compound, Groups IV-VI semiconductor compound, Group IV element or compound, or any combination thereof.

Examples of the Groups III-VI semiconductor compound may include: a binary compound, such as $In_2S_3$; a ternary compound, such as AgInS, $AgInS_2$, CuInS, or $CuInS_2$; or any combination thereof.

Examples of the Groups II-VI semiconductor compound may include: a binary compound, such as CdSe, CdTe, ZnS, ZnSe, ZnTe, ZnO, HgS, HgSe, HgTe, MgSe, or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a quaternary compound, such as CdZnSeS, CdZnSeTe, CdZnSTe, CdHgSeS, CdHgSeTe, CdHgSTe, HgZnSeS, HgZnSeTe, or HgZnSTe; or any combination thereof.

Examples of the Groups III-V semiconductor compound may include: a binary compound, such as GaN, GaP, GaAs, GaSb, AlN, AlP, AlAs, AlSb, InN, InP, InAs, or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, or GaAlNP; a quaternary compound, such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. The Groups III-V semiconductor compound may further include a Group II element. Examples of the Groups III-V semiconductor compound further including a Group II element may include InZnP, InGaZnP, or InAlZnP.

Examples of the Groups III-VI semiconductor compound may include: a binary compound, such as GaS, GaSe, $Ga_2Se_3$, GaTe, InS, InSe, $In_2Se_3$, or InTe; a ternary compound, such as InGaSs, or InGaSes; or any combination thereof.

Examples of the Group I-III-VI semiconductor compound may include: a ternary compound, such as AgInS, $AgInS_2$, CuInS, $CuInS_2$, $CuGaO_2$, $AgGaO_2$, or $AgAlO_2$; or any combination thereof.

Examples of the Group IV-VI semiconductor compound may include: a binary compound, such as SnS, SnSe, SnTe, PbS, PbSe, or PbTe; a ternary compound, such as SnSeS, SnSeTe, SnSTe, PbSeS, PbSeTe, PbSTe, SnPbS, SnPbSe, or SnPbTe; a quaternary compound, such as SnPbSSe, SnPbSeTe, or SnPbSTe; or any combination thereof.

In an embodiment, the Group IV element or compound may include: a single element compound, such as Si or Ge; a binary compound, such as SiC or SiGe; or any combination thereof.

Each element included in the multi-element compound such as the binary compound, ternary compound, and quaternary compound may be present in a particle at a uniform concentration or a non-uniform concentration.

The quantum dot may have a single structure having a uniform concentration of each element included in the corresponding quantum dot or a dual structure of a core-shell. In an embodiment, the material included in the core may be different from the material included in the shell.

The shell of the quantum dot may function as a protective layer for maintaining semiconductor characteristics by preventing chemical degeneration of the core and/or may function as a charging layer for imparting electrophoretic characteristics to the quantum dot. The shell may be a single layer or a multilayer. An interface between the core and the shell may have a concentration gradient in which the concentration of elements existing in the shell decreases toward the center.

Examples of the shell of the quantum dot are a metal or non-metal oxide, a semiconductor compound, or any combination thereof. Examples of the oxide of metal or non-metal may include: a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a ternary compound, such as $MgAl_2O_4$, $CoFe_2O_4$, $NiFe_2O_4$, or $CoMn_2O_4$; or any combination thereof. Examples of the semiconductor compound may include, as described herein, Groups III-VI semiconductor compound, Groups II-VI semiconductor compound, Groups III-V semiconductor compound, Groups I-III-VI semiconductor compound, Groups IV-VI semiconductor compound, or any combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width at half maximum (FWFIM) of an emission wavelength spectrum of the quantum dot may be equal to or less than about 45 nm. For example, the FWFIM of an emission wavelength spectrum of the quantum dot may be equal to or less than about 40 nm. For example, the FWFIM of an emission wavelength spectrum of the quantum dot may be equal to or less than about 30 nm. When the FWHM of the emission wavelength spectrum of the quantum dot is within this range, color purity or color reproduction may be improved. Light emitted through the quantum dot may be irradiated omnidirectionally. Accordingly, a wide viewing angle may be increased.

The quantum dot may be a spherical, a pyramidal, a multi-arm, or a cubic nanoparticle, a nanotube, a nanowire, a nanofiber, or a nanoplate particle.

By adjusting the size of the quantum dot, the energy band gap may also be adjusted, thereby obtaining light of various wavelengths in a quantum dot emission layer. Therefore, by using quantum dots of different sizes, a light-emitting device that emits light of various wavelengths may be implemented. For example, the size of the quantum dot may be selected to emit red, green and/or blue light. The size of the quantum dot may be adjusted such that light of various colors are combined to emit white light.

[Electron Transport Region in Interlayer 130]

The electron transport region may have: i) a single-layered structure consisting of a single layer consisting of a single material, ii) a single-layered structure consisting of a single layer including different materials, or iii) a multi-layered structure including multiple layers including different materials.

The electron transport region may include a hole blocking layer, an electron transport layer, an electron injection layer, or any combination thereof.

In an embodiment, the electron transport region may have an electron transport layer/electron injection layer structure or a hole blocking layer/electron transport layer/electron injection layer structure, wherein, in each structure, layers are stacked sequentially from the emission layer.

The electron transport region (for example, the hole blocking layer or the electron transport layer in the electron transport region) may include a metal-free compound including at least one π-electron-deficient nitrogen-containing $C_1$-$C_{60}$ cyclic group.

In an embodiment, the electron transport region may include a compound represented by Formula 601 below:

$$[Ar_{601}]_{xe11}\text{-}[(L_{601})_{xe1}\text{-}R_{601}]_{xe21} \qquad \text{[Formula 601]}$$

In Formula 601, $Ar_{601}$ and $L_{601}$ may each independently be a $C_3$-$C_{60}$ carbocyclic group unsubstituted or substituted with at least one $R_{10a}$ or a $C_1$-$C_{60}$ heterocyclic group unsubstituted or substituted with at least one $R_{10a}$, xe11 may be 1, 2, or 3, xe1 may be 0, 1, 2, 3, 4, or 5, $R_{601}$ may be a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si$(Q_{601})(Q_{602})(Q_{603})$, —C(=O)$(Q_{601})$, —S(=O)$_2$$(Q_{601})$, or —P(=O)$(Q_{601})(Q_{602})$, $Q_{601}$ to $Q_6O_3$ may be the same as described in connection with $Q_1$, xe21 may be 1, 2, 3, 4, or 5, and at least one of $Ar_{601}$, $L_{601}$, and $R_{601}$ may each independently be a π-electron-deficient nitrogen-containing $C_1$-$C_{60}$ cyclic group unsubstituted or substituted with at least one $R_{10a}$.

In embodiments, when xe11 in Formula 601 is 2 or more, two or more of $Ar_{601}$(s) may be linked to each other via a single bond.

In an embodiment, $Ar_{601}$ in Formula 601 may be a substituted or unsubstituted anthracene group.

In an embodiment, the electron transport region may include a compound represented by Formula 601-1:

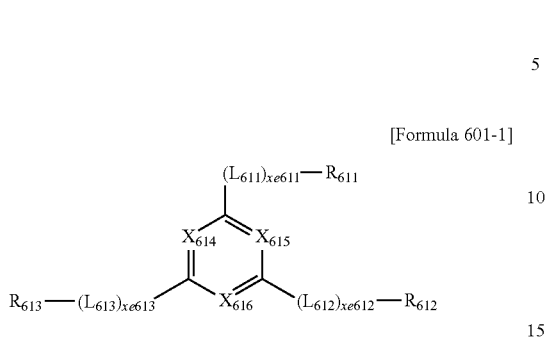

[Formula 601-1]

In Formula 601-1, $X_{614}$ may be N or $C(R_{6u})$, $X_{615}$ may be N or $C(R_{615})$, $X_{616}$ may be N or $C(R_{616})$, and at least one of $X_{614}$ to $X_{616}$ may be N, $L_{611}$ to $L_{613}$ may be the same as described in connection with $L_{601}$, xe611 to xe613 may be the same as described in connection with xe1, $R_{611}$ to $R_{613}$ may be the same as described in connection with $R_{601}$, and $R_{614}$ to $R_{616}$ may each independently be hydrogen, deuterium, —F, —Cl, —Br, —I, a hydroxyl group, a cyano group, a nitro group, a $C_1$-$C_{20}$ alkyl group, a $C_1$-$C_{20}$ alkoxy group, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$.

In an embodiment, xe1 and xe611 to xe613 in Formula 601 and 601-1 may each independently be 0, 1, or 2.

The electron transport region may include one of Compounds ET1 to ET45, 2,9-dimethyl-4,7-diphenyl-1,10-phenanthroline (BCP), 4,7-diphenyl-1,10-phenanthroline (Bphen), $Alq_3$, BAlq, TAZ, NTAZ, or any combination thereof:

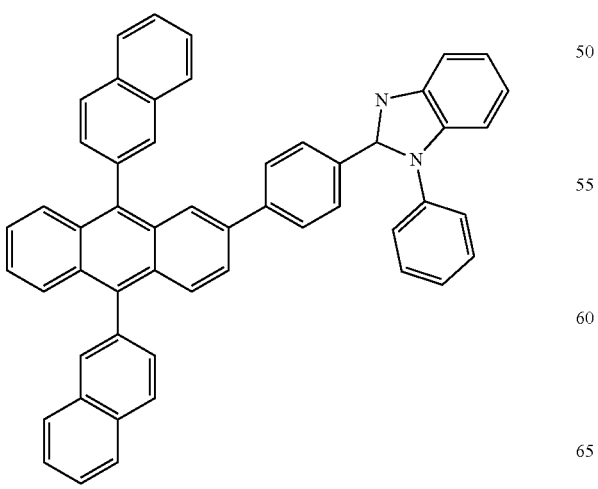

ET1

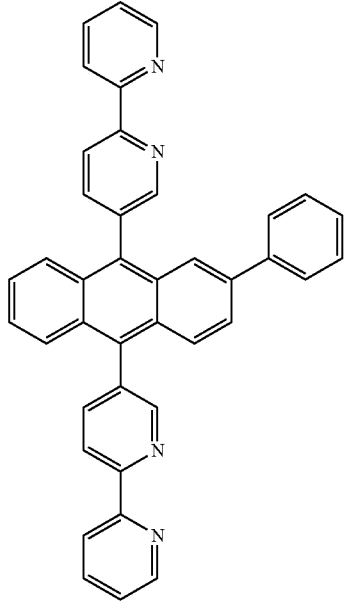

ET2

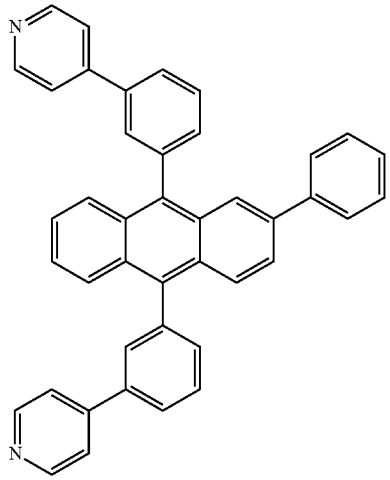

ET3

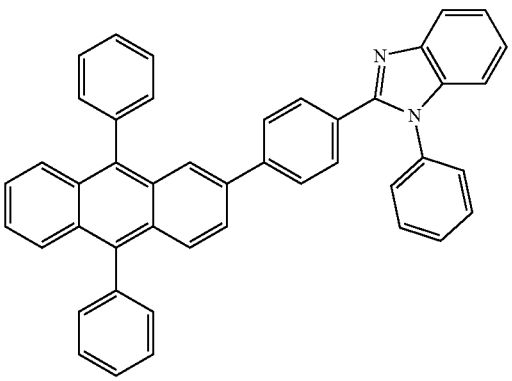

ET4

ET5
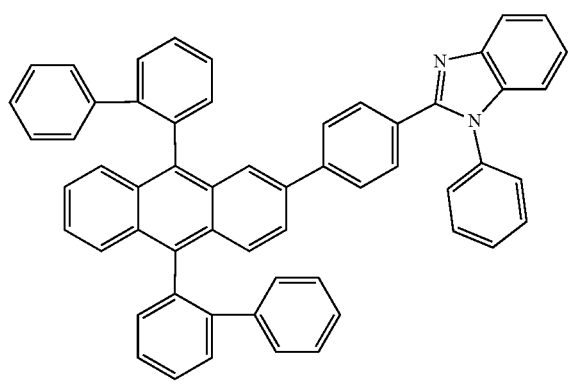
ET8
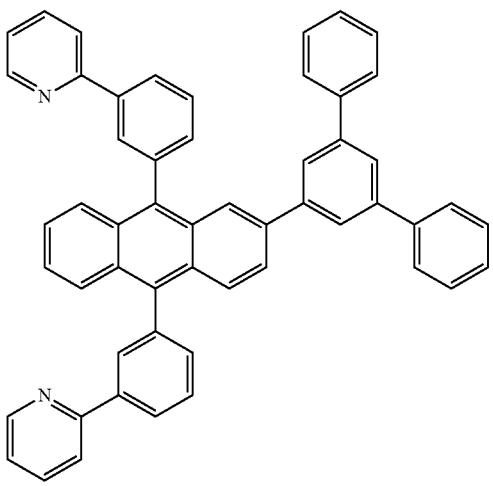
ET6
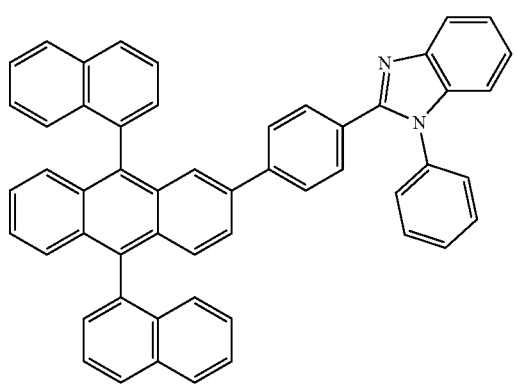
ET7
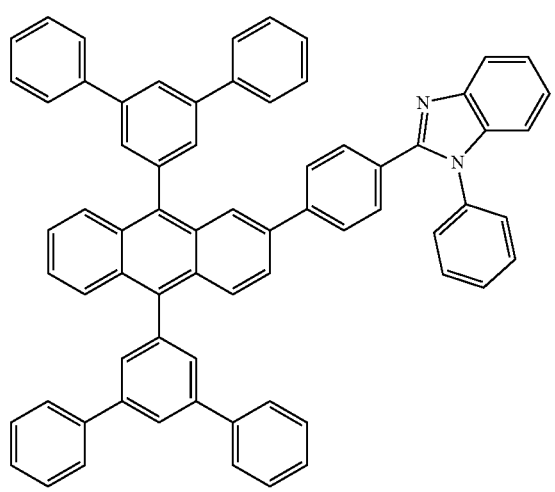
ET9
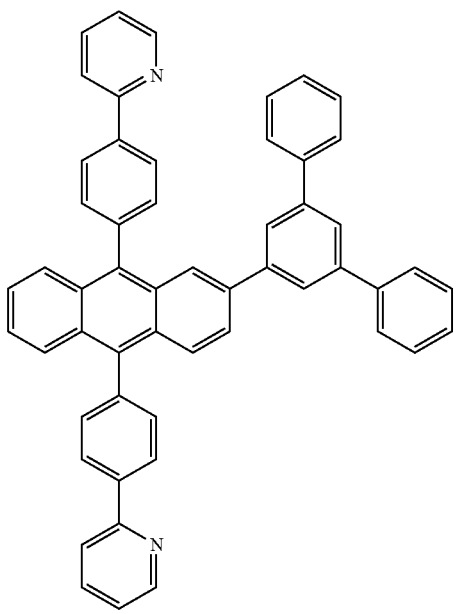

-continued
ET10
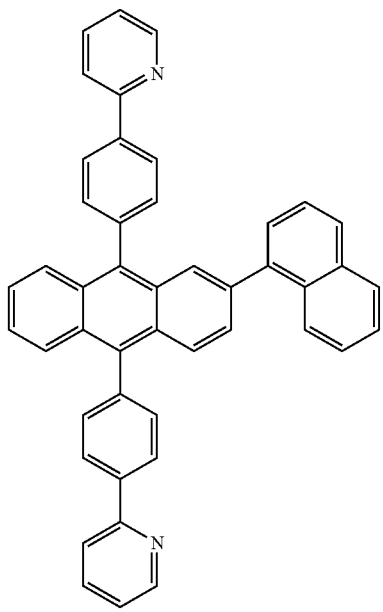
ET11
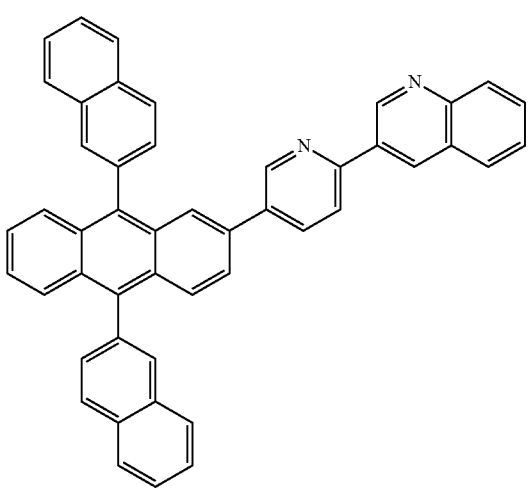
ET12
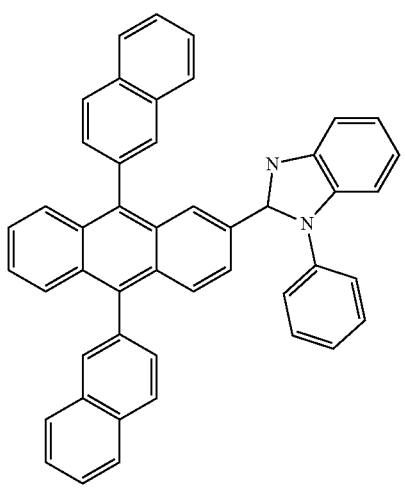
-continued
ET13
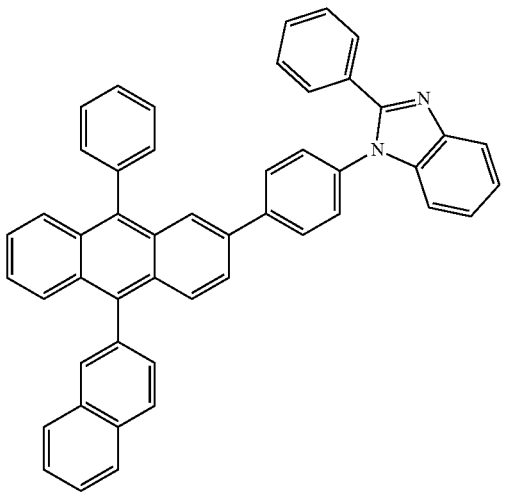
ET14
ET15
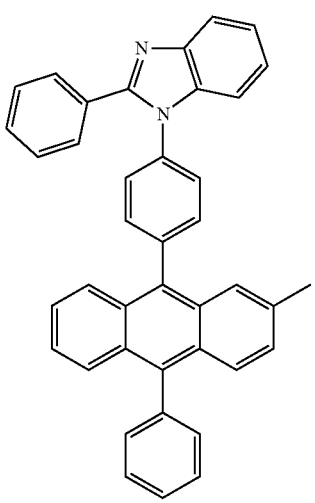

ET16
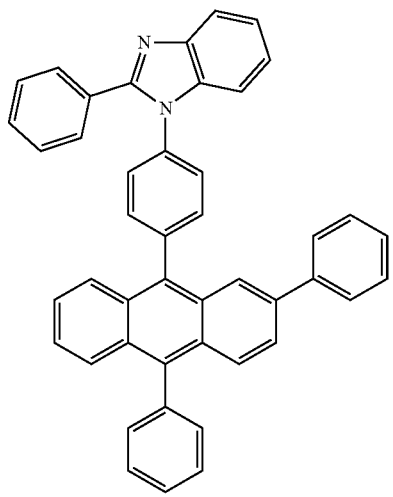
ET17
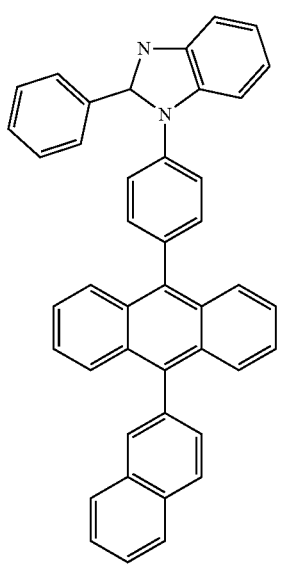
ET18
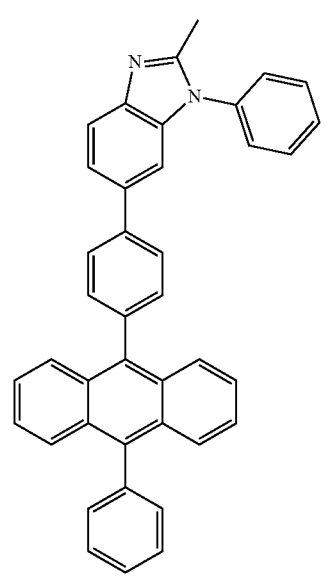
ET19
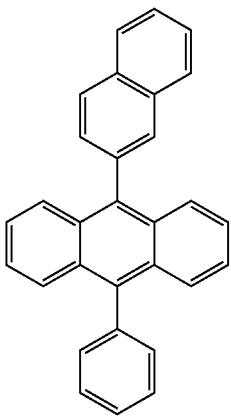
ET20
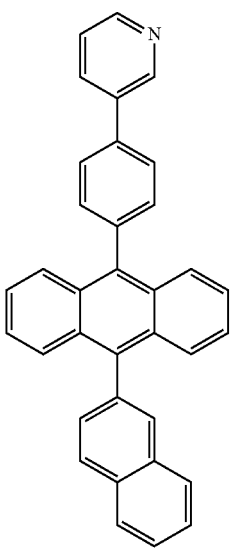
ET21
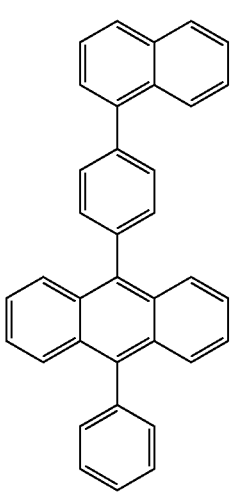

ET22
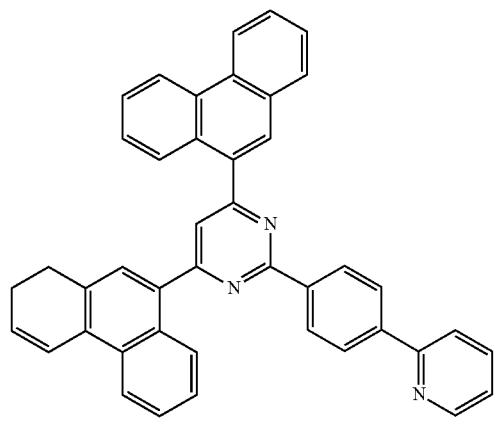
ET23
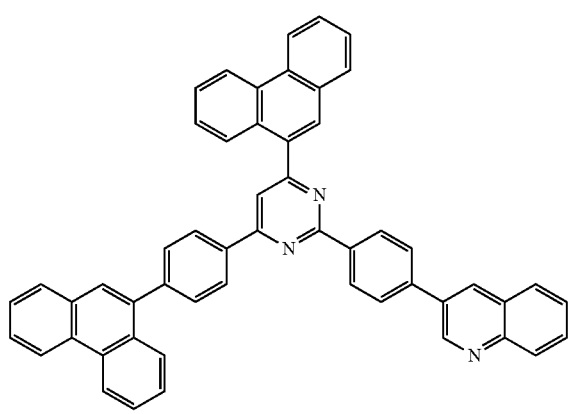
ET24
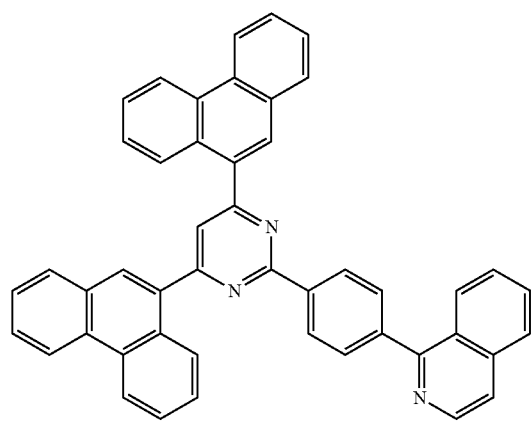
ET25
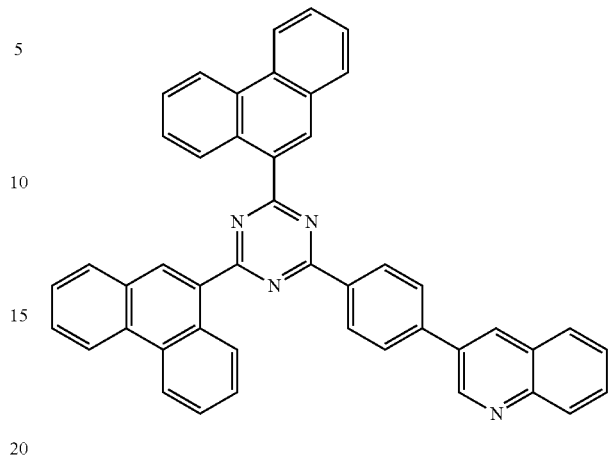
ET26
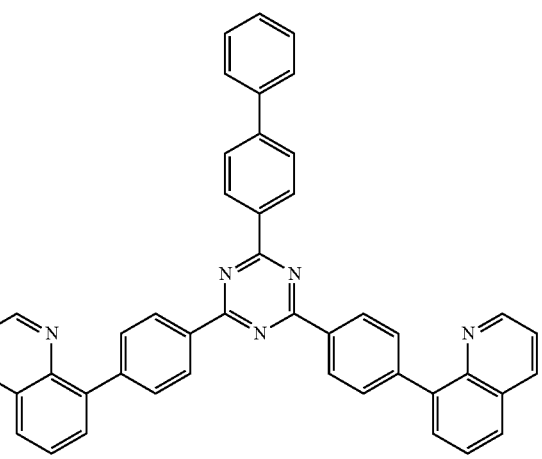
ET27
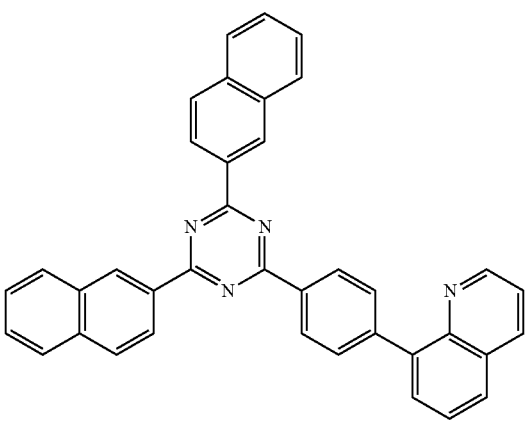

ET28
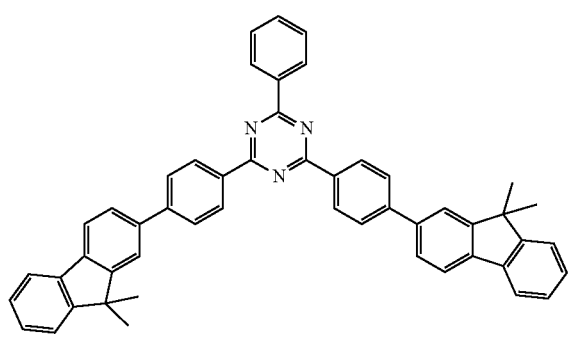
ET29
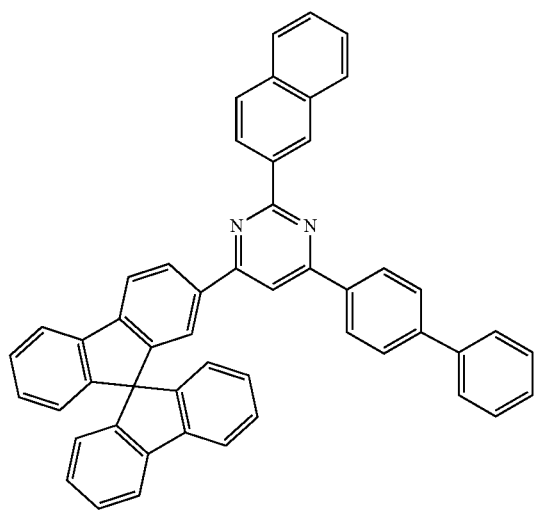
ET30
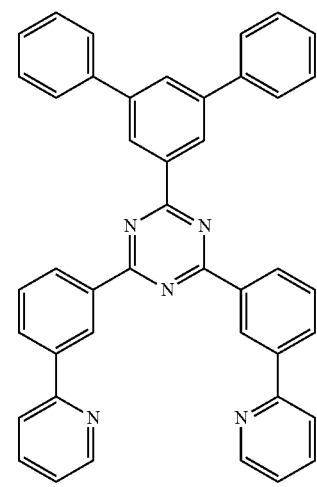
ET31
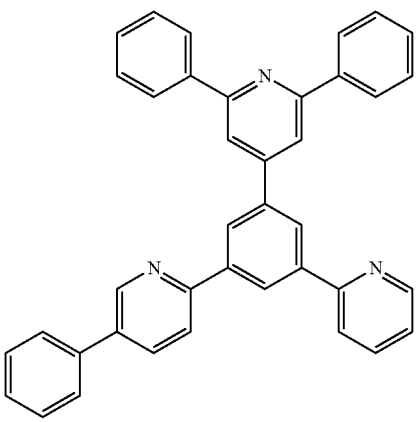
ET32
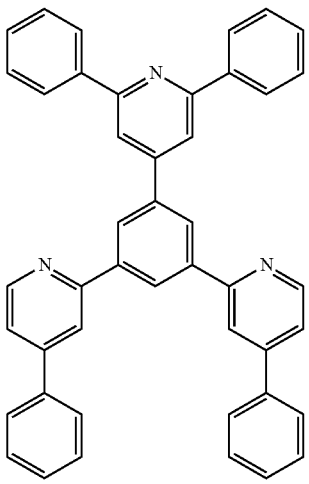
ET33
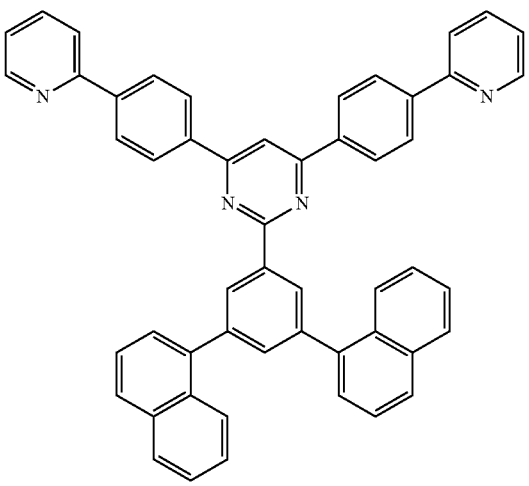

ET34
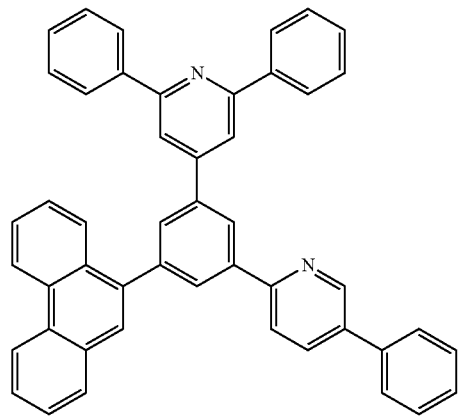
ET35
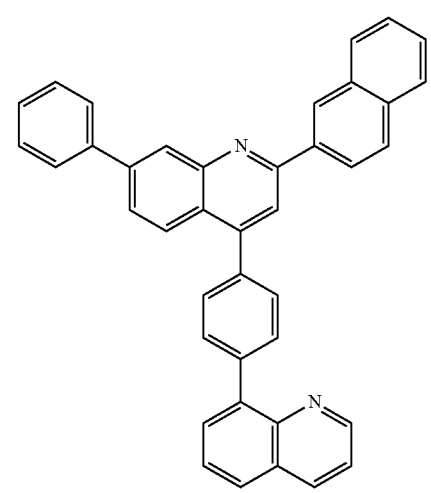
ET36
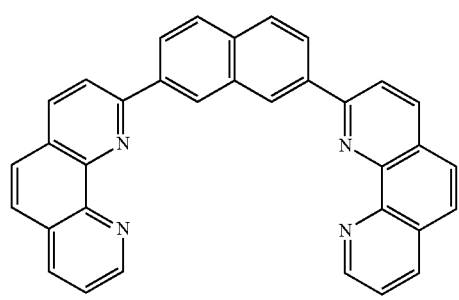
ET37
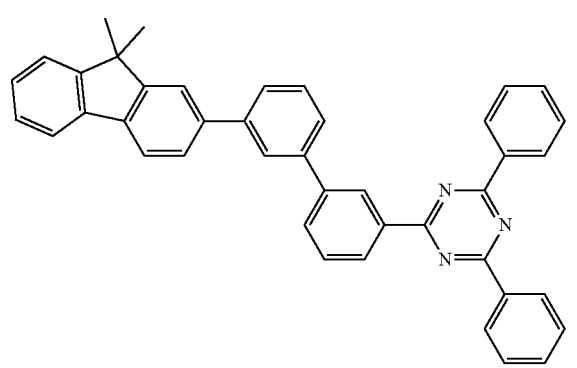
ET38
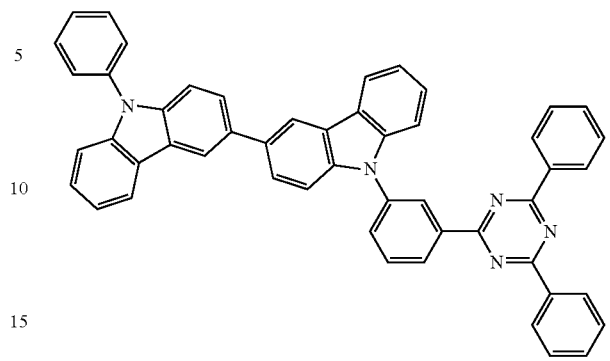
ET39
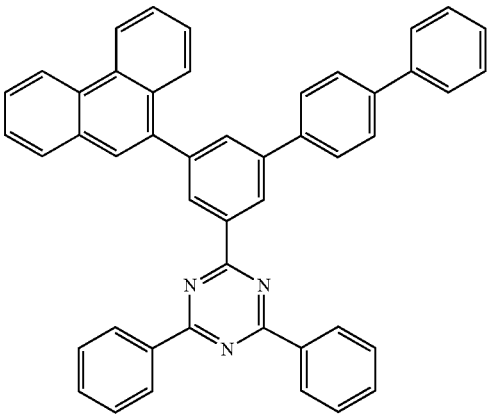
ET40
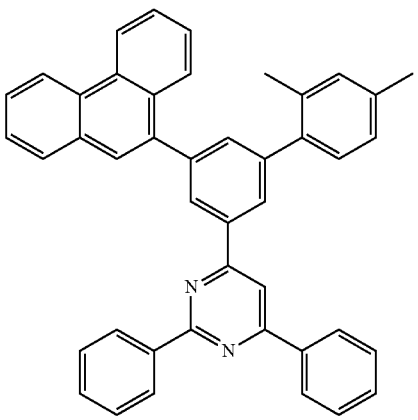

ET41
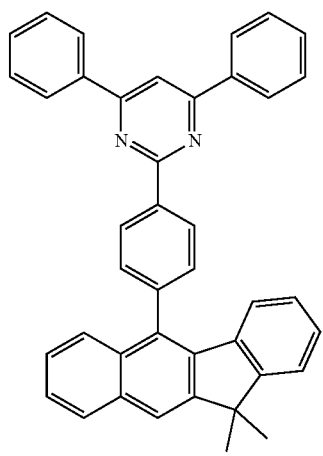
ET42
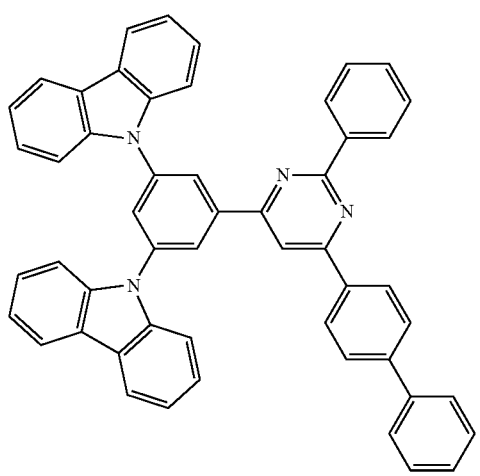
ET43
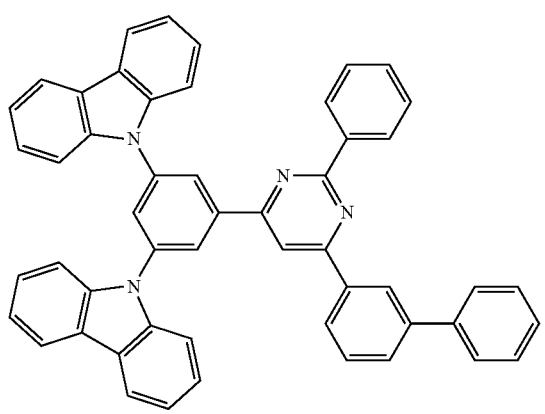
ET44
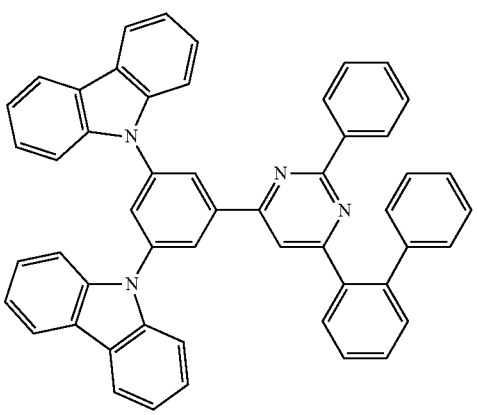
ET45
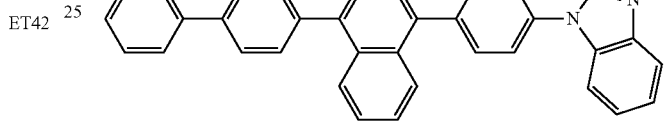
Alq₃
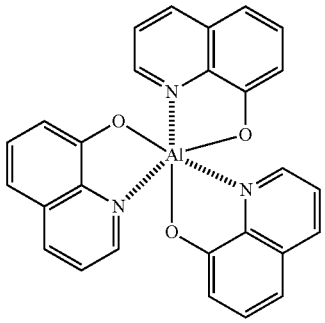
BAlq
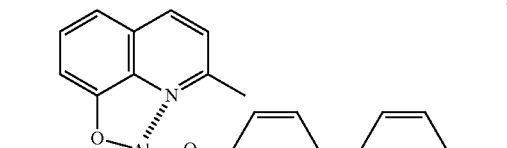
TAZ
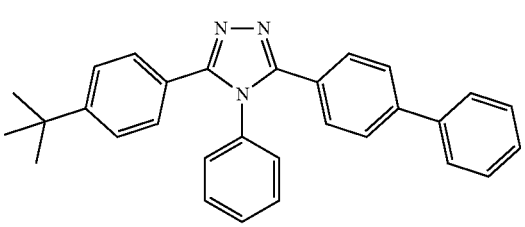

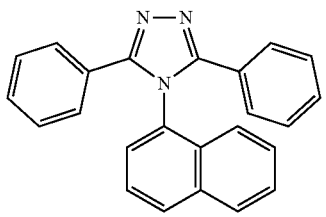

NTAZ

A thickness of the electron transport region may be in a range of about 160 Å to about 5,000 Å. For example, the thickness of the electron transport region may be in a range of about 100 Å to about 4,000 Å. When the electron transport region includes the hole blocking layer, the electron transport layer, or any combination thereof, a thickness of the hole blocking layer may be in a range of about 20 Å to about 1,000 Å, and a thickness of the electron transport layer may be in a range of about 100 Å to about 1,000 Å. For example, the thickness of the hole blocking layer may be in a range of about 30 Å to about 300 Å. For example, the thickness of the electron transport layer may be in a range of about 150 Å to about 500 Å. When a thickness of the hole blocking layer and/or the electron transport layer is within these ranges, satisfactory electron transport characteristics may be obtained without a substantial increase in a driving voltage.

The electron transport region (for example, the electron transport layer in the electron transport region) may further include, in addition to the materials described above, a metal-containing material.

The metal-containing material may include an alkali metal complex, an alkaline earth-metal complex, or any combination thereof. A metal ion of the alkali metal complex may be a Li ion, a Na ion, a K ion, a Rb ion, or a Cs ion, and a metal ion of the alkaline earth-metal complex may be a Be ion, a Mg ion, a Ca ion, a Sr ion, or a Ba ion. A ligand coordinated with the metal ion of the alkali metal complex or the alkaline earth-metal complex may each independently be a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, a cyclopentadiene, or any combination thereof.

In an embodiment, the metal-containing material may include a Li complex. The Li complex may include, for example, Compound ET-D1 (LiQ) or ET-D2:

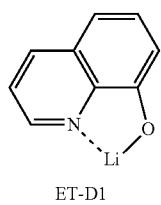

ET-D1

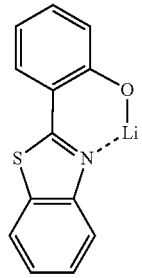

ET-D2

The electron transport region may include an electron injection layer that facilitates the injection of electrons from the second electrode 150. The electron injection layer may be in direct contact with the second electrode 150.

The electron injection layer may have: i) a single-layered structure consisting of a single layer consisting of a single material, ii) a single-layered structure consisting of a single layer including different materials, or iii) a multi-layered structure including multiple layers including different materials.

The electron injection layer may include an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof.

The alkali metal may include Li, Na, K, Rb, Cs, or any combination thereof. The alkaline earth metal may include Mg, Ca, Sr, Ba, or any combination thereof. The rare earth metal may include Sc, Y, Ce, Tb, Yb, Gd, or any combination thereof.

The alkali metal-containing compound, the alkaline earth metal-containing compound, and the rare earth metal-containing compound may be oxides and halides (for example, fluorides, chlorides, bromides, or iodides) of the alkali metal, the alkaline earth metal, and the rare earth metal, telluride, or any combination thereof.

The alkali metal-containing compound may be alkali metal oxides, such as $Li_2O$, $Cs_2O$, or $K_2O$, and alkali metal halides, such as LiF, NaF, CsF, KF, LiI, NaI, CsI, or KI, or any combination thereof. The alkaline earth metal-containing compound may include an alkaline earth metal compound, such as BaO, SrO, CaO, $Ba_xSr_{(1-x)}O$ (x is a real number that satisfies the condition of 0<x<1), or $Ba_xCa_{(1-x)}O$ (x is a real number that satisfies the condition of 0<x<1). The rare earth metal-containing compound may include $YbF_3$, $ScF_3$, $Sc_2O_3$, $Y_2O_3$, $Ce_2O_3$, $GdF_3$, $TbF_3$, $YbI_3$, $ScI_3$, $TbI_3$, or any combination thereof. In an embodiment, the rare earth metal-containing compound may include lanthanide metal telluride. Examples of the lanthanide metal telluride may include LaTe, CeTe, PrTe, NdTe, PmTe, SmTe, EuTe, GdTe, TbTe, DyTe, FloTe, ErTe, TmTe, YbTe, LuTe, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $Tm_2Te_3$, $Yb_2Te_3$, and $Lu_2Te_3$.

The alkali metal complex, the alkaline earth-metal complex, and the rare earth metal complex may include i) one of ions of the alkali metal, the alkaline earth metal, and the rare earth metal and ii) as a ligand linked to the metal ion, for example, a hydroxy quinoline, a hydroxy isoquinoline, a hydroxy benzoquinoline, a hydroxy acridine, a hydroxy phenanthridine, a hydroxy phenyloxazole, a hydroxy phenylthiazole, a hydroxy diphenyloxadiazole, a hydroxy diphenylthiadiazole, a hydroxy phenylpyridine, a hydroxy phenylbenzimidazole, a hydroxy phenylbenzothiazole, a bipyridine, a phenanthroline, a cyclopentadiene, or any combination thereof.

The electron injection layer may consist of an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof, or may further include an organic material (for example, a compound represented by Formula 601).

In an embodiment, the electron injection layer may consist of i) an alkali metal-containing compound (for example, an alkali metal halide), or ii) a) an alkali metal-containing compound (for example, an alkali metal halide); and b) alkali metal, alkaline earth metal, rare earth metal, or any combination thereof. In an embodiment, the electron injection layer may be a KI:Yb co-deposited layer or a RbI:Yb co-deposited layer.

When the electron injection layer further includes an organic material, an alkali metal, an alkaline earth metal, a rare earth metal, an alkali metal-containing compound, an alkaline earth metal-containing compound, a rare earth metal-containing compound, an alkali metal complex, an alkaline earth-metal complex, a rare earth metal complex, or any combination thereof may be homogeneously or non-homogeneously dispersed in a matrix including the organic material.

A thickness of the electron injection layer may be in a range of about 1 Å to about 100 Å. For example, the thickness of the electron injection layer may be in a range of about 3 Å to about 90 Å. When the thickness of the electron injection layer is within the range described above, the electron injection layer may have satisfactory electron injection characteristics without a substantial increase in driving voltage.

[Second Electrode 150]

The second electrode 150 may be located on the interlayer 130 having such a structure. The second electrode 150 may be a cathode, which is an electron injection electrode, and as a material for forming the second electrode 150, a metal, an alloy, an electrically conductive compound, or any combination thereof, each having a low work function, may be used.

The second electrode 150 may include at least one selected from lithium (Li), silver (Ag), magnesium (Mg), aluminum (Al), aluminum-lithium (Al—Li), calcium (Ca), magnesium-indium (Mg-ln), magnesium-silver (Mg—Ag), ytterbium (Yb), silver-ytterbium (Ag—Yb), ITO, IZO, or any combination thereof. The second electrode 150 may be a transmissive electrode, a semi-transmissive electrode, or a reflective electrode.

The second electrode 150 may have a single-layered structure or a multi-layered structure including two or more layers.

[Capping Layer]

A first capping layer and a second capping layer may be disposed outside the second electrode 150. In an embodiment, the light-emitting device 10 may have a structure in which the first electrode 110, the interlayer 130, the second electrode 150, the first capping layer, and the second capping layer are sequentially stacked.

Light generated in the emission layer of the interlayer 130 of the light-emitting device 10 may be extracted toward the outside through the second electrode 150, which is a semi-transmissive electrode or a transmissive electrode, the first capping layer, and the second capping layer.

The first capping layer and the second capping layer may increase external light emission efficiency according to the principle of constructive interference. When a refractive index and a thickness of the first capping layer and the second capping layer are within the range, light extraction efficiency of the light-emitting device 10 is increased, and thus light emission efficiency of the light-emitting device 10 may be improved.

The first capping layer and the second capping layer may each independently be an organic capping layer including an organic material. In an embodiment, the first capping layer and the second capping layer may be organic layers each consisting of organic materials.

A compound represented by Formula 1 and a compound represented by Formula 2, as the organic materials included in the first capping layer and the second capping layer, respectively, are the same as described above.

[Electronic Apparatus]

The light-emitting device may be included in various electronic apparatuses. In an embodiment, the electronic apparatus including the light-emitting device may be a light-emitting apparatus, an authentication apparatus, or the like.

The electronic apparatus (for example, light-emitting apparatus) may further include, in addition to the light-emitting device, i) a color filter, ii) a color conversion layer, or iii) a color filter and a color conversion layer. The color filter and/or the color conversion layer may be located in at least one traveling direction of light emitted from the light-emitting device. In an embodiment, light emitted from the light-emitting device may be blue light or white light. The light-emitting device may be the same as described above. In an embodiment, the color conversion layer may include a quantum dot. The quantum dot may be, for example, a quantum dot as described herein.

The electronic apparatus may include a first substrate. The first substrate may include subpixels, the color filter may include color filter areas corresponding to the subpixels, respectively, and the color conversion layer may include a plurality of color conversion areas corresponding to the subpixels, respectively.

A pixel-defining film may be between the subpixels to define each of the subpixels.

The color filter may further include color filter areas and a light-blocking pattern between the color filter areas, and the color conversion layer may further include color conversion areas and a light-blocking pattern between the color conversion areas.

The color filter areas (or the color conversion areas) may include a first area emitting first color light, a second area emitting second color light, and/or a third area emitting third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include a quantum dot. For example, first area may include a red quantum dot, the second area may include a green quantum dot, and the third area may not include a quantum dot. The quantum dot is the same as described in the specification. Each of the first area, the second area, and/or the third area may further include a scatterer.

In an embodiment, the light-emitting device may emit first light, the first area may absorb the first light to emit first first-color light, the second area may absorb the first light to emit second first-color light, and the third area may absorb the first light to emit third first-color light. In this regard, the first first-color light, the second first-color light, and the third first-color light may have different maximum emission wavelengths from one another. For example, first light may be blue light, the first first-color light may be red light, the second first-color light may be green light, and the third first-color light may be blue light.

The electronic apparatus may further include a thin-film transistor in addition to the light-emitting device as described above. The thin-film transistor may include a source electrode, a drain electrode, and an active layer, wherein any one of the source electrode and the drain electrode may be electrically connected to any one of the first electrode and the second electrode of the light-emitting device.

The thin-film transistor may further include a gate electrode, a gate insulating film, or the like.

The activation layer may include crystalline silicon, amorphous silicon, organic semiconductor, oxide semiconductor, or the like.

The electronic apparatus may further include a sealing portion for sealing the light-emitting device. The sealing portion may be disposed between the color filter and/or the color conversion layer and the light-emitting device. The sealing portion allows light from the light-emitting device to be extracted to the outside, while simultaneously preventing ambient air and moisture from penetrating into the light-emitting device. The sealing portion may be a sealing substrate including a transparent glass substrate or a plastic substrate. The sealing portion may be a thin film encapsulation layer including at least one layer of an organic layer and/or an inorganic layer. When the sealing portion is a thin film encapsulation layer, the electronic apparatus may be flexible.

On the sealing portion, in addition to the color filter and/or the color conversion layer, various functional layers may be further disposed according to the use of the electronic apparatus. The functional layers may include a touch screen layer, a polarizing layer, and the like. The touch screen layer may be a pressure-sensitive touch screen layer, a capacitive touch screen layer, or an infrared touch screen layer. The authentication apparatus may be, for example, a biometric authentication apparatus for authenticating an individual by using biometric information of a biometric body (for example, a finger tip, a pupil, or the like).

The authentication apparatus may further include, in addition to the light-emitting device, a biometric information collector.

The electronic apparatus may be applied to various displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, or endoscope displays), fish finders, various measuring instruments, meters (for example, meters for a vehicle, an aircraft, and a vessel), projectors, and the like.

Figure 2:
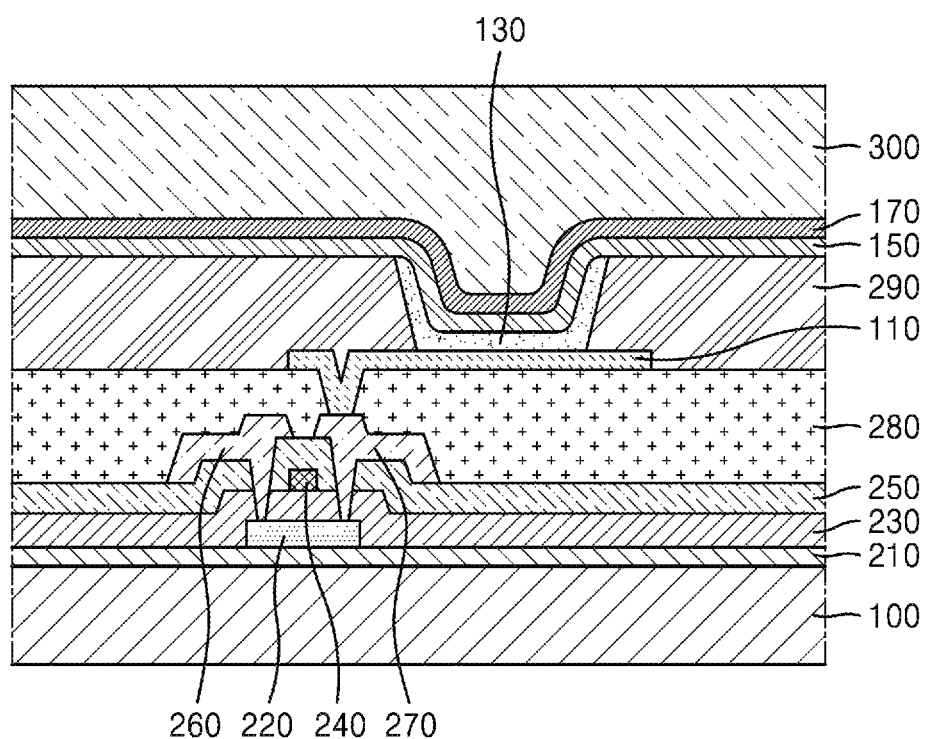
FIG. 2 is a schematic cross-sectional view of a light-emitting apparatus according to an embodiment of the disclosure.
Figure 3:
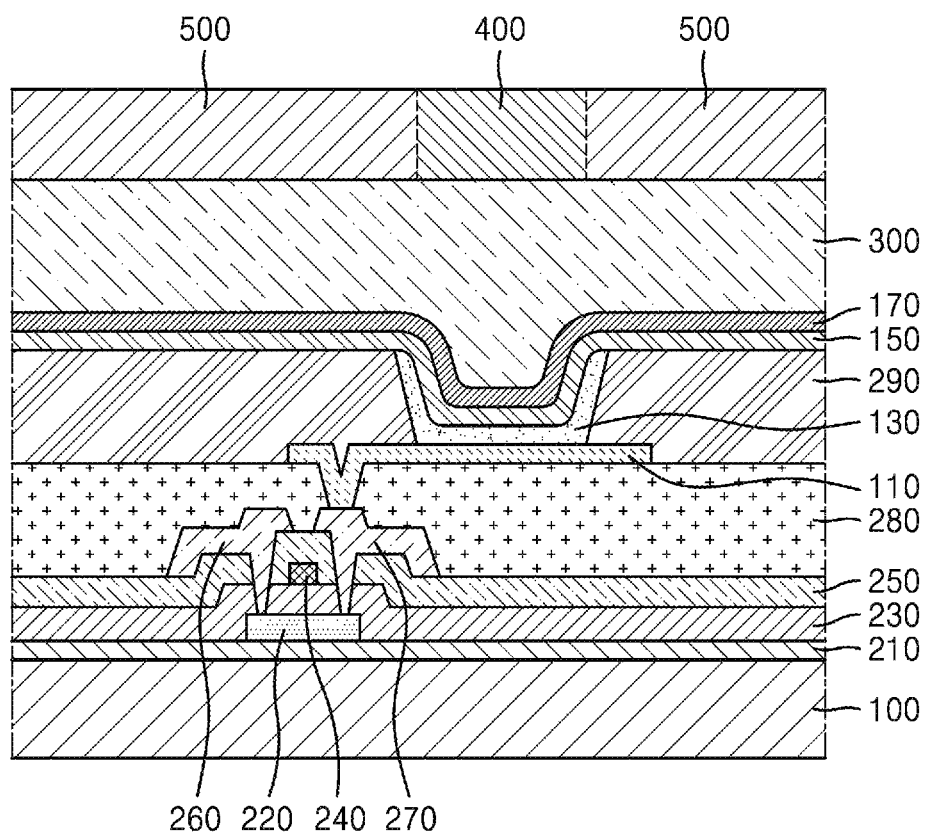
FIG. 3 is a schematic cross-sectional view of a light-emitting apparatus according to another embodiment of the disclosure.

[Description of FIGS. 2 and 3]

FIG. 2 is a schematic cross-sectional view of a light-emitting apparatus according to an embodiment.

The light-emitting apparatus of FIG. 2 includes a substrate 100, a thin-film transistor (TFT), a light-emitting device, and an encapsulation portion 300 that seals the light-emitting device.

The substrate 100 may be a flexible substrate, a glass substrate, or a metal substrate. A buffer layer 210 may be located on the substrate 100. The buffer layer 210 prevents the penetration of impurities through the substrate 100 and may provide a flat surface on the substrate 100.

A TFT may be located on the buffer layer 210. The TFT may include an active layer 220, a gate electrode 240, a source electrode 260, and a drain electrode 270.

The active layer 220 may include an inorganic semiconductor such as silicon or polysilicon, an organic semiconductor, or an oxide semiconductor, and may include a source region, a drain region, and a channel region.

A gate insulating film 230 for insulating the active layer 220 from the gate electrode 240 may be located on the active layer 220, and the gate electrode 240 may be located on the gate insulating film 230.

An interlayer insulating film 250 may be located on the gate electrode 240. The interlayer insulating film 250 is located between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be located on the interlayer insulating film 250. The interlayer insulating film 250 and the gate insulating film 230 may be formed to expose the source region and the drain region of the active layer 220, and the source electrode 260 and the drain electrode 270 may be disposed to contact the exposed portions of the source region and the drain region of the active layer 220.

The TFT may be electrically connected to a light-emitting device to drive the light-emitting device, and is covered by a passivation layer 280. The passivation layer 280 may include an inorganic insulating film, an organic insulating film, or a combination thereof. A light-emitting device is provided on the passivation layer 280. The light-emitting device includes the first electrode 110, the interlayer 130, and the second electrode 150.

The first electrode 110 may be disposed on the passivation layer 280. The passivation layer 280 does not completely cover the drain electrode 270 and may expose a region of the drain electrode 270, and the first electrode 110 may be connected to the exposed region of the drain electrode 270.

A pixel defining layer 290 including an insulating material may be located on the first electrode 110. The pixel defining layer 290 may expose a region of the first electrode 110, and the interlayer 130 may be formed in the exposed region of the first electrode 110. The pixel defining layer 290 may be a polyimide or polyacryl-based organic film. Although not shown in FIG. 2, at least some layers of the interlayer 130 may extend beyond the upper portion of the pixel defining layer 290 and may thus be disposed in the form of a common layer.

The second electrode 150 may be disposed on the interlayer 130, and a capping layer 170 may be additionally formed on the second electrode 150. The capping layer 170 may be formed to cover the second electrode 150. The capping layer 170 may include the first capping layer and the second capping layer as described above.

The encapsulation portion 300 may be located on the capping layer 170. The encapsulation portion 300 may be located on a light-emitting device and protects the light-emitting device from moisture or oxygen. The encapsulation portion 300 may include: an inorganic film including silicon nitride (SiNx), silicon oxide (SiOx), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate or polyacrylic acid), an epoxy-based resin (for example, aliphatic glycidyl ether (AGE), or a combination thereof; or a combination of an inorganic film and an organic film.

FIG. 3 is a schematic cross-sectional view showing a light-emitting apparatus according to an embodiment of the disclosure.

The light-emitting apparatus of FIG. 3 is the same as the light-emitting apparatus of FIG. 2, except that a light-blocking pattern 500 and a functional region 400 are additionally disposed on the encapsulation portion 300. The functional region 400 may be i) a color filter area, ii) a color conversion area, or iii) a combination of the color filter area and the color conversion area. In an embodiment, the light-emitting device included in the light-emitting apparatus of FIG. 3 may be a tandem light-emitting device.

[Preparation Method]

Layers constituting the hole transport region, an emission layer, and layers constituting the electron transport region may be formed in a certain region by using one or more suitable methods selected from vacuum deposition, spin coating, casting, Langmuir-Blodgett (LB) deposition, ink-jet printing, laser-printing, and laser-induced thermal imaging.

When layers constituting the hole transport region, an emission layer, and layers constituting the electron transport region are formed by vacuum deposition, the deposition may be performed at a deposition temperature of about 100° C. to about 500° C., a vacuum degree of about $10^{-8}$ torr to about $10^{-3}$ torr, and a deposition speed of about 0.01 Å/sec to about 100 Å/sec by taking into account a material to be included in a layer to be formed and the structure of a layer to be formed.

Definition of Terms

The term "$C_3$-$C_{60}$ carbocyclic group" as used herein refers to a cyclic group that consists of carbon only and has three to sixty carbon atoms, and the term "$C_1$-$C_{60}$ heterocyclic group" as used herein refers to a cyclic group that has one to sixty carbon atoms and further includes, in addition to carbon, a heteroatom. The $C_3$-$C_{60}$ carbocyclic group and the $C_1$-$C_{60}$ heterocyclic group may each be a monocyclic group that consists of one ring or a polycyclic group in which two or more rings are condensed with each other. In an embodiment, the number of ring-forming atoms of the $C_1$-$C_{60}$ heterocyclic group may be from 3 to 61.

The term "cyclic group" as used herein includes the $C_3$-$C_{60}$ carbocyclic group and the $C_1$-$C_{60}$ heterocyclic group.

The term "π electron-rich $C_3$-$C_{60}$ cyclic group" as used herein refers to a cyclic group that has three to sixty carbon atoms and does not include *—N=*' as a ring-forming moiety, and the term "π-electron-deficient nitrogen-containing $C_1$-$C_{60}$ cyclic group" as used herein refers to a heterocyclic group that has one to sixty carbon atoms and includes *—N=*' as a ring-forming moiety.

For example, the $C_3$-$C_{30}$ carbocyclic group may be i) a group T1 or ii) a condensed cyclic group in which two or more groups T1 are condensed with each other (for example, a cyclopentadiene group, an adamantane group, a norbornane group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with each other, or iii) a condensed cyclic group in which at least one groups T2 and at least one group T1 are condensed with each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothieno dibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the π electron-rich $C_3$-$C_{60}$ cyclic group may be i) a group T1, ii) a condensed cyclic group in which two or more groups T1 are condensed with each other, iii) a group T3, iv) a condensed cyclic group in which two or more groups T3 are condensed with each other, or v) a condensed cyclic group in which at least one group T3 and at least one group T1 are condensed with each other (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, or a benzothienodibenzothiophene group), the π-electron-deficient nitrogen-containing $C_1$-$C_{60}$ cyclic group may be i) a group T4, ii) a condensed cyclic group in which two or more groups T4 are condensed with each other, iii) a condensed cyclic group in which at least one group T4 and at least one group T1 are condensed with each other, iv) a condensed cyclic group in which at least one group T4 and at least one group T3 are condensed with each other, or v) a condensed cyclic group in which at least one group T4, at least one group T1, and at least one group T3 are condensed with each other (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or, a bicyclo[2.2.1]heptane group), a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the π-electron-deficient nitrogen-containing $C_1$-$C_{60}$ cyclic group" as used herein refer to a group that is condensed with a cyclic group, a monovalent group, a polyvalent group (for example, a divalent group, a trivalent group, a tetravalent group, or the like), according to a structure of a formula described with corresponding terms. In embodiments, "a benzene group" may be a benzo group, a phenyl group, a phenylene group, or the like, which may be easily understand by one of ordinary skill in the art according to a structure of a formula including the "benzene group."

In an embodiment, examples of the monovalent $C_3$-$C_{60}$ carbocyclic group and the monovalent $C_1$-$C_{60}$ heterocyclic group may include a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the monovalent $C_1$-$C_{30}$ heterocyclic group may include a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a substituted or unsubstituted divalent non-aromatic condensed heteropolycyclic group.

The term "$C_1$-$C_{60}$ alkyl group" as used herein refers to a linear or branched aliphatic hydrocarbon monovalent group having 1 to 60 carbon atoms, and examples thereof include a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group" as used herein refers to a divalent group having the same structure as the $C_1$-$C_{60}$ alkyl group.

The term "$C_2$-$C_{60}$ alkenyl group" as used herein refers to a monovalent hydrocarbon group having at least one carbon-carbon double bond in the middle or at the terminus of a $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a monovalent hydrocarbon group having at least one carbon-carbon triple bond in the middle or at the terminus of a $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group" as used herein refers to a monovalent saturated hydrocarbon cyclic group having 3 to 10 carbon atoms, and examples thereof include a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent cyclic group that further includes, in addition to a carbon atom, at least one heteroatom as a ring-forming atom and has 1 to 10 carbon atoms, and examples thereof include a 1,2,3,4-oxatriazolidinyl group, a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent cyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent cyclic group that has, in addition to a carbon atom, at least one heteroatom as a ring-forming atom, 1 to 10 carbon atoms, and at least one carbon-carbon double bond in the cyclic structure thereof. Examples of the $C_1$-$C_{10}$ heterocycloalkenyl group include a 4,5-dihydro-1,2,3,4-oxatriazolyl group, a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphtacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be fused to each other.

The term "$C_1$-$C_{60}$ heteroaryl group" as used herein refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group" as used herein refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be condensed with each other.

The term "monovalent non-aromatic condensed polycyclic group" as used herein refers to a monovalent group (for example, having 8 to 60 carbon atoms) having two or more rings condensed with each other, only carbon atoms as ring-forming atoms, and non-aromaticity in its entire molecular structure. Examples of the monovalent non-aromatic condensed polycyclic group include an indenyl group, a fluorenyl group, a spiro-bifluorenyl group, a benzofluorenyl group, an indenophenanthrenyl group, and an indenoanthracenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 1 to 60 carbon atoms) having two or more rings condensed to each other, at least one heteroatom other than carbon atoms, as a ring-forming atom, and non-aromaticity in its entire molecular structure. Examples of the monovalent non-aromatic condensed heteropolycyclic group include a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group" as used herein refers to a divalent group having the same structure as the monovalent non-aromatic condensed heteropolycyclic group.

The term "$C_6$-$C_{60}$ aryloxy group" as used herein refers to —$OA_{102}$ (wherein $A_{102}$ is the $C_6$-$C_{60}$ aryl group), and the term "$C_6$-$C_{60}$ arylthio group" as used herein refers to —$SA_{103}$ (wherein $A_{103}$ is the $C_6$-$C_{60}$ aryl group).

The term "$R_{10a}$" as used herein refers to:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{30}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or
—Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{30}$ alkyl group; a $C_2$-$C_{30}$ alkenyl group; a $C_2$-$C_{30}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{30}$ alkyl group, a $C_1$-$C_{60}$ alkoxy group, a phenyl group, a biphenyl group, or any combination thereof.

The term "heteroatom" as used herein refers to any atom other than a carbon atom. Examples of the heteroatom include O, S, N, P, Si, B, Ge, Se, and any combination thereof.

The term "Ph" as used herein refers to a phenyl group, the term "Me" as used herein refers to a methyl group, the term "Et" as used herein refers to an ethyl group, the term "ter-Bu" or "Bu$^t$" as used herein refers to a tert-butyl group, and the term "OMe" as used herein refers to a methoxy group.

The term "biphenyl group" as used herein refers to "a phenyl group substituted with a phenyl group." In other words, the "biphenyl group" is a substituted phenyl group having a $C_6$-$C_{60}$ aryl group as a substituent.

The term "terphenyl group" as used herein refers to "a phenyl group substituted with a biphenyl group". In other words, the "terphenyl group" is a substituted phenyl group having, as a substituent, a $C_6$-$C_{60}$ aryl group substituted with a $C_6$-$C_{60}$ aryl group.

The maximum number of carbon atoms in the substituent definition is not particularly limited. In an embodiment, a case where the maximum number of carbon atoms in a $C_1$-$C_{60}$ alkyl group is 60 is merely an example, and definition of the alkyl group applies equally to a $C_1$-$C_{20}$ alkyl group. The same is true for other cases.

* and *' as used herein, unless defined otherwise, each refer to a binding site to a neighboring atom in a corresponding formula.

Hereinafter, a light-emitting device according to an embodiment of the disclosure will be described in detail with reference to Examples.

EXAMPLES

Manufacture of Light-Emitting Device

Comparative Example 1

An anode (ITO) was patterned on a substrate according to a first, second, and third subpixels, and a pixel insulating film was formed at an edge portion.

HAT-CN as a known material was vacuum-deposited on exposed anodes to form a hole injection layer having a thickness of 100 Å, and TAPC as a hole transport compound was vacuum-deposited thereon to form a hole transport layer having a thickness of 300 Å.

N,N'-bis(3-methylphenyl)-N,N'-diphenyl-[1,1-biphenyl]-4,4'-diamine (TPD) was formed on the hole transport layer of the first subpixel to form a first auxiliary layer having a thickness of 700 Å.

Alq$_3$ and Ir(phq)$_3$ were co-deposited on the first auxiliary layer at a weight ratio of 97:3 to form a red emission layer having a thickness of 400 Å.

N,N'-di(1-naphthyl)-N,N'-diphenylbenzidine (NPB) was formed on the hole transport layer of the second subpixel to form a second auxiliary layer having a thickness of 300 Å.

Alq$_3$ and Ir(3',5', 4-mppy)$_2$tmd were co-deposited on the second auxiliary layer at a weight ratio of 90:10 to form a green emission layer having a thickness of 300 Å.

DPVBi and perylene were co-deposited on the hole transport layer of the third subpixel at a weight ratio of 99:1 to form a blue emission layer having a thickness of 200 Å.

TPBi was deposited on the emission layer to form an electron transport layer, as a common layer, having a thickness of 550 Å.

LiF was deposited on the electron transport layer to form an electron injection layer having a thickness of 8 Å.

Al was deposited on the electron transport layer to form an electrode having a thickness of 1,000 Å.

Compound 1 was deposited on the electrode to form a first capping layer having a thickness of 60 nm.

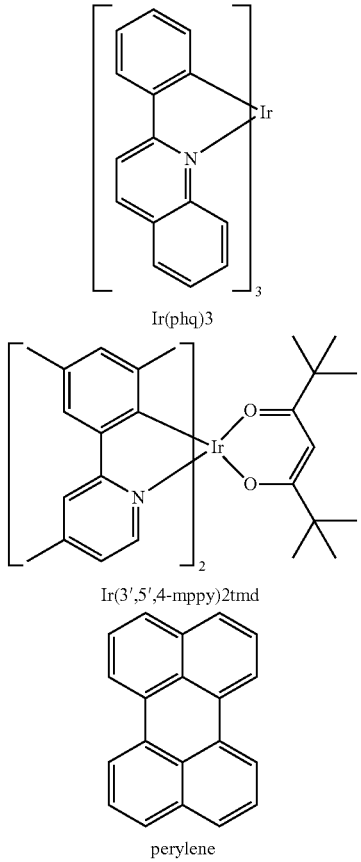

Ir(phq)3

Ir(3',5',4-mppy)2tmd perylene

Example 1

A light-emitting device was manufactured in the same manner as in Comparative Example 1, except that a first capping layer was formed to have a thickness of 80 nm, and Compound 7 was deposited on the first capping layer to additionally form a second capping layer having a thickness of 60 nm.

Example 2

A light-emitting device was manufactured in the same manner as in Comparative Example 1, except that a first capping layer was formed to have a thickness of 80 nm, and Compound 7 was deposited on the first capping layer to additionally form a second capping layer having a thickness of 80 nm.

Example 3

A light-emitting device was manufactured in the same manner as in Comparative Example 1, except that a first capping layer was formed to have a thickness of 80 nm, and Compound 7 was deposited on the first capping layer to additionally form a second capping layer having a thickness of 100 nm.

Example 4

A light-emitting device was manufactured in the same manner as in Comparative Example 1, except that a first capping layer was formed to have a thickness of 80 nm, and Compound 7 was deposited on the first capping layer to additionally form a second capping layer having a thickness of 120 nm.

With respect to the light-emitting devices manufactured according to Examples 1 to 4 and Comparative Example 1, efficiency according to R, G, and B and efficiency of White were measured and shown in Table 1.

TABLE 1

| | First capping layer (nm) [Refractive index at 550 nm] | Second capping layer (nm) [Refractive index at 550 nm] | Efficiency ratio (Cd/A@420nit) | | | |
|---|---|---|---|---|---|---|
| | | | Red | Green | Blue | White |
| Comparative Example 1 | 60 [2.01] | 0 | 100% | 100% | 100% | 100% |
| Example 1 | 80 [2.01] | 60 [1.40] | 108% | 114% | 100% | 107% |
| Example 2 | 80 [2.01] | 80 [1.40] | 116% | 122% | 104% | 110% |
| Example 3 | 80 [2.01] | 100 [1.40] | 123% | 125% | 112% | 120% |
| Example 4 | 80 [2.01] | 120 [1.40] | 118% | 123% | 105% | 113% |

In a light-emitting device according to an embodiment, without an increase in efficiency resulting from improvement of compounds used in the interlayer between the electrodes, the capping layers after the cathode were appropriately adjusted such that the efficiency was increased only by optical enhancement. Referring to Table 1, it was confirmed that, compared to the light-emitting device of the Comparative Example, the light-emitting devices of the disclosure show an excellent result.

A refractive index was adjusted to thereby increase light extraction efficiency, and thus the light-emitting device according to an embodiment has increased light emission efficiency.

It should be understood that embodiments described herein should be considered in a descriptive sense only and not for purposes of limitation. Descriptions of features or aspects within each embodiment should typically be considered as available for other similar features or aspects in other embodiments. While embodiments have been described with reference to the figures, it will be understood by those of ordinary skill in the art that various changes in form and details may be made therein without departing from the spirit and scope as defined by the following claims.

What is claimed is:

1. A light-emitting device comprising:
   a first electrode;
   a second electrode facing the first electrode;
   an interlayer disposed between the first electrode and the second electrode, the interlayer including an emission layer;
   a first capping layer; and
   a second capping layer, wherein
   a refractive index of the first capping layer is greater than a refractive index of the second capping layer,
   the first capping layer and the second capping layer are each an organic layer, and
   the first capping layer comprises a compound represented by Formula 1:

[Formula I]

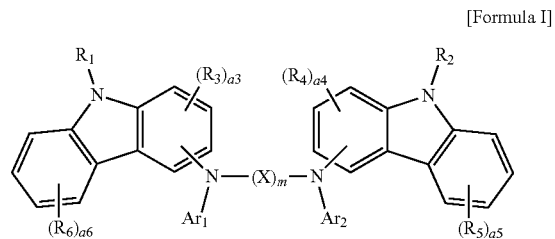

wherein in Formula 1, $R_1$ to $R_6$ are each independently selected from hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —B($Q_1$)($Q_2$), —C(=O)($Q_1$), —Si($Q_1$)($Q_2$)($Q_3$), and —P(=O)($Q_1$)($Q_2$), $Ar_1$ and $Ar_2$ are each independently selected from hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with a t least one $R_{10a}$, a $C_{10}$-$C_{60}$ alkoxy group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —B($Q_1$)($Q_2$), —C(=O)($Q_1$), —Si($Q_1$)($Q_2$)($Q_3$), and —P(=O)($Q_1$)($Q_2$), X is selected from a $C_3$-$C_{60}$ carbocyclic group unsubstituted or substituted with at least one $R_{10a}$ and a $C_1$-$C_{60}$ heterocyclic group unsubstituted or substituted with at least one $R_{10a}$, m is an integer from 1 to 3, a3 and a4 are each independently an integer from 1 to 3, a5 and a6 are each independently an integer from 1 to 4, when a3 is 2 or more, a plurality of $R_3$(s) are identical to or different from each other, when a4 is 2 or more, a plurality of $R_4$(s) are identical to or different from each other, when a5 is 2 or more, a plurality of $R_5$(s) are identical to or different from each other, when a6 is 2 or more, a plurality of $R_6$(s) are identical to or different from each other, and $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

2. The light-emitting device of claim 1, wherein the first capping layer contacts the second capping layer.

3. The light-emitting device of claim 1, wherein the first capping layer contacts the second electrode.

4. The light-emitting device of claim 1, wherein the first capping layer is disposed outside the second electrode.

5. The light-emitting device of claim 1, wherein
the first electrode is an anode,
the second electrode is a cathode,
the interlayer further comprises a hole transport region disposed between the first electrode and the emission layer, and
the hole transport region comprises a hole injection layer, a hole transport layer, an electron blocking layer, or a combination thereof.

6. The light-emitting device of claim 1, wherein
the first electrode is an anode,
the second electrode is a cathode,
the interlayer further comprises an electron transport region disposed between the emission layer and the second electrode, and
the electron transport region comprises a hole blocking layer, an electron transport layer, an electron injection layer, or a combination thereof.

7. The light-emitting device of claim 1, wherein a refractive index of the first capping layer is in a range of about 1.7 to about 2.2, at a wavelength of about 550 nm.

8. The light-emitting device of claim 1, wherein a refractive index of the second capping layer is in a range of about 1.2 to about 1.7, at a wavelength of about 550 nm.

9. The light-emitting device of claim 1, wherein a thickness of the second capping layer is greater than a thickness of the first capping layer.

10. The light-emitting device of claim 1, wherein a thickness of the first capping layer is in a range of about 60 nm to about 100 nm.

11. The light-emitting device of claim 1, wherein a thickness of the second capping layer is in a range of about 40 nm to about 120 nm.

12. The light-emitting device of claim 1, wherein $R_3$ to $R_6$ are each independently hydrogen or deuterium.

13. The light-emitting device of claim 1, wherein the second capping layer comprises a compound represented by Formula 2:

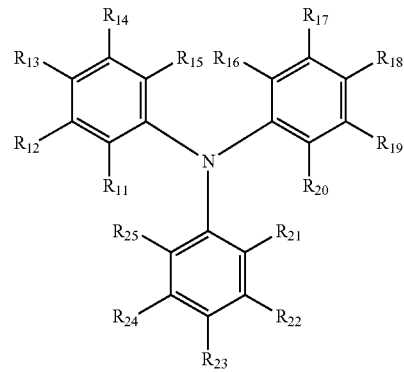

[Formula 2]

wherein in Formula 2, $R_{11}$ to $R_{25}$ are each independently selected from hydrogen, deuterium, —F, —Cl, —Br, —I, a hydroxyl group, a cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, a $C_6$-$C_{60}$ aryloxy group unsubstituted or substituted with at least one $R_{10a}$, a $C_6$-$C_{60}$ arylthio group unsubstituted or substituted with at least one $R_{10a}$, —B($Q_1$)($Q_2$), —C(=O)($Q_1$), —Si($Q_1$)($Q_2$)($Q_3$), and —P(=O)($Q_1$)($Q_2$), two neighboring substituents of $R_{11}$ to $R_{15}$ are connected to form a ring group, two neighboring substituents of $R_{16}$ to $R_{20}$ are connected to form a ring group, or two neighboring substituents of $R_{21}$ to $R_{25}$ are connected to form a ring group, and $R_{10a}$ is the same as defined in Formula 1.

14. The light-emitting device of claim 13, wherein the ring group is represented by Formula 2-1:

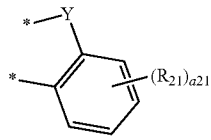

[Formula 2-1]

wherein in Formula 2-1,

Y is —N($R_{31}$) or —C($R_{32}$)($R_{33}$), $R_{31}$ to $R_{33}$ are each independently selected from hydrogen, deuterium, —F, —Cl, —Br, —I, a hydroxyl group, a nitro group, a $C_1$-$C_{60}$ alkyl group unsubstituted or substituted with at least one $R_{10a}$, a $C_3$-$C_{60}$ carbocyclic group unsubstituted or substituted with at least one $R_{10a}$, and a $C_1$-$C_{60}$ heterocyclic group unsubstituted or substituted with at least one $R_{10a}$, $R_{32}$ and $R_{33}$ are optionally connected to form a ring, a21 is an integer from 1 to 4,

* indicates a binding site to a neighboring atom, and $R_{10a}$ is:

deuterium (-D), —F, —Cl, —Br, —I, a hydroxyl group, a cyano group, or a nitro group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or a combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or a combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$), wherein $Q_1$ to $Q_3$, $Q_{11}$ to $Q_{13}$, $Q_{21}$ to $Q_{23}$, and $Q_{31}$ to $Q_{33}$ are each independently: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or a combination thereof.

15. The light-emitting device of claim 1, wherein the first capping layer further comprises one of the following compounds:

1

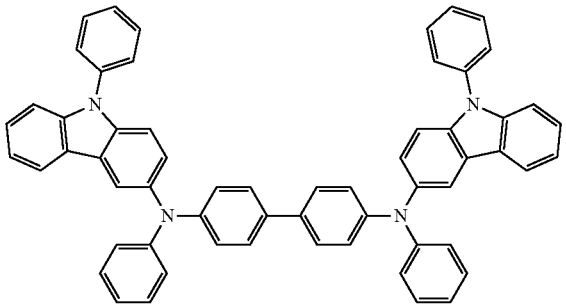

2

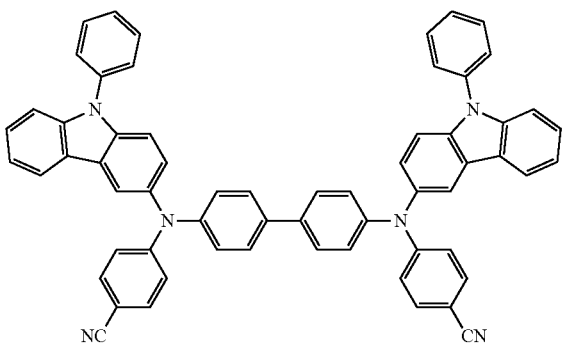

3

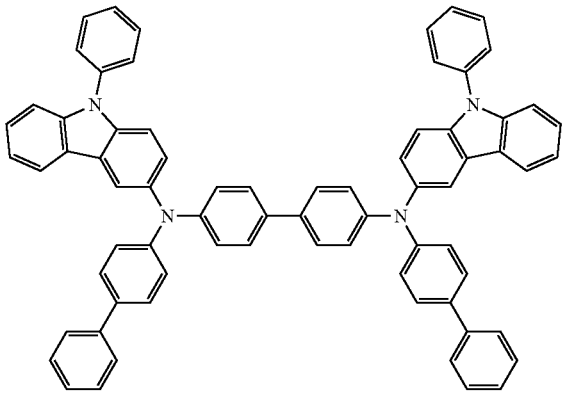

4

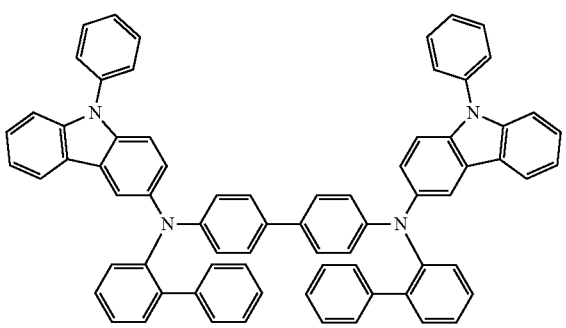

5
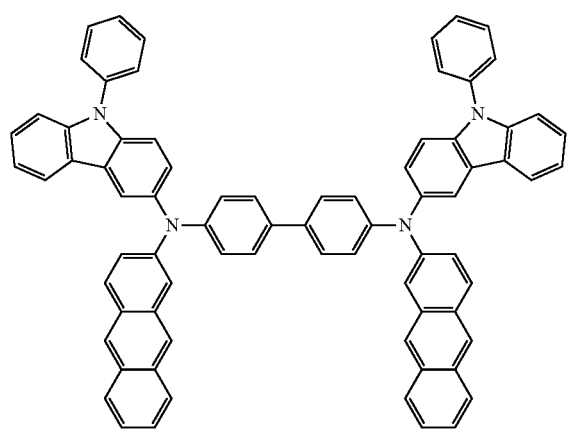
16. The light-emitting device of claim 1, wherein the second capping layer comprises one of the following compounds:
6
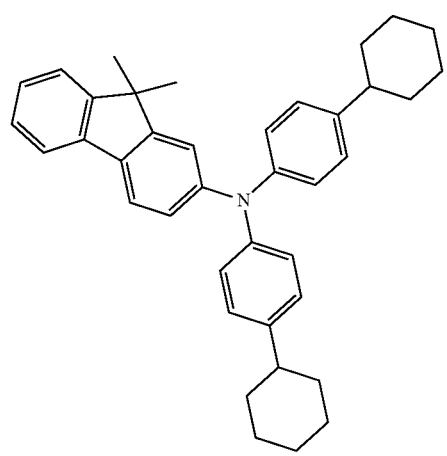
7
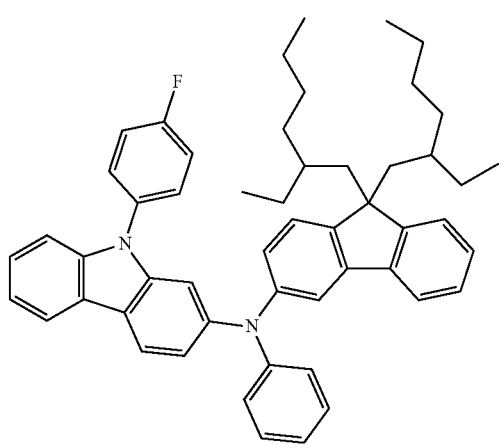
8
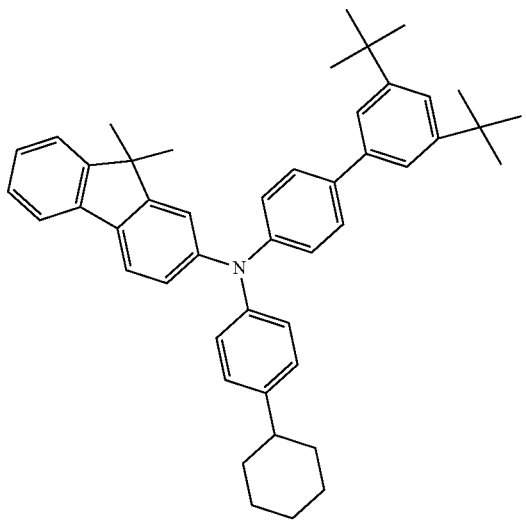
9
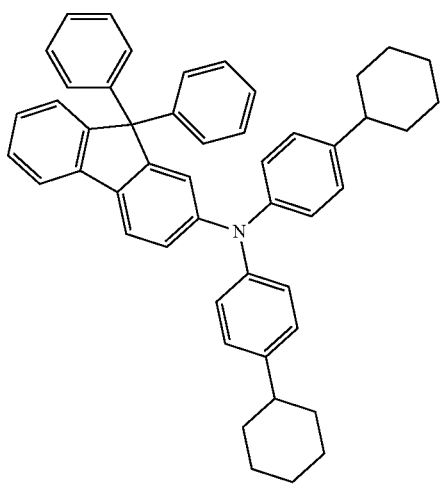
10
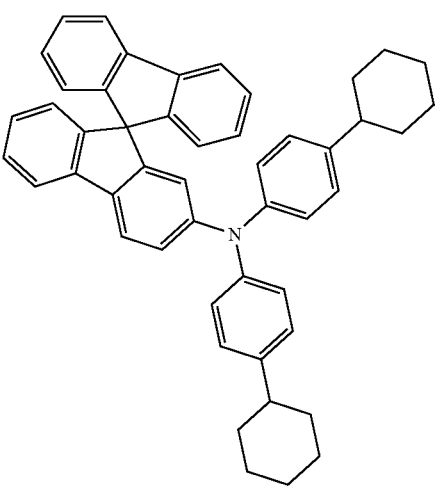

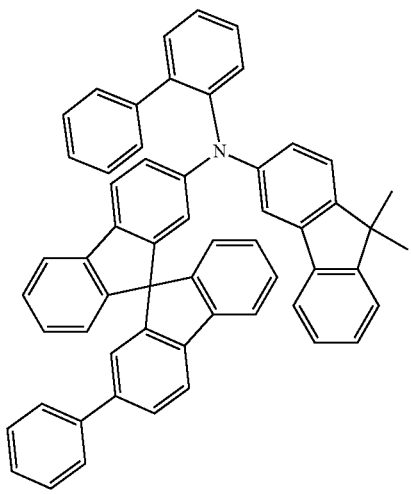
11
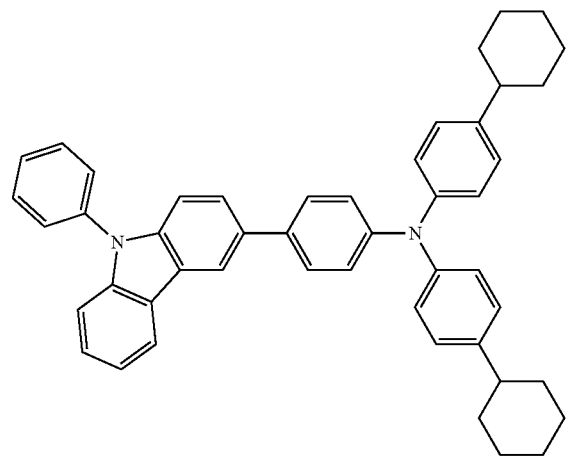
14
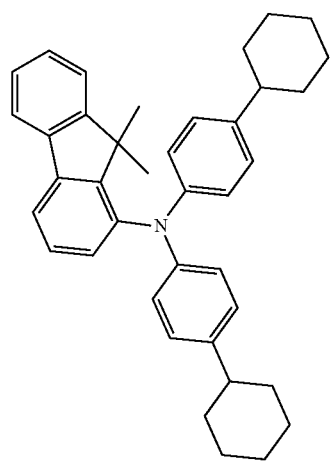
12
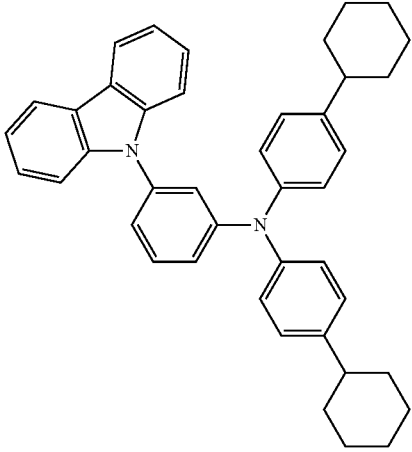
15
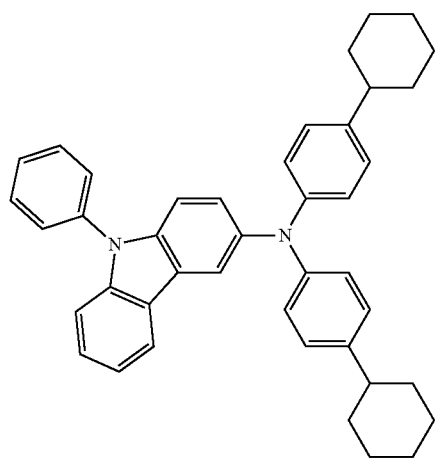
13
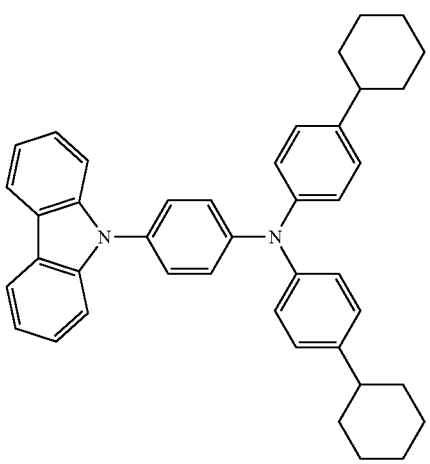
16

17
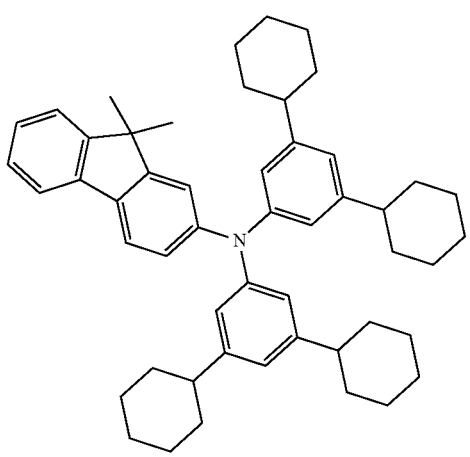
18
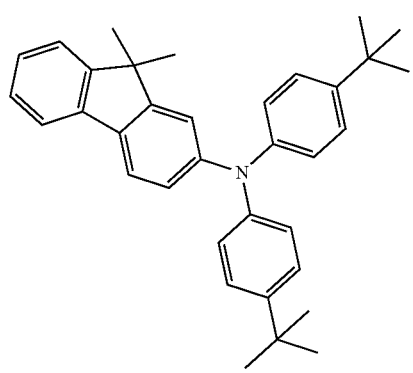
19
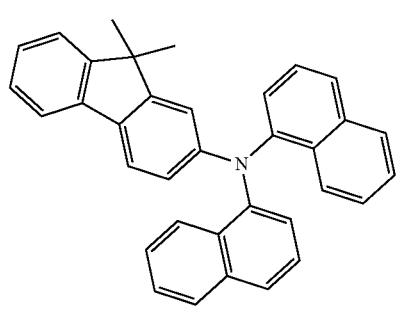
20
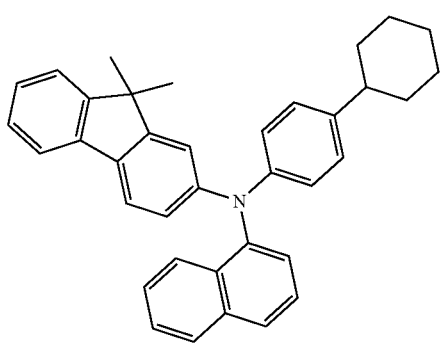
21
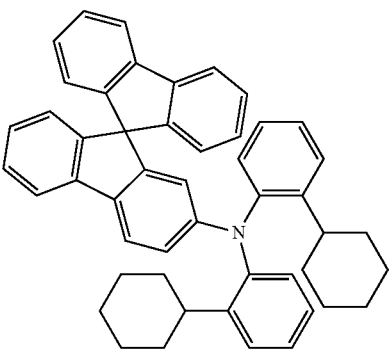
22
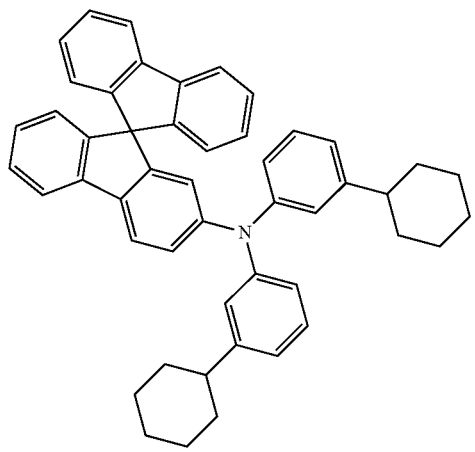
23
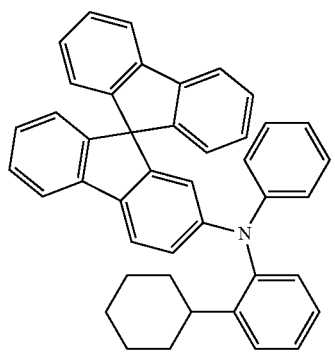
24
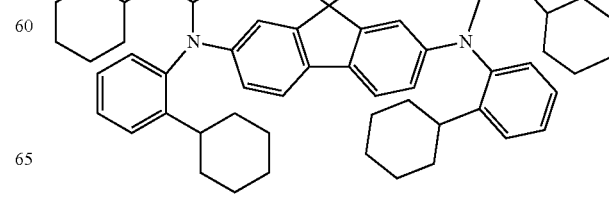

25
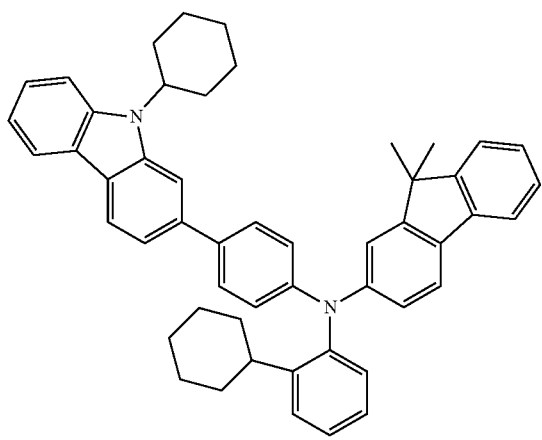
26
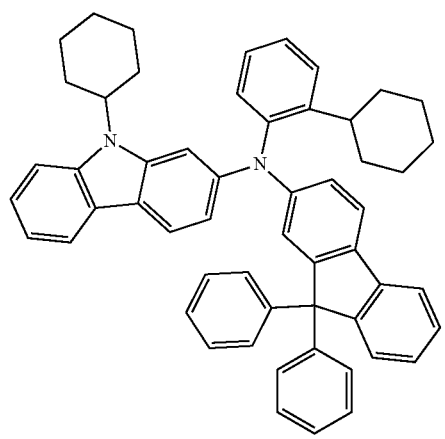
27
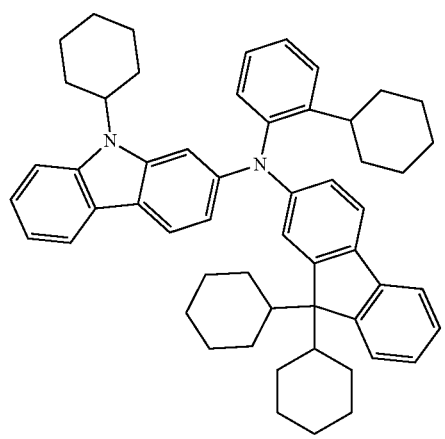
28
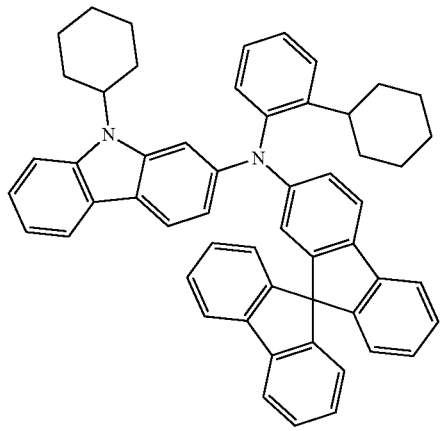
29
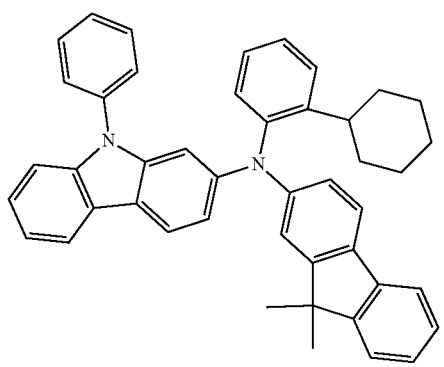
30
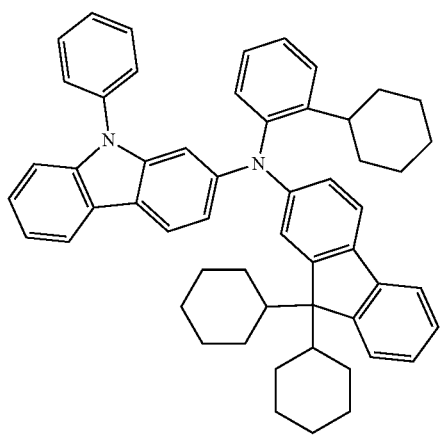

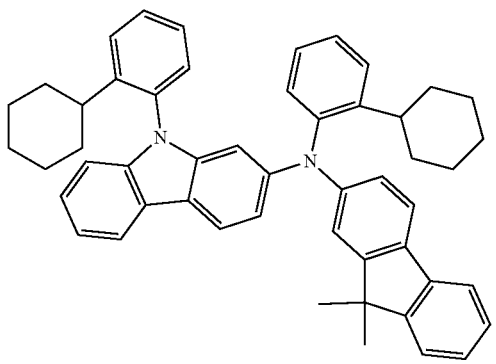

31

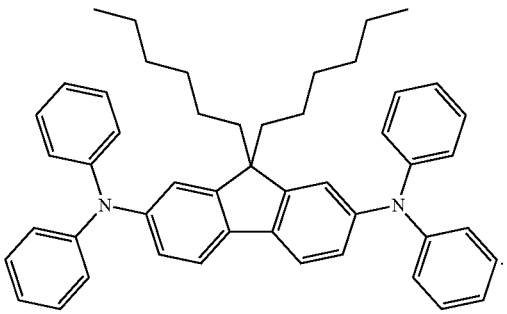

33

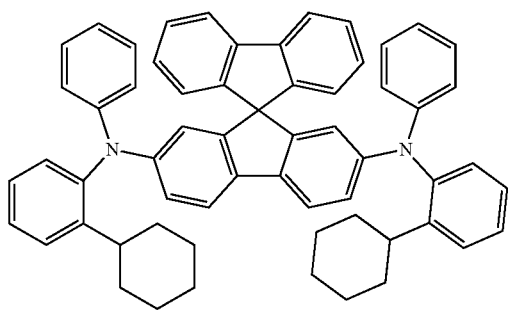

32

17. An electronic apparatus comprising the light-emitting device of claim 1.

18. The electronic apparatus of claim 17, further comprising a thin-film transistor, wherein
the thin-film transistor comprises a source electrode and a drain electrode, and
the first electrode of the light-emitting device is electrically connected to at least one of the source electrode and the drain electrode of the thin-film transistor.

19. The electronic apparatus of claim 17, further comprising a color filter, a color conversion layer, a touch screen layer, a polarizing layer, or a combination thereof.

* * * * *